(12) United States Patent
Yamashita et al.

(10) Patent No.: US 8,524,440 B2
(45) Date of Patent: *Sep. 3, 2013

(54) PHOTORESIST COMPOSITION

(75) Inventors: Yuko Yamashita, Toyonaka (JP); Nobuo Ando, Toyonaka (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 178 days.

This patent is subject to a terminal disclaimer.

(21) Appl. No.: 12/983,729

(22) Filed: Jan. 3, 2011

(65) Prior Publication Data

US 2011/0165513 A1 Jul. 7, 2011

(30) Foreign Application Priority Data

Jan. 5, 2010 (JP) .................................. 2010-000371

(51) Int. Cl.
*G03F 7/26* (2006.01)

(52) U.S. Cl.
USPC ........ 430/270.1; 430/326; 430/907; 430/921; 430/925

(58) Field of Classification Search
USPC .............. 430/270.1, 326, 327, 330, 907, 914, 430/921, 925
See application file for complete search history.

(56) References Cited

U.S. PATENT DOCUMENTS

| 5,525,453 | A | 6/1996 | Przybilla et al. |
| 5,914,216 | A | 6/1999 | Amou et al. |
| 6,319,649 | B1 | 11/2001 | Kato et al. |
| 7,569,326 | B2 * | 8/2009 | Ohsawa et al. ............. 430/270.1 |
| 8,110,336 | B2 * | 2/2012 | Takemoto et al. ......... 430/270.1 |
| 2009/0269696 | A1 | 10/2009 | Ohsawa et al. |
| 2010/0075257 | A1 | 3/2010 | Takemoto et al. |
| 2011/0059400 | A1 | 3/2011 | Kamabuchi |

FOREIGN PATENT DOCUMENTS

| JP | 2006-058739 A | 3/2006 |
| JP | 2010-160446 A | 7/2010 |
| JP | 2010-237313 A | 10/2010 |
| JP | 2010-271686 A | 12/2010 |

OTHER PUBLICATIONS

Machine translation of JP 2010-160446, published on Jul. 22, 2010.*
Brainard, R.L. et al., Shot Noise, LER and Quantum Efficiency of EUV Photoresists, Proceedings of SPIE, vol. 5374 (2004), 74-85.

* cited by examiner

*Primary Examiner* — Anca Eoff
(74) *Attorney, Agent, or Firm* — Hogan Lovells US LLP

(57) ABSTRACT

The present invention provides a photoresist composition comprising
a resin which comprises a structural unit represented by the formula (I):

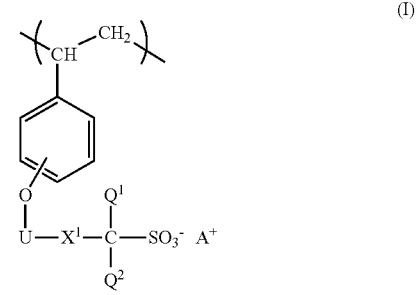

wherein $Q^1$ and $Q^2$ independently represent a fluorine atom etc., U represents a C1-C20 divalent hydrocarbon group etc., $X^1$ represents —O—CO— etc., and $A^+$ represents an organic counter ion, and a compound represented by the formula (D'):

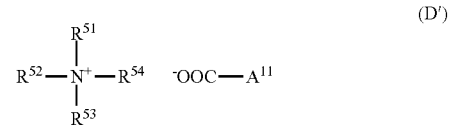

wherein $R^{51}$, $R^{52}$, $R^{53}$ and $R^{54}$ independently represent a C1-C20 alkyl group etc., and $A^{11}$ represents a C1-C36 saturated cyclic hydrocarbon group which may have one or more substituents and which may contain one or more heteroatoms.

10 Claims, No Drawings

PHOTORESIST COMPOSITION

This nonprovisional application claims priority under 35 U.S.C. §119(a) on Patent Application No. 2010-000371 filed in JAPAN on Jan. 5, 2010, the entire contents of which are hereby incorporated by reference.

FIELD OF THE INVENTION

The present invention relates to a photoresist composition.

BACKGROUND OF THE INVENTION

A photoresist composition used for semiconductor microfabrication employing a lithography process contains a resin having a structural unit derived from a compound having an acid-labile group, being insoluble or poorly soluble in an alkali aqueous solution but becoming soluble in an alkali aqueous solution by the action of an acid, an acid generator comprising a compound generating an acid by irradiation and a basic compound.

U.S. Pat. No. 5,914,219 discloses a photoresist composition comprising a resin having a structural unit derived from a compound having an acid-labile group, being insoluble or poorly soluble in an alkali aqueous solution but becoming soluble in an alkali aqueous solution by the action of an acid, an acid generator comprising a compound generating an acid by irradiation and tetrabutylammonium hydroxide as a basic compound.

SUMMARY OF THE INVENTION

The present invention is to provide a photoresist composition.

The present invention relates to the followings:

<1> A photoresist composition comprising a resin which comprises a structural unit represented by the formula (I):

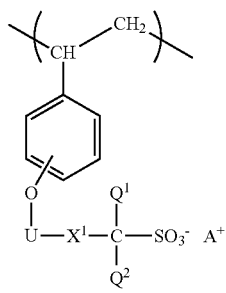

(I)

wherein $Q^1$ and $Q^2$ independently represent a fluorine atom or a C1-C6 perfluoroalkyl group, U represents a C1-C20 divalent hydrocarbon group in which one or more —CH$_2$— may be replaced by —O—, —NH—, —S—, —NR$^c$—, —CO— or —CO—O—, R$^c$ represents a C1-C6 alkyl group, X$^1$ represents —O—CO—, —CO—O—, —CO—O—CH$_2$—, —CH$_2$—O—CO—, —O—CH$_2$—, —CH$_2$—O—, —NR$^d$—CO— or —CO—NR$^d$—, R$^d$ represents a hydrogen atom or a C1-C6 alkyl group, and A$^+$ represents an organic counter ion, and a compound represented by the formula (D'):

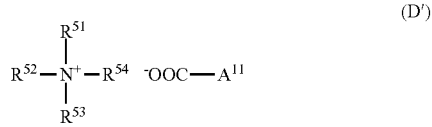

(D')

wherein $R^{51}$, $R^{52}$, $R^{53}$ and $R^{54}$ independently represent a C1-C20 alkyl group which may have one or more substituents, a C3-C30 saturated cyclic hydrocarbon group which may have one or more substituents or a C2-C20 alkenyl group which may have one or more substituents and $A^{11}$ represents a C1-C36 saturated cyclic hydrocarbon group which may have one or more substituents and which may contain one or more heteroatoms;

<2> The photoresist composition according to <1>, wherein the compound represented by the formula (D') is a compound represented by the formula (D):

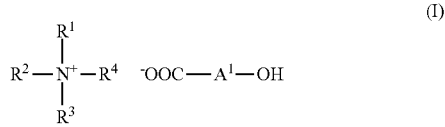

(I)

wherein $R^1$, $R^2$, $R^3$ and $R^4$ independently represent a C1-C8 alkyl group, and $A^1$ represents a C3-C36 divalent saturated cyclic hydrocarbon group which can contain one or more heteroatoms and which have one or more substituents or a C6-C20 divalent aromatic hydrocarbon group which can contain one or more heteroatoms and which have one or more substituents;

<3> The photoresist composition according to <2>, wherein $R^1$, $R^2$, $R^3$ and $R^4$ independently represent a C1-C6 alkyl group;

<4> The photoresist composition according to <1>, <2> or <3>, wherein $Q^1$ and $Q^2$ are fluorine atoms;

<5> The photoresist composition according to <1>, <2>, <3> or <4>, wherein $A^+$ is a cation represented by the formula (IIIa):

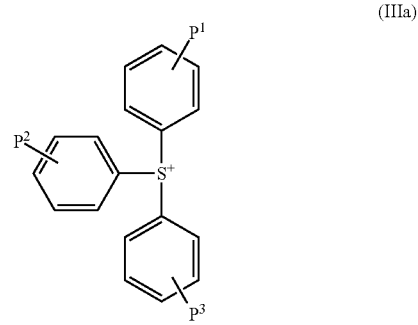

(IIIa)

wherein $P^1$, $P^2$ and $P^3$ independently represent a hydrogen atom, a halogen atom, a hydroxyl group, a cyano group a C1-C12 hydrocarbon group or a C1-C12 alkoxy group;

<6> The photoresist composition according to <1>, <2>, <3>, <4> or <5>, wherein the resin further comprises a structural unit represented by the formula (II):

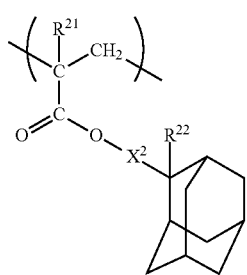

(II)

wherein $R^{21}$ represents a hydrogen atom or a methyl group, $R^{22}$ represents a C1-C6 hydrocarbon group, $X^2$ represents a single bond or *—$(CH_2)_k$—CO—O— in which * represents a binding position to —O—, and k represents an integer of 1 to 6;

<7> The photoresist composition according to <1>, <2>, <3>, <4>, <5> or <6>, wherein the resin further comprises a structural unit represented by the formula (VI):

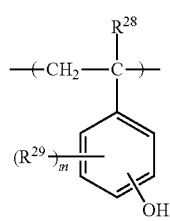

(VI)

wherein $R^{28}$ represents a hydrogen atom, a halogen atom, a C1-C6 alkyl group or a C1-C6 halogenated alkyl group, $R^{29}$ is independently in each occurrence a halogen atom, a hydroxyl group, a cyano group, a C1-C12 alkyl group, a C1-C12 hydroxy-containing alkyl group, a C1-C12 alkoxy group, a C6-C12 aryl group, a C7-C13 aralkyl group, a glycidyloxy group, a C2-C4 acyl group, a C2-C4 acyloxy group, an acryloyl group or a methacryloyl group, m represents an integer of 0 to 4;

<8> The photoresist composition according to <1>, <2>, <3>, <4>, <5>, <6> or <7>, wherein the resin further comprises a structural unit represented by the formula (VII):

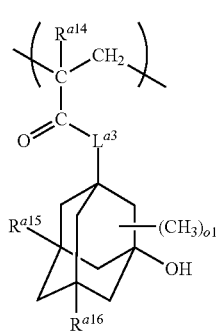

(VII)

wherein $R^{a14}$ represents a hydrogen atom or a methyl group, $R^{a15}$ and $R^{a16}$ independently represent a hydrogen atom, a methyl group or a hydroxyl group, $L^{a3}$ represents *—O— or *—O—$(CH_2)_y$—CO—O— in which * represents a binding position to —CO—, and y represents an integer of 1 to 6, and o1 represents an integer of 0 to 10;

<9> The photoresist composition according to <1>, <2>, <3>, <4>, <5>, <6>, <7> or <8>, wherein the resin further comprises a structural unit represented by the formula (VIII):

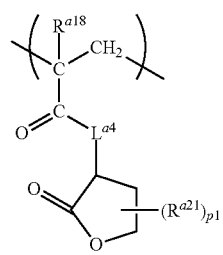

(VIII)

wherein $R^{a18}$ represents a hydrogen atom or a methyl group, $R^{a21}$ is independently in each occurrence a C1-C4 aliphatic hydrocarbon group, $L^{a4}$ represents *—O— or *—O—$(CH_2)_z$—CO—O— in which * represents a binding position to —CO—, and z represents an integer of 1 to 6, and p1 represents an integer of 0 to 5;

<10> The photoresist composition according to <1>, <2>, <3>, <4>, <5>, <6>, <7>, <8> or <9>, which further comprises a solvent;

<11> A process for producing a photoresist pattern comprising the following steps (1) to (5):
(1) a step of applying the photoresist composition according to any one of <1> to <10> on a substrate,
(2) a step of forming a photoresist film by conducting drying,
(3) a step of exposing the photoresist film to radiation,
(4) a step of baking the exposed photoresist film, and
(5) a step of developing the baked photoresist film with an alkaline developer, thereby forming a photoresist pattern;

<12> Use of the photoresist composition according to any one of <1> to <10> for producing a photoresist pattern using an electron beam lithography system or an extreme ultraviolet lithography system.

DESCRIPTION OF PREFERRED EMBODIMENTS

The photoresist composition of the present invention comprises a resin which comprises a structural unit represented by the formula (I):

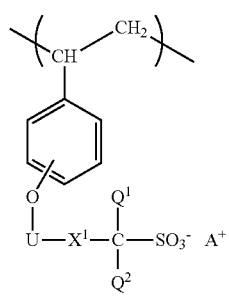

(I)

wherein $Q^1$ and $Q^2$ independently represent a fluorine atom or a C1-C6 perfluoroalkyl group, U represents a C1-C20 divalent hydrocarbon group in which one or more —$CH_2$— may be replaced by —O—, —NH—, —S—, —$NR^c$—, —CO— or —CO—O—, $R^c$ represents a C1-C6 alkyl group, $X^1$ represents —O—CO—, —CO—O—, —CO—O—CH$_2$—, —CH$_2$—O—CO—, —O—CH$_2$—, —CH$_2$—O—, —NR$^d$—CO— or —CO—NR$^d$—, R$^d$ represents a hydrogen atom or a C1-C6 alkyl group, and A$^+$ represents an organic counter ion (hereinafter, simply referred to as Resin (I)), and a compound represented by the formula (D'):

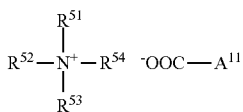

wherein R$^{51}$, R$^{52}$, R$^{53}$ and R$^{54}$ independently represent a C1-C20 alkyl group which may have one or more substituents, a C3-C30 saturated cyclic hydrocarbon group which may have one or more substituents or a C2-C20 alkenyl group which may have one or more substituents and A$^{11}$ represents a C1-C36 saturated cyclic hydrocarbon group which may have one or more substituents and which may contain one or more heteroatoms (hereinafter, simply referred to as Compound (D')).

First, Resin (I) will be illustrated.

In the formula (I), A$^+$ represents an organic counter ion, and examples of the organic counter ion include a cation represented by the formula (IIIa):

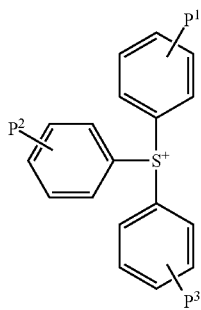

wherein P$^1$, P$^2$ and P$^3$ independently represent a hydrogen atom, a halogen atom, a hydroxyl group, a cyano group a C1-C12 hydrocarbon group or a C1-C12 alkoxy group (hereinafter, simply referred to as cation (IIIa)), a cation represented by the formula (IIIb):

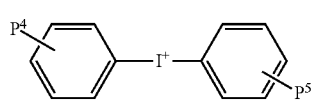

wherein P$^4$ and P$^5$ independently represent a hydrogen atom, a halogen atom, a hydroxyl group, a cyano group, a C1-C12 hydrocarbon group or a C1-C12 alkoxy group (hereinafter, simply referred to as Cation (IIIb)), and a cation represented by the formula (IIIc):

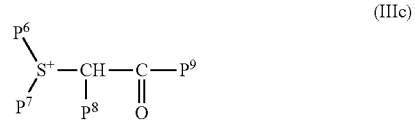

wherein P$^6$ and P$^7$ independently represent a C1-C12 hydrocarbon group or a C3-C12 cycloalkyl group, or P$^6$ and P$^7$ are bonded to form a C3-C12 divalent acyclic hydrocarbon group which forms a ring together with S$^+$, P$^8$ represents a hydrogen atom, P$^9$ represents a C1-C12 hydrocarbon group, a C3-C12 cycloalkyl group or a C6-C10 aromatic group which may have one or more substituents, or P$^8$ and P$^9$ are bonded to form a C3-C12 divalent acyclic hydrocarbon group which forms a 2-oxocycloalkyl group together with the adjacent —CHCO—, and one or more —CH$_2$— in the C3-C12 divalent acyclic hydrocarbon group may be replaced by —CO—, —O— or —S— (hereinafter, simply referred to as Cation (IIIc)). Among them, preferred is Cation (IIIa).

Examples of the halogen atom in Cation (IIIa) and Cation (IIIb) include a fluorine atom, a chlorine atom, a bromine atom and an iodine atom.

Examples of the C1-C12 hydrocarbon group in Cation (IIIa), Cation (IIIb) and Cation (IIIc) include a C1-C12 alkyl group such as a methyl group, an ethyl group, an n-propyl group, an isopropyl group, an n-butyl group, an isobutyl group, a sec-butyl group, a tert-butyl group, an n-pentyl group, an n-hexyl group, an n-octyl group, a 2-ethylhexyl group, a nonyl group, a decyl group, an undecyl group and a dodecyl group.

Examples of the C1-C12 alkoxy group in Cation (IIIa) and Cation (IIIb) include a methoxy group, an ethoxy group, an n-propoxy group, an isopropoxy group, an n-butoxy group, an isobutoxy group, a sec-butoxy group, a tert-butoxy group, an n-pentyloxy group, an n-hexyloxy group, an n-octyloxy group, a 2-ethylhexyloxy group, a decyloxy group, an undecyloxy group and a dodecyloxy group.

Examples of the C3-C12 cycloalkyl group in Cation (IIIc) include a cyclopropyl group, a cyclobutyl group, a cyclopentyl group, a cyclohexyl group, a cycloheptyl group, a cyclooctyl group, a cyclodecyl group, a cycloundecyl group and a cyclododecyl group.

Examples of the C3-C12 divalent acyclic hydrocarbon group formed by bonding P$^6$ and P$^7$ include a trimethylene group, a tetramethylene group and a pentamethylene group. Examples of the ring group formed together with S$^+$ and the C3-C12 divalent acyclic hydrocarbon group include a tetramethylenesulfonio group, a pentamethylenesulfonio group and oxybisethylenesulfonio group.

Examples of Cation (IIIc) wherein P$^6$ and P$^7$ are bonded to form a C3-C12 divalent acyclic hydrocarbon group which forms a ring together with S$^+$ include tetrahydro-2-oxopropylthiophenium ion, tetrahydro-1-acetonyl-2H-thiopyranium ion, tetrahydro-1-(2-oxobutyl)-2H-thiopyranium ion, 4-acetonyl-1,4-oxathianium ion, tetrahydro-1-(2-oxo-2-phenylethyl)-2H-thiopyranium ion and tetrahydro-1-[2-oxo-2-(4-fluorophenyl)ethyl]-2H-thiopyranium ion.

Examples of the C6-C10 aromatic group in Cation (IIIc) include a phenyl group and a naphthyl group. The aromatic group may have one or more substituents, and examples of the substituents include a C1-C10 alkyl group such as a methyl group, an ethyl group, a propyl group, an isopropyl group, a butyl group, an isobutyl group, a sec-butyl group, a tert-butyl group, a pentyl group, a hexyl group and an octyl group; a C3-C6 cycloalkyl group such as a cyclopentyl group and a cyclohexyl group; a C1-C10 alkoxy group such as a methoxy group, an ethoxy group, a propoxy group, a butoxy group, a tert-butoxy group, a hexyloxy group and an octyloxy group; a hydroxyl group; and a halogen atom such as a fluorine atom, a chlorine atom, a bromine atom and an iodine atom. Examples of the C6-C10 aromatic group which may have one or more substituents include a phenyl group, a naphthyl group, a 2-tolyl group, a 4-tolyl group, a 4-ethylphenyl group, a 4-isopropylphenyl group, a 4-tert-butylphenyl group, a 4-hexylphenyl group, a 4-octylphenyl group, a 2,4-dimethylphenyl group, a 2,4,6-trimethylphenyl group, a 4-hydroxyphenyl group, a 4-methoxyphenyl group, a 4-tert-butoxyphenyl group, a 4-fluorophenyl group, a 3-fluorophenyl group, a 2-fluorophenyl group, a 4-chlorophenyl group, a 4-bromophenyl group and a 4-iodophenyl group.

Examples of the C3-C12 divalent acyclic hydrocarbon group formed by bonding $P^8$ and $P^9$ include a methylene group, an ethylene group, a trimethylene group, a tetramethylene group and a pentamethylene group and examples of the 2-oxocycloalkyl group formed together with the adjacent —CHCO— and the divalent acyclic hydrocarbon group include a 2-oxocyclopentyl group and a 2-oxocyclohexyl group. Examples of Cation (IIIc) wherein $P^8$ and $P^9$ are bonded to form a C3-C12 divalent acyclic hydrocarbon group which forms a 2-oxocycloalkyl group together with the adjacent —CHCO— and one or more —$CH_2$— in the C3-C12 divalent acyclic hydrocarbon group may be replaced by —CO—, —O— or —S— include dimethyl(2-oxocyclohexyl)sulfonium ion, methylcyclohexyl(2-oxocyclohexyl)sulfonium ion, methylcyclopentyl(2-oxocyclohexyl)sulfonium ion, diethyl(2-oxocyclohexyl)sulfonium ion, methylcyclohexyl(2-oxocyclopentyl)sulfonium ion, methyl(2-oxocyclohexyl)phenylsulfonium ion and methyl(2-oxocyclohexyl)(4-fluorophenyl)sulfonium ion.

Examples of Cation (IIIa) include the followings:

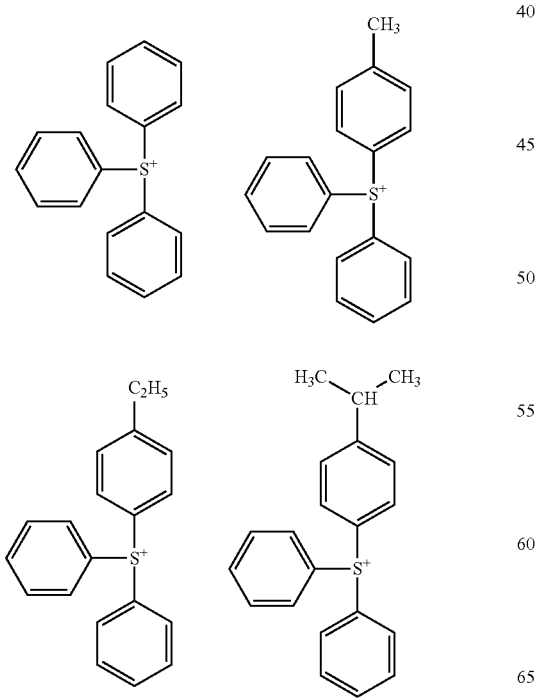

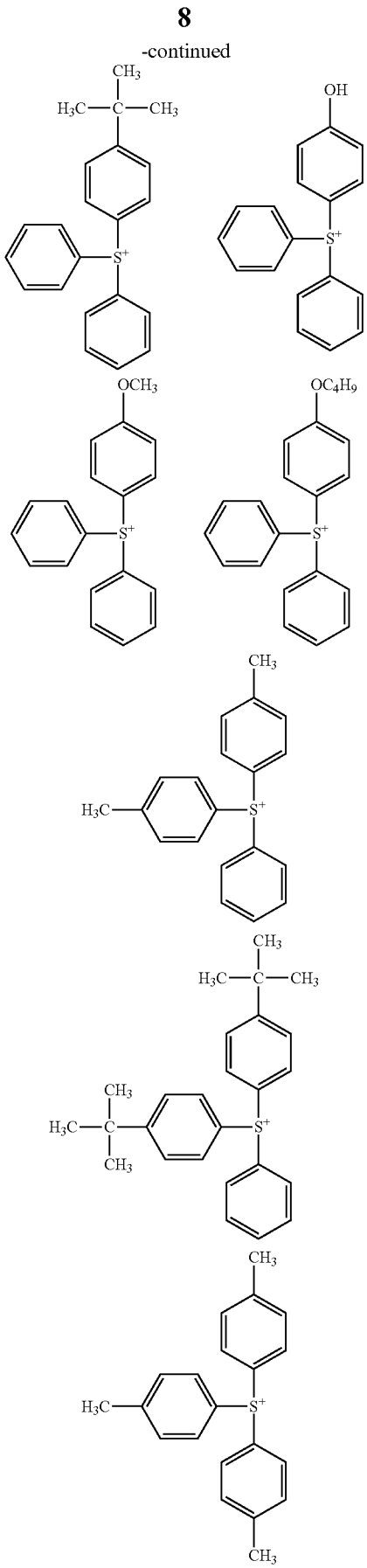

-continued
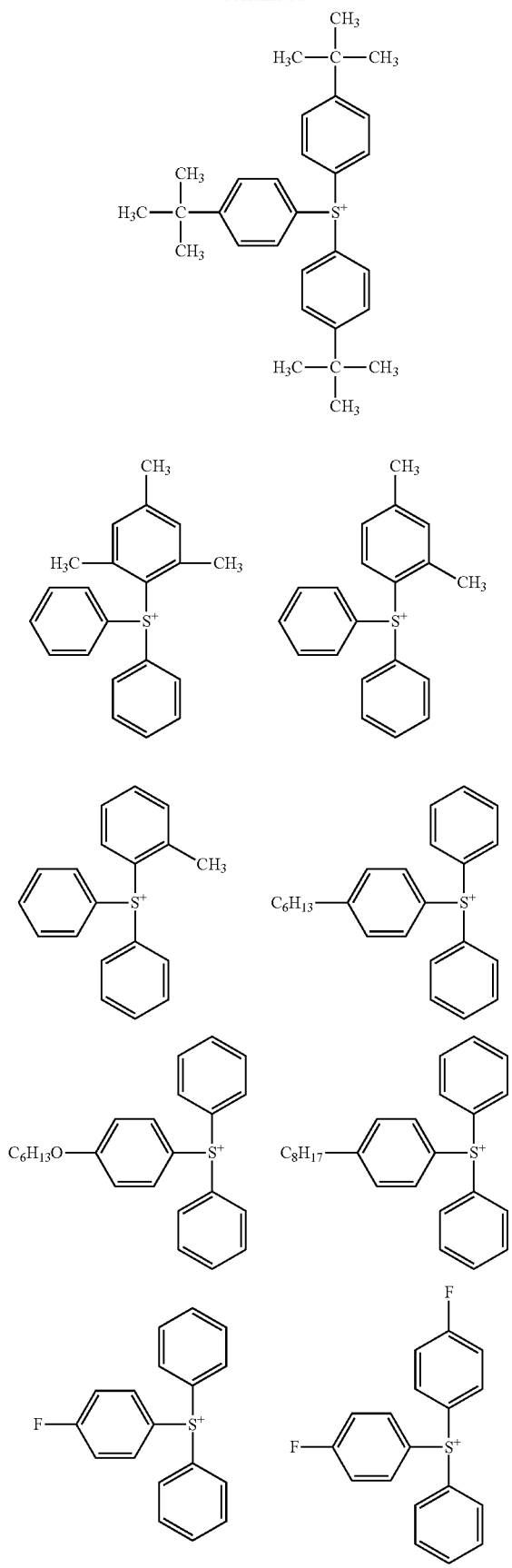
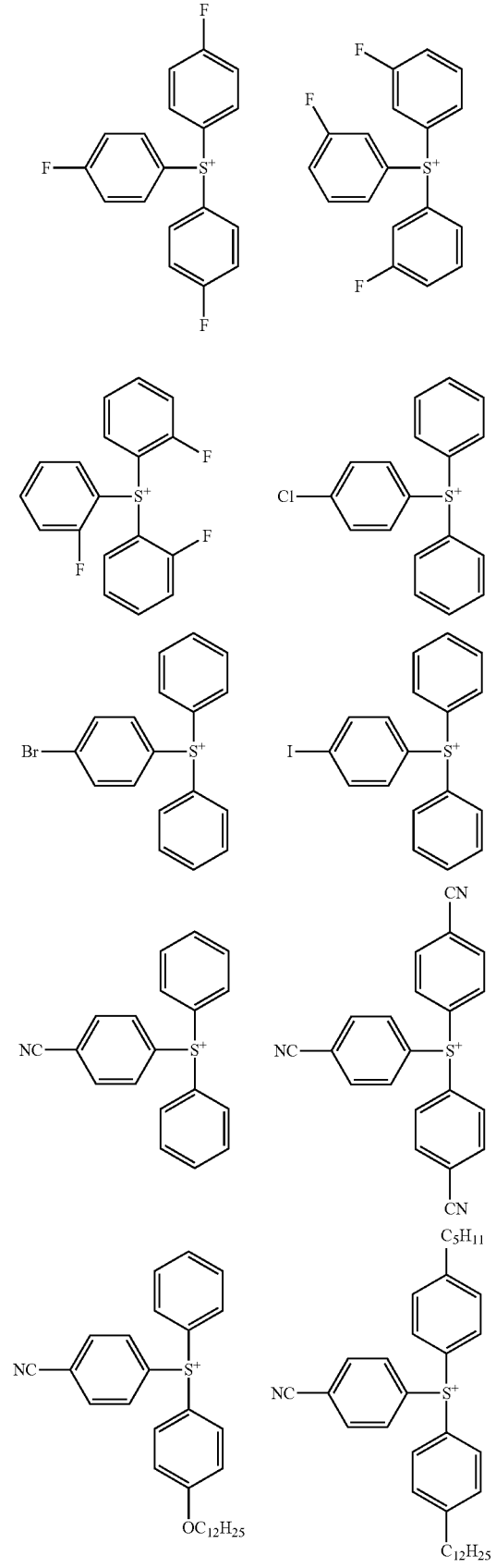

Examples of Cation (IIIb) include the following:
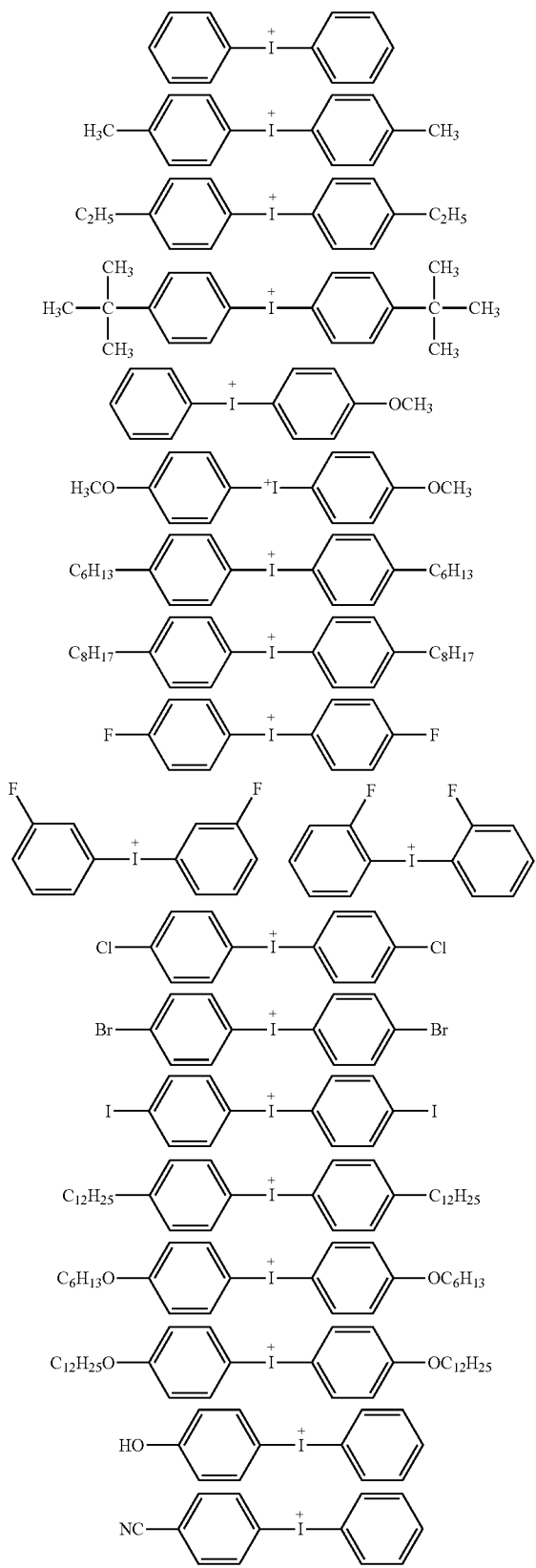
Examples of Cation (IIIc) include the following:
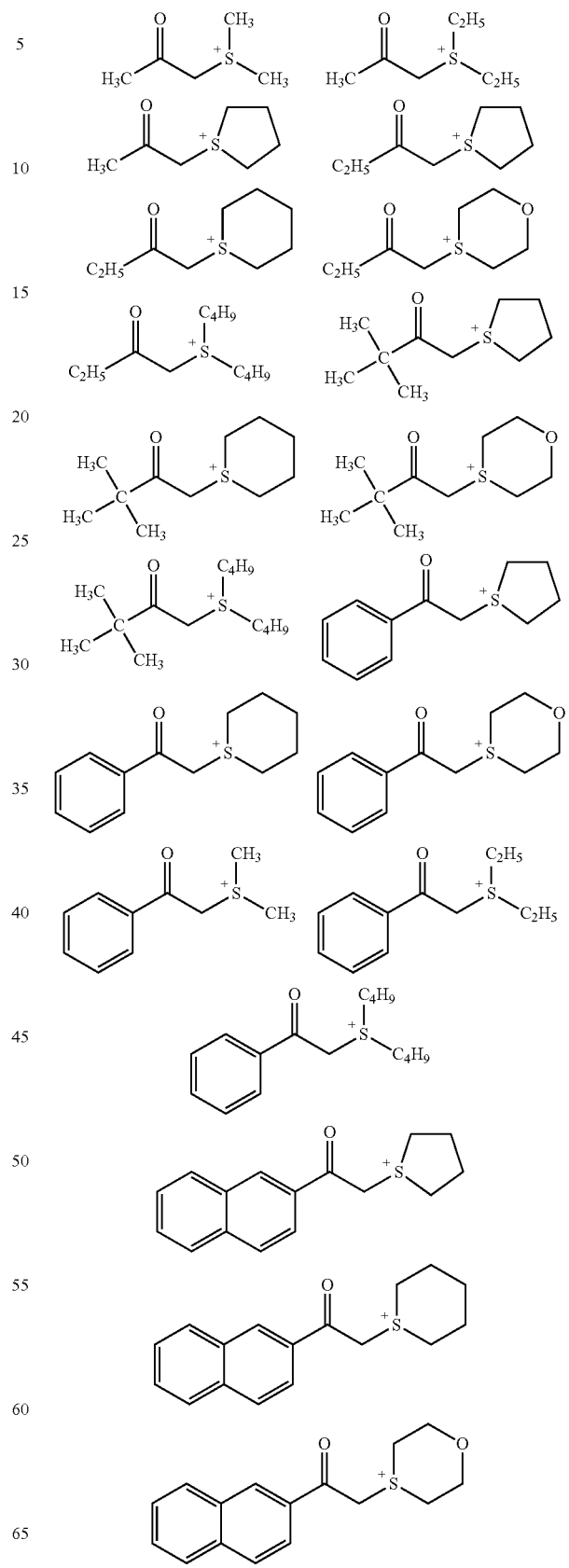

-continued
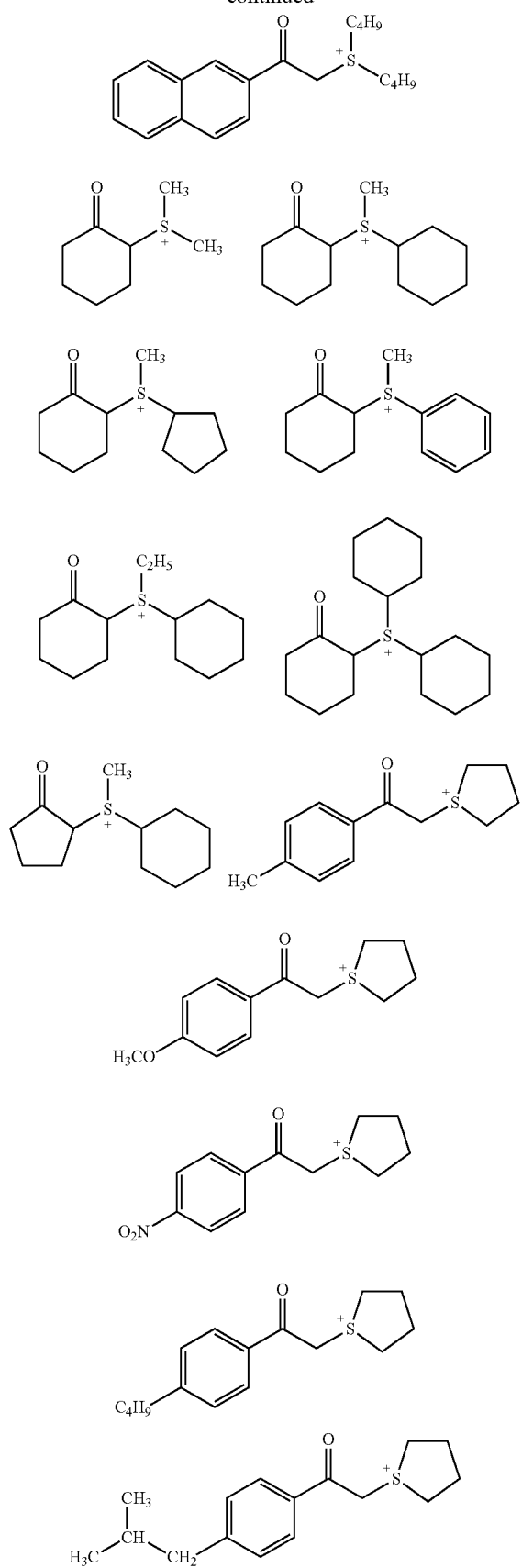
-continued
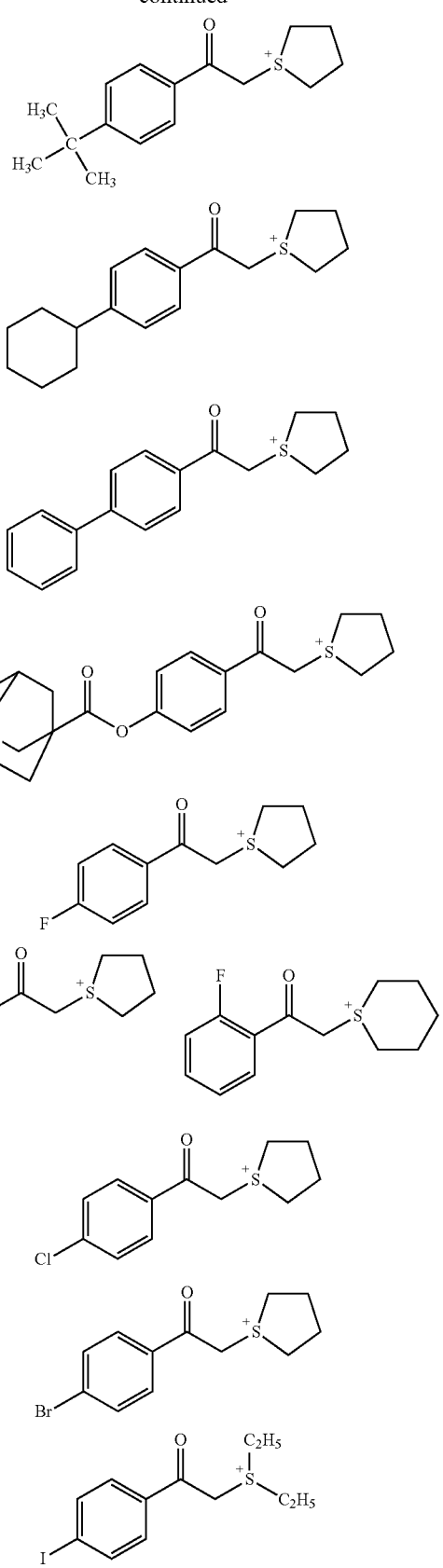

It is preferred that A+ is a cation represented by the formula (IIId):

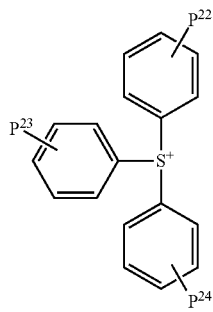

(IIId)

wherein P$^{22}$, P$^{23}$ and P$^{24}$ independently represent a hydrogen atom, a halogen atom, a hydroxyl group, a cyano group, a C1-C4 alkyl group or a C1-C4 alkoxy group from the viewpoint of easy production thereof.

In the formula (I), Q$^1$ and Q$^2$ independently represent a fluorine atom or a C1-C6 perfluoroalkyl group, and examples of the C1-C6 perfluoroalkyl group include a trifluoromethyl group, a pentafluoroethyl group, a heptafluoropropyl group, a nonafluorobutyl group, an undecafluoropentyl group and a tridecafluorohexyl group, and a trifluoromethyl group is preferable. It is preferred that Q$^1$ and Q$^2$ independently represent a fluorine atom or a trifluoromethyl group, and it is more preferred that Q$^1$ and Q$^2$ are fluorine atoms.

In the formula (I), X$^1$ represents —O—CO—, —CO—O—, —CH$_2$—O—CO—, —O—CH$_2$—, —CH$_2$—O—, —NR$^d$—CO— or —CO—NR$^d$—, and R$^d$ represents a hydrogen atom or a C1-C6 alkyl group. Examples of the C1-C6 alkyl group include a methyl group, an ethyl group, a propyl group, an isopropyl group, a butyl group, a tert-butyl group, a pentyl group and a hexyl group. X$^1$ is preferably —O—CO— or —O—CO—, and is more preferably *—O—CO— in which * represents a binding position to U.

In the formula (I), U represents a C1-C20 divalent hydrocarbon group in which one or more —CH$_2$— may be replaced by —O—, —NH—, —S—, —NR$^c$—, —CO— or —CO—O—, R$^c$ represents a C1-C6 alkyl group, X$^1$ represents —O—CO—, —CO—O—, —CO—O—CH$_2$—, —CH$_2$—O—CO—, —O—CH$_2$—, —CH$_2$—O—, —NR$^d$—CO— or —CO—NR$^d$—, R$^d$ represents a hydrogen atom or a C1-C6 alkyl group, Examples of the C1-C6 alkyl group include the same as described above.

Examples of the C1-C20 divalent hydrocarbon group in which one or more —CH$_2$— may be replaced by —O—, —NH—, —S—, —NR$^c$—, —CO— or —CO—O— include a C1-C20 alkylene group such as a methylene group, an ethylene group, a trimethylene group, a tetramethylene group, a pentamethylene group, a hexamethylene group, a heptamethylene group, an octamethylene group, a nonamethylene group, a decamethylene group, an undecamethylene group, a dodecamethylene group, a tridecamethylene group, a tetradecamethylene group, a pentadecamethylene group, a hexadecamethylene group, a heptadecamethylene group, an octadecamethylene group, a nonadecamethylene group and icosamethylene group; an ethylenecarbonylethyl group (—CH$_2$CH$_2$—CO—CH$_2$CH$_2$—); and the following groups:

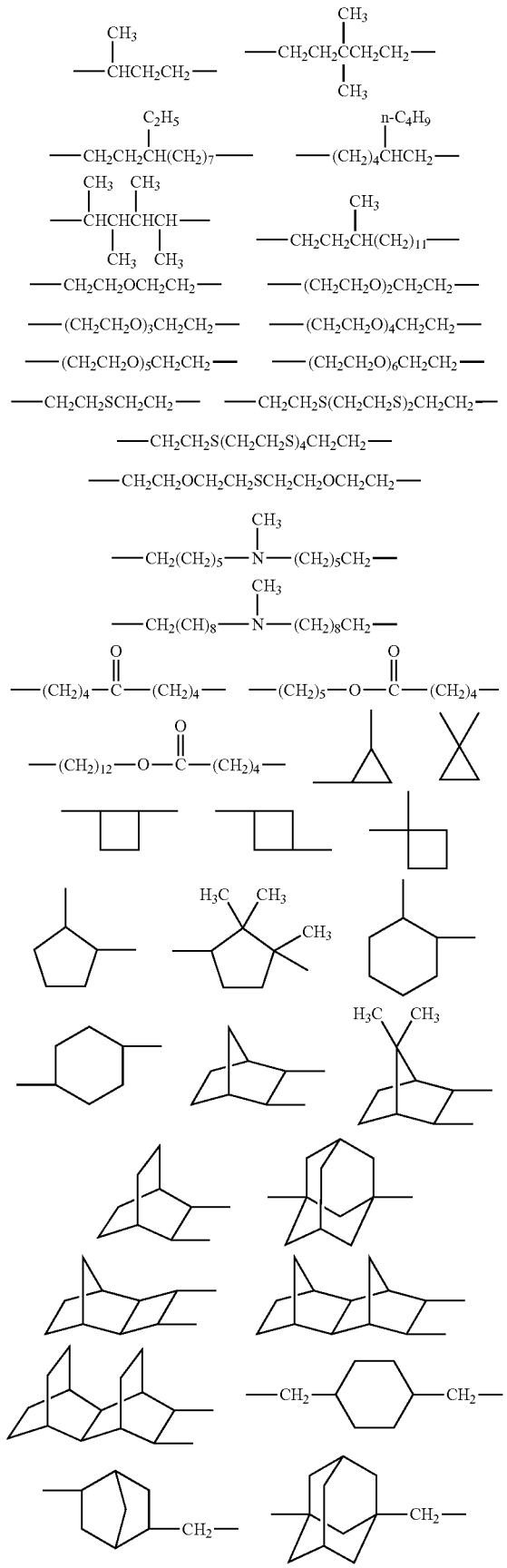

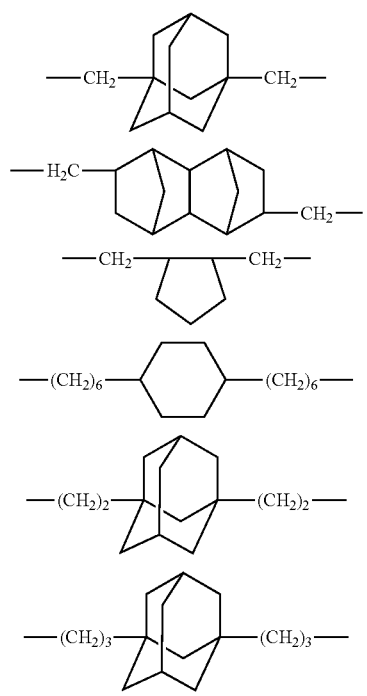

The C1-C20 alkylene group in which one or more —CH$_2$— may be replaced by —O— is preferable.

As the structural unit represented by the formula (I), a structural unit represented by the formula (I'):

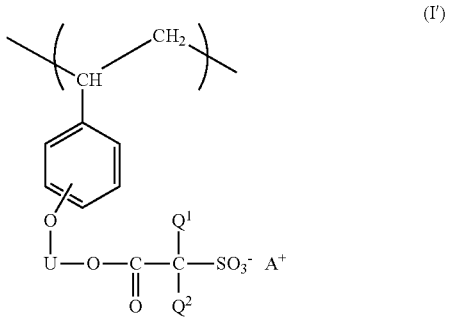

wherein Q$^1$, Q$^2$, U and A$^+$ are the same meanings as defined above, is preferable.

The group represented by the following formula:

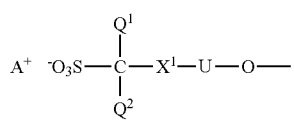

in the formulae (I) is preferably bonded at p-position.

The ratio of the structural unit represented by the formula (I) in Resin (I) is usually 1 to 100% by mole and preferably 5 to 100% by mole based on the total molar of all the structural units of Resin (I).

Resin (I) can be produced by a reaction of a resin comprising a structural unit represented by the formula (IV):

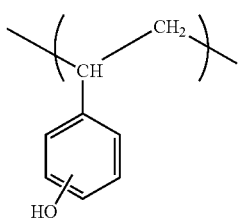

(hereinafter, simply referred to as Resin (IV)) with a salt represented by the formula (V):

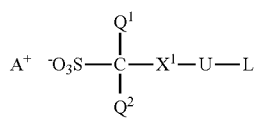

wherein Q$^1$, Q$^2$, X$^1$, U and A$^+$ are the same meanings as defined above, and L represents a halogen atom, a C1-C12 alkylsulfonyloxy group or a C6-C12 arylsulfonyloxy group and the arylsulfonyloxy group may contain one or more heteroatoms (hereinafter, simply referred to as Salt (V)).

The resin (IV) can be produced according to known methods, and commercially available one may be used. Examples of the structural unit represented by the formula (IV) include a structural unit derived from o-hydroxystyrene, a structural unit derived from m-hydroxystyrene and a structural unit derived from p-hydroxystyrene, and a structural unit derived from p-hydroxystyrene is preferable.

Examples of the halogen atom include a fluorine atom, a bromine atom, a chlorine atom and an iodine atom. Examples of the C1-C12 alkylsulfonyloxy group include a methanesulfonyloxy group, an ethanesulfonyloxy group, a propanesulfonyloxy group, a butanesulfonyloxy group, a pentanesulfonyloxy group, a hexanesulfonyloxy group, a heptanesulfonyloxy group, an octanesulfonyloxy group, a nonanesulfonyloxy group, a decanesulfonyloxy group, an undecanesulfonyloxy group and a dodecanesulfonyloxy group. Examples of the C6-C12 arylsulfonyloxy group which may contain one or more heteroatoms include a benzenesulfonyloxy group, a toluenesulfonyloxy group, a p-bromobenzenesulfonyloxy group, a naphthalenesulfonyloxy group, a 2-pyridinesulfonyloxy group and a 2-quinolinesulfonyloxy group.

Examples of Salt (V) include triphenylsulfonium difluoro(chloromethoxycarbonyl)methanesulfonate, triphenylsulfonium difluoro(2-bromoethoxycarbonyl)methanesulfonate, triphenylsulfonium difluoro(3-iodopropoxycarbonyl)methanesulfonate, triphenylsulfonium difluoro(4-chlorobutoxycarbonyl)methanesulfonate, diphenyltolylsulfonium difluoro(5-bromopentyloxycarbonyl)methanesulfonate, triphenylsulfonium difluoro(5-fluoropentyloxycarbonyl)methanesulfonate, triphenylsulfonium difluoro(6-bromohexyloxycarbonyl)methanesulfonate, tris(tert-butylphenyl)sulfonium difluoro(6-bromohexyloxycarbonyl)methanesulfonate, triphenylsulfonium difluoro(7-chloroheptyloxycarbonyl)methanesulfonate, diphenyl(tert-butylphenyl)sulfonium difluoro(8-iodooctyloxycarbonyl)methanesulfonate, triphenylsulfonium difluoro(9- chlorononyloxycarbonyl)methanesulfonate, tris(tolyl)sulfonium difluoro(10-bromodecyloxycarbonyl)methanesulfonate, triphenylsulfonium difluoro(11-chloroundecyloxycarbonyl)methanesulfonate, triphenylsulfonium difluoro(12-bromododecyloxycarbonyl)methanesulfonate, diphenyltolylsulfonium difluoro(12-bromododecyloxycarbonyl)methanesulfonate, triphenylsulfonium difluoro(13-bromotridecyloxycarbonyl)methanesulfonate, tris(tert-butylphenyl)sulfonium difluoro(14-chlorotetradecyloxycarbonyl)methanesulfonate, triphenylsulfonium difluoro(15-iodopentadecyloxycarbonyl)methanesulfonate, triphenylsulfonium difluoro(16-bromohexadecyloxycarbonyl)methanesulfonate, diphenyltolylsulfonium difluoro(17-chloroheptadecyloxycarbonyl)methanesulfonate, triphenylsulfonium difluoro(18-bromooctadecyloxycarbonyl)methanesulfonate, triphenylsulfonium difluoro(19-iodononadecyloxycarbonyl)methanesulfonate, triphenylsulfonium difluoro(20-bromoicosyloxycarbonyl)methanesulfonate, triphenylsulfonium difluoro[6-(methanesulfonyloxy)hexyloxycarbonyl]methanesulfonate, triphenylsulfonium difluoro[8-(p-toluenesulfonyloxy)octyloxycarbonyl]methanesulfonate, tris(tert-butylphenyl)sulfonium difluoro[9-(p-bromobenzenesulfonyloxy)nonyloxycarbonyl]methanesulfonate, triphenylsulfonium difluoro[10-(naphthalenesulfonyloxy)decyloxycarbonyl]methanesulfonate, triphenylsulfonium difluoro[12-(2-pyridinesulfonyloxy)dodecyloxycarbonyl]methanesulfonate, diphenyltolylsulfonium difluoro[13-(2-quinolinesulfonyloxy)tridecyloxycarbonyl]methane sulfonate, triphenylsulfonium bis(trifluoromethyl)(6-bromohexyloxycarbonyl)methanesulfonate, triphenylsulfonium bis(nonafluorobutyl)(4-chlorobutoxycarbonyl)methanesulfonate, triphenylsulfonium bis(perfluorohexyl)(6-bromohexyloxycarbonyl)methanesulfonate, triphenylsulfonium (8-bromooctyloxycarbonyl)pentafluoroethanesulfonate, triphenylsulfonium difluoro(4-bromo-2,2-dimethylbutoxycarbonyl)methanesulfonate, triphenylsulfonium difluoro[2-{2-(2-chloroethoxy)ethoxy}ethoxycarbonyl]methanesulfonate, triphenylsulfonium difluoro{2-(2-chloroethylthio)ethoxycarbonyl}methanesulfonate, diphenyltolylsulfonium difluoro[2-{N-methyl-(2-chloroethyl)amino}ethoxycarbonyl]methanesulfonate, triphenylsulfonium bis(trifluoromethyl)(5-chloro-4-oxopentyloxycarbonyl)methanesulfonate, triphenylsulfonium bis(trifluoromethyl){3-(2-chloroethoxycarbonyl)propoxycarbonyl}methanesulfonate, triphenylsulfonium bis(trifluoromethyl){(4-chloromethylhexyl)methoxycarbonyl}methanesulfonate, triphenylsulfonium bis(trifluoromethyl){(3-chloromethyladamantyl)methoxycarbonyl}methanesulfonate, triphenylsulfonium bis(trifluoromethyl)(5-chloromethylnorbornan-2-yloxycarbonyl)methanesulfonate, diphenyl(4-fluorophenyl)sulfonium difluoro(chloromethoxycarbonyl)methanesulfonate, diphenyl(3-fluorophenyl)sulfonium difluoro(2-bromoethoxycarbonyl)methanesulfonate, diphenyl(2-fluorophenyl)sulfonium difluoro(3-iodopropoxycarbonyl)methanesulfonate, diphenyl(4-fluorophenyl)sulfonium difluoro(4-chlorobutoxycarbonyl)methanesulfonate, diphenyl(4-fluorophenyl)sulfonium difluoro(5-bromopentyloxycarbonyl)methanesulfonate, bis(4-fluorophenyl)phenylsulfonium difluoro(5-fluoropentyloxycarbonyl)methanesulfonate, tris(4-fluorophenyl)sulfonium difluoro(6-bromohexyloxycarbonyl)methanesulfonate, diphenyl(4-fluorophenyl)sulfonium difluoro(6-bromohexyloxycarbonyl)methanesulfonate, (4-fluorophenyl)bis(tolyl)sulfonium difluoro(6-bromohexyloxycarbonyl)methanesulfonate, (4-fluorophenyl)diphenylsulfonium difluoro(7-chloroheptyloxycarbonyl)methanesulfonate, diphenyl(4-fluorophenyl)sulfonium difluoro(8-iodooctyloxycarbonyl)methanesulfonate, (4-fluorophenyl)bis(tert-butylphenyl)sulfonium difluoro(8-iodooctyloxycarbonyl)methanesulfonate, tris(4-fluorophenyl)sulfonium difluoro(9-chlorononyloxycarbonyl)methanesulfonate, diphenyl(4-fluorophenyl)sulfonium difluoro(10-bromodecyloxycarbonyl)methanesulfonate, tris(4-fluorophenyl)sulfonium difluoro(11-chloroundecyloxycarbonyl)methanesulfonate, tris(4-fluorophenyl)sulfonium difluoro(12-bromododecyloxycarbonyl)methanesulfonate, diphenyl(4-fluorophenyl)sulfonium difluoro(12-bromododecyloxycarbonyl)methanesulfonate, tris(4-fluorophenyl)sulfonium difluoro(12-bromododecyloxycarbonyl)methanesulfonate, diphenyl(4-fluorophenyl)sulfonium difluoro(13-bromotridecyloxycarbonyl)methanesulfonate, diphenyl(4-fluorophenyl)sulfonium difluoro(14-chlorotetradecyloxycarbonyl)methanesulfonate, diphenyl(4-fluorophenyl)sulfonium difluoro(15-iodopentadecyloxycarbonyl)methanesulfonate, diphenyl(4-fluorophenyl)sulfonium difluoro(16-bromohexadecyloxycarbonyl)methanesulfonate, diphenyl(4-fluorophenyl)sulfonium difluoro(17-chloroheptadecyloxycarbonyl)methanesulfonate, diphenyl(4-fluorophenyl)sulfonium difluoro(18-bromooctadecyloxycarbonyl)methanesulfonate, diphenyl(4-fluorophenyl)sulfonium difluoro(19-iodononadecyloxycarbonyl)methanesulfonate, diphenyl(3-fluorophenyl)sulfonium difluoro(20-bromoicosyloxycarbonyl)methanesulfonate, triphenylsulfonium diphenyl(4-chlorophenyl)sulfonium difluoro(4-chlorobutoxycarbonyl)methanesulfonate, diphenyl(4-bromophenyl)sulfonium difluoro(6-bromohexyloxycarbonyl)methanesulfonate, diphenyl(4-iodophenyl)sulfonium difluoro(8-bromooctyloxycarbonyl)methanesulfonate, diphenyliodonium difluoro(chloromethoxycarbonyl)methanesulfonate, diphenyliodonium difluoro(2-bromoethoxycarbonyl)methanesulfonate, bis(4-methylphenyl)iodonium difluoro(2-bromoethoxycarbonyl)methanesulfonate, bis(4-ethylphenyl)iodonium difluoro(3-iodopropoxycarbonyl)methanesulfonate, bis(4-tert-butylphenyl)iodonium difluoro(4-chlorobutoxycarbonyl)methanesulfonate, bis(4-methoxyphenyl)iodonium difluoro(5-bromopentyloxycarbonyl)methanesulfonate, bis(4-methoxyphenyl)iodonium difluoro(6-bromohexyloxycarbonyl)methanesulfonate, bis(4-hexylphenyl)iodonium difluoro(7-chloroheptyloxycarbonyl)methanesulfonate, bis(4-octylphenyl)iodonium difluoro(8-iodooctyloxycarbonyl)methanesulfonate, bis(4-fluorophenyl)iodonium difluoro(12-bromododecyloxycarbonyl)methanesulfonate, bis(3-fluorophenyl)iodonium difluoro(12-bromododecyloxycarbonyl)methanesulfonate, bis(2-fluorophenyl)iodonium difluoro(12-bromododecyloxycarbonyl)methanesulfonate, bis(4-chlorophenyl)iodonium bis(trifluoromethyl)(9-chlorononyloxycarbonyl)methanesulfonate, bis(4-bromophenyl)iodonium difluoro(10-bromodecyloxycarbonyl)methanesulfonate, bis(4-iodophenyl)iodonium difluoro(18-bromooctadecyloxycarbonyl)methanesulfonate, tetrahydro-2-oxopropylthiophanium difluoro(chloromethoxycarbonyl)methanesulfonate, tetrahydro-1-acetonyl-2H-thiopyranium difluoro(3-iodopropoxycarbonyl)methanesulfonate, tetrahydro-1-(2-oxobutyl)-2H-thiopyranium difluoro(4-chlorobutoxycarbonyl)methanesulfonate, 4-acetonyl-1,4-oxathianium difluoro(5-fluoropentyloxycarbonyl)methanesulfonate, tetrahydro-1-(2-oxo-2-phenylethyl)-2H-thiopyranium difluoro(5-bromopentyloxycarbonyl)methanesulfonate, dimethyl(2-oxocyclohexyl)sulfonium difluoro(6-bromohexyloxycarbonyl)methanesulfonate, methyl(2-oxocyclohexyl)cyclopentylsulfonium difluoro(8-iodooctyloxycarbonyl)methanesulfonate, diethyl(2-oxocyclohexyl)sulfonium difluoro(9-chlorononyloxycarbonyl)methanesulfonate, methyl(2-oxocyclohexyl)cyclopentylsulfonium difluoro(10-bromodecyloxycarbonyl)methanesulfonate, methyl(2-oxocyclohexyl)phenylsulfonium difluoro(11-chloroundecyloxycarbonyl)methanesulfonate, dimethyl(2-oxocyclohexyl)sulfonium difluoro(12-bromododecyloxycarbonyl)methanesulfonate, methyl(2-oxocyclohexyl)cyclohexylsulfonium difluoro(16-bromohexadecyloxycarbonyl)methanesulfonate, methyl(2-oxocyclohexyl)cyclopentylsulfonium bis(trifluoromethyl){(4-chloromethylhexyl)methoxycarbonyl}methanesulfonate, diethyl(2-oxocyclohexyl)sulfonium bis(trifluoromethyl){(3-chloromethyladamantyl) methoxycarbonyl}methanesulfonate, methyl(2-oxocyclohexyl)cyclohexylsulfonium bis(trifluoromethyl)(5-chloromethylnorbornan-2-yloxycarbonyl)methanesulfonate, methyl(2-oxocyclohexyl)phenylsulfonium difluoro(6-bromohexyloxycarbonyl)methanesulfonate, tetrahydro-1-{2-oxo-2-(4-fluorophenyl)ethyl}-2H-thiopyranium difluoro(5-bromopentyloxycarbonyl)methanesulfonate, tetrahydro-1-{2-oxo-2-(3-fluorophenyl)ethyl}-2H-thiopyranium difluoro(6-bromohexyloxycarbonyl)methanesulfonate, tetrahydro-1-{2-oxo-2-(2-fluorophenyl)ethyl}-2H-thiopyranium difluoro(7-bromoheptyloxycarbonyl)methanesulfonate, tetrahydro-1-{2-oxo-2-(4-chlorophenyl)ethyl}-2H-thiopyranium difluoro(5-bromopentyloxycarbonyl)methanesulfonate, tetrahydro-1-{2-oxo-2-(4-bromophenyl)ethyl}-2H-thiopyranium difluoro(5-bromohexyloxycarbonyl)methanesulfonate, tetrahydro-1-{2-oxo-2-(4-iodophenyl)ethyl}-2H-thiopyranium difluoro(8-bromooctyloxycarbonyl)methanesulfonate, dimethyl(2-oxacyclohexyl)(4-fluorophenyl)sulfonium difluoro(6-bromohexyloxycarbonyl)methanesulfonate, methyl(2-oxacyclohexyl)(4-fluorophenyl)sulfonium difluoro(8-bromooctyloxycarbonyl)methanesulfonate, methyl(2-oxacyclohexyl)(3-fluorophenyl)sulfonium difluoro(10-bromodecyloxycarbonyl)methanesulfonate and methyl(2-oxacyclohexyl)(2-fluorophenyl)sulfonium difluoro(12-bromododecyloxycarbonyl)methanesulfonate.

The content of the structural unit represented by the formula (I) in Resin (I) differs depending on the used amount of Salt (V), and the content of the structural unit represented by the formula (I) in Resin (I) can be adjusted by adjusting the used amount of Salt (V).

The reaction of Resin (IV) and Salt (V) is usually conducted in an inert solvent such as acetone, methyl ethyl ketone, toluene, tetrahydrofuran, N,N-dimethylformamide and dimethylsulfoxide. The reaction temperature is usually −30 to 200° C., and preferably 0 to 150° C.

The used amount of Salt (V) is usually 0.01 to 2 moles and preferably 0.03 to 1 mole per 1 mole of the structural unit represented by the formula (IV) in Resin (IV).

The reaction is preferably carried out in the presence of a base. Examples of the base include an organic base such as triethylamine, pyridine, sodium methoxide, sodium ethoxide and potassium tert-butoxide, and an inorganic base such as sodium hydride, potassium carbonate and sodium hydroxide.

The used amount of the base is usually 0.01 to 2 moles and preferably 0.03 to 1.5 moles per 1 mole of the structural unit represented by the formula (IV) in Resin (IV).

The reaction can be carried out in the presence of a phase transfer catalyst such as tetrabutylammonium bromide.

After completion of the reaction, Resin (I) can be isolated according to known methods.

Resin (I) is preferably insoluble or poorly soluble in an alkali aqueous solution but becomes soluble in an alkali aqueous solution by the action of an acid. Resin (I) preferably has at least one structural unit derived from a compound having an acid-labile group in addition to the structural unit represented by the formula (I), and can be produced by polymerizing one or more compounds having acid-labile groups with a monomer giving to the structural unit represented by the formula (IV) followed by reacting the produced resin with Salt (V).

In this specification, "an acid-labile group" means a group capable of being eliminated by the action of an acid.

Examples of the acid-labile group include a group represented by the formula (10):

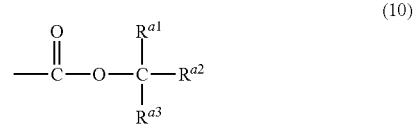

wherein $R^{a1}$, $R^{a2}$ and $R^{a3}$ independently represent an aliphatic hydrocarbon group or a saturated cyclic hydrocarbon group, and $R^{a1}$ and $R^{a2}$ can be bonded each other to form a ring.

Examples of the aliphatic hydrocarbon group include a C1-C8 aliphatic hydrocarbon group such as a C1-C8 alkyl group. Specific examples of the C1-C8 alkyl group include a methyl group, an ethyl group, a propyl group, an isopropyl group, a butyl group, a pentyl group, a hexyl group, a heptyl group and an octyl group. Examples of the saturated cyclic hydrocarbon group include a C3-C20 alicyclic hydrocarbon group. The alicyclic hydrocarbon group may be monocyclic or polycyclic, and examples thereof include a monocyclic alicyclic hydrocarbon group such as a C3-C20 cycloalkyl group (e.g. a cyclopentyl group, a cyclohexyl group, a methylcyclohexyl group, a dimethylcyclohexyl group, a cycloheptyl group and a cyclooctyl group) and a polycyclic alicyclic hydrocarbon group such as a decahydronaphthyl group, an adamantyl group, a norbornyl group, a methylnorbornyl group, and the followings:

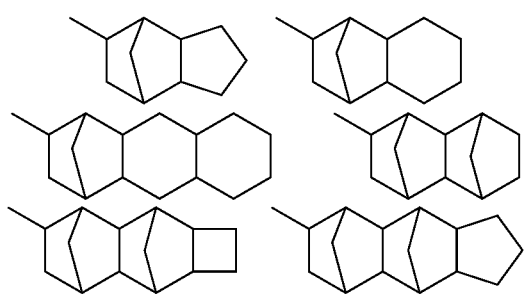

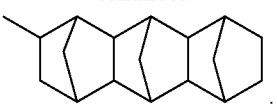

The alicyclic hydrocarbon group preferably has 5 to 20 carbon atoms.

Examples of the ring formed by bonding $R^{a1}$ and $R^{a2}$ each other include the following groups and the ring preferably has 5 to 20 carbon atoms.

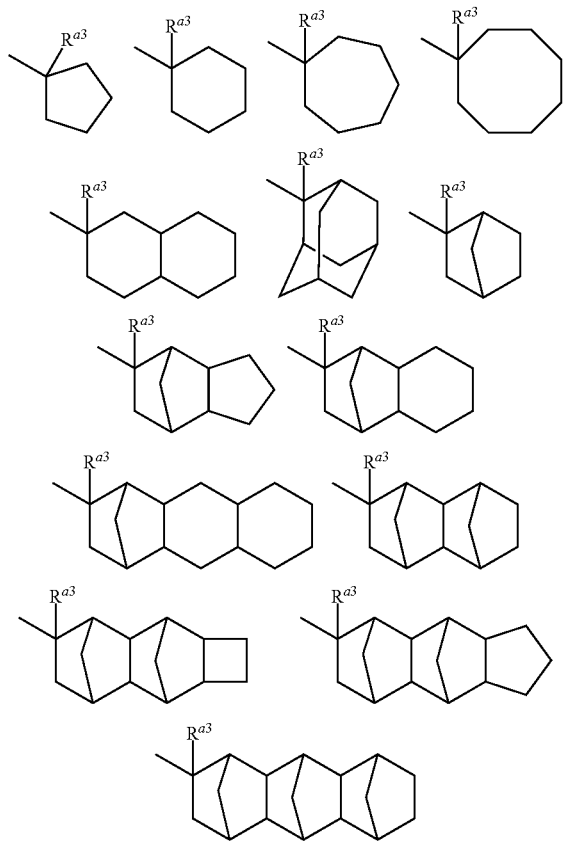

wherein $R^{a3}$ is the same as defined above.

The group represented by the formula (10) wherein $R^{a1}$, $R^{a2}$ and $R^{a3}$ independently each represent a C1-C8 alkyl group such as a tert-butyl group, the group represented by the formula (10) wherein $R^{a1}$ and $R^{a2}$ are bonded each other to form an adamantyl ring and $R^{a3}$ is a C1-C8 alkyl group such as a 2-alkyl-2-adamantyl group, and the group represented by the formula (10) wherein $R^{a1}$ and $R^{a2}$ are C1-C8 alkyl groups and $R^{a3}$ is an adamantyl group such as a 1-(1-adamantyl)-1-alkylalkoxycarbonyl group are preferable.

The compound having an acid-labile group is preferably an acrylate monomer having an acid-labile group in its side chain or a methacrylate monomer having an acid-labile group in its side chain.

Preferable examples of the compound having an acid-labile group include a monomer represented by the formula (a1-1) and a monomer represented by the formula (a1-2):

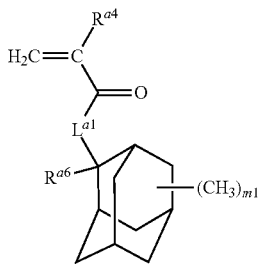

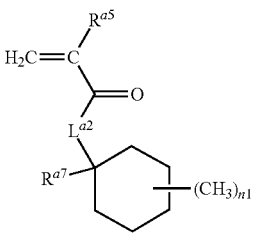

wherein $R^{a4}$ and $R^{a5}$ independently represents a hydrogen atom or a methyl group, $R^{a6}$ and $R^{a7}$ independently represents a C1-C8 aliphatic hydrocarbon group or a C3-C10 saturated cyclic hydrocarbon group, $L^{a1}$ and $L^{a2}$ independently represents *—O— or *—O—$(CH_2)_{k1}$—CO—O— in which * represents a binding position to —CO—, and k1 represents an integer of 1 to 7, and m1 and n1 each independently represents an integer of 0 to 14, and the monomer represented by the formula (a1-1) is more preferable.

The aliphatic hydrocarbon group preferably has 1 to 6 carbon atoms, and the saturated cyclic hydrocarbon group preferably has 3 to 8 carbon atoms and more preferably 3 to 6 carbon atoms.

Examples of the aliphatic hydrocarbon group include a C1-C8 alkyl group such as a methyl group, an ethyl group, a propyl group, an isopropyl group, a butyl group, a tert-butyl group, a 2,2-dimethylethyl group, a 1-methylpropyl group, a 2,2-dimethylpropyl group, a 1-ethylpropyl group, a 1-methylbutyl group, a 2-methylbutyl group, a 3-methylbutyl group, a 1-propylbutyl group, a pentyl group, a 1-methylpentyl group, a hexyl group, a 1,4-dimethylhexyl group, a heptyl group, a 1-methylheptyl group and an octyl group. Examples of the saturated cyclic hydrocarbon group include a cyclohexyl group, a methylcyclohexyl group, a dimethylcyclohexyl group, a cycloheptyl group, a methylcycloheptyl group, a norbornyl group and a methylnorbornyl group.

$L^{a1}$ is preferably *—O— or *—O—$(CH_2)_{f1}$—CO—O— in which * represents a binding position to —CO—, and f1 represents an integer of 1 to 4, and is more preferably *—O— or *—O—$CH_2$—CO—O—, and is especially preferably *—O—. $L^{a2}$ is preferably *—O— or *—O—$(CH_2)_{f1}$—CO—O— in which * represents a binding position to —CO—, and f1 is the same as defined above, and is more preferably *—O— or *—O—$CH_2$—CO—O—, and is especially preferably *—O—.

In the formula (a1-1), m1 is preferably an integer of 0 to 3, and is more preferably 0 or 1. In the formula (a1-2), n1 is preferably an integer of 0 to 3, and is more preferably 0 or 1.

Particularly when the photoresist composition contains a resin derived from a monomer having a bulky structure such as a saturated cyclic hydrocarbon group, the photoresist composition having excellent resolution tends to be obtained.

Examples of the monomer represented by the formula (a1-1) include the followings.

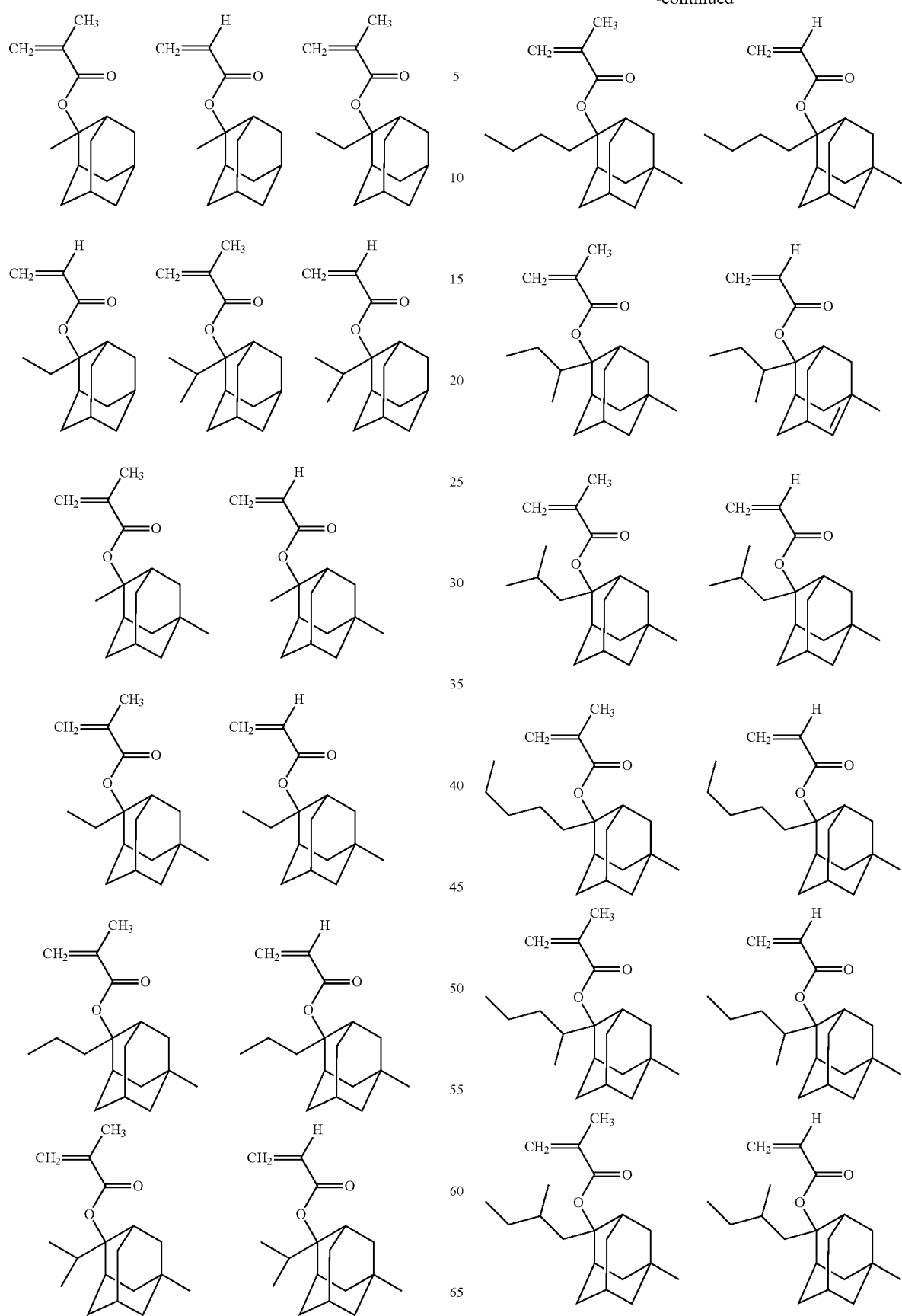

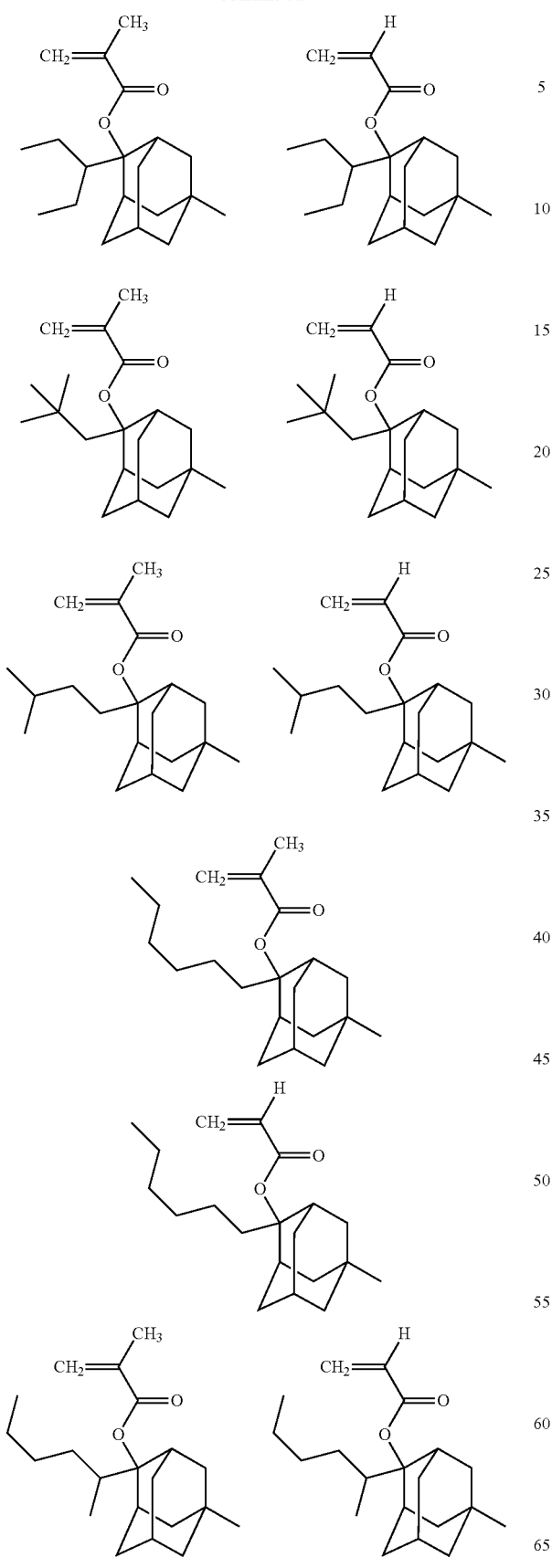

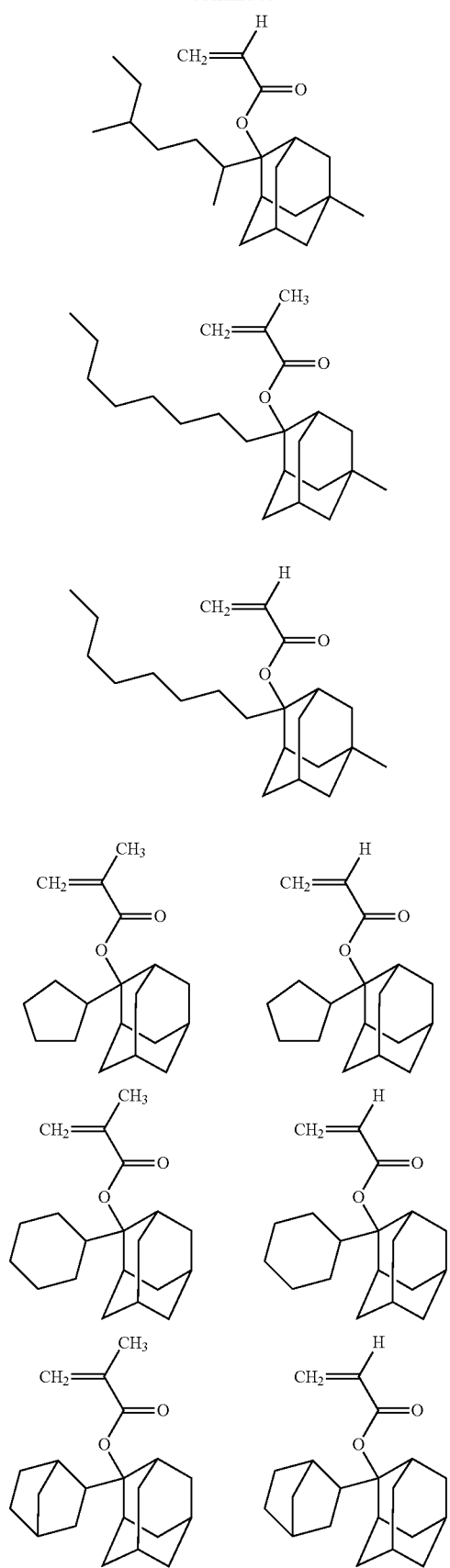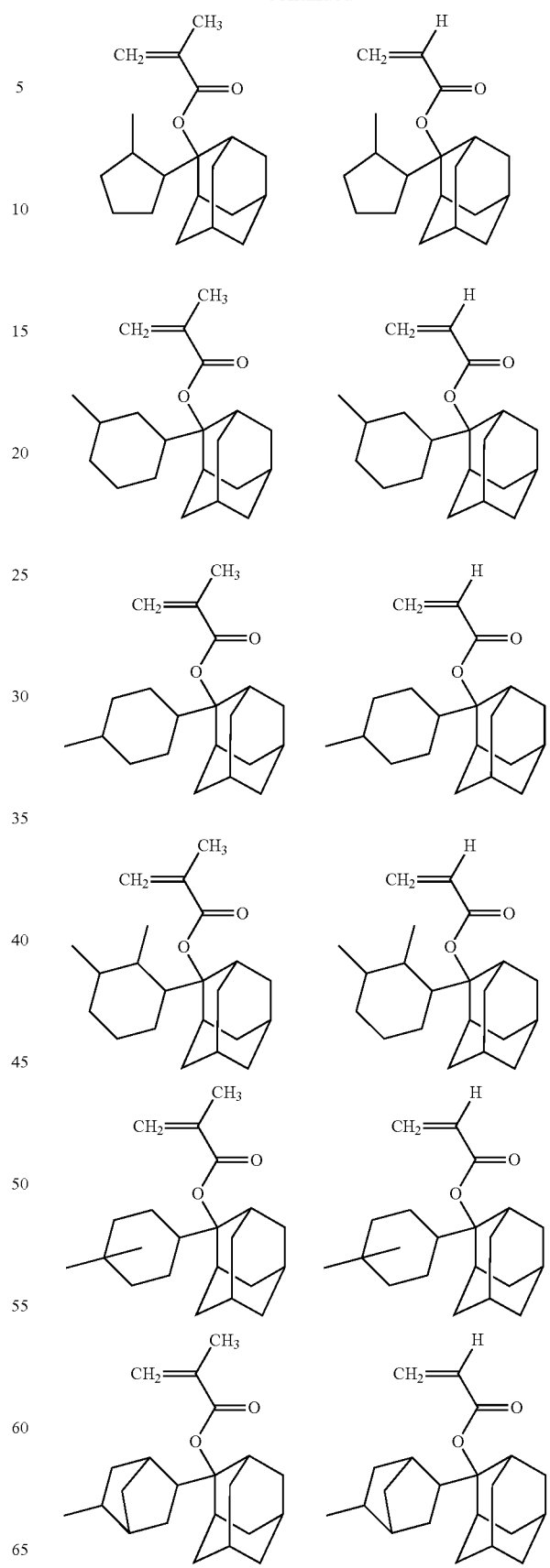

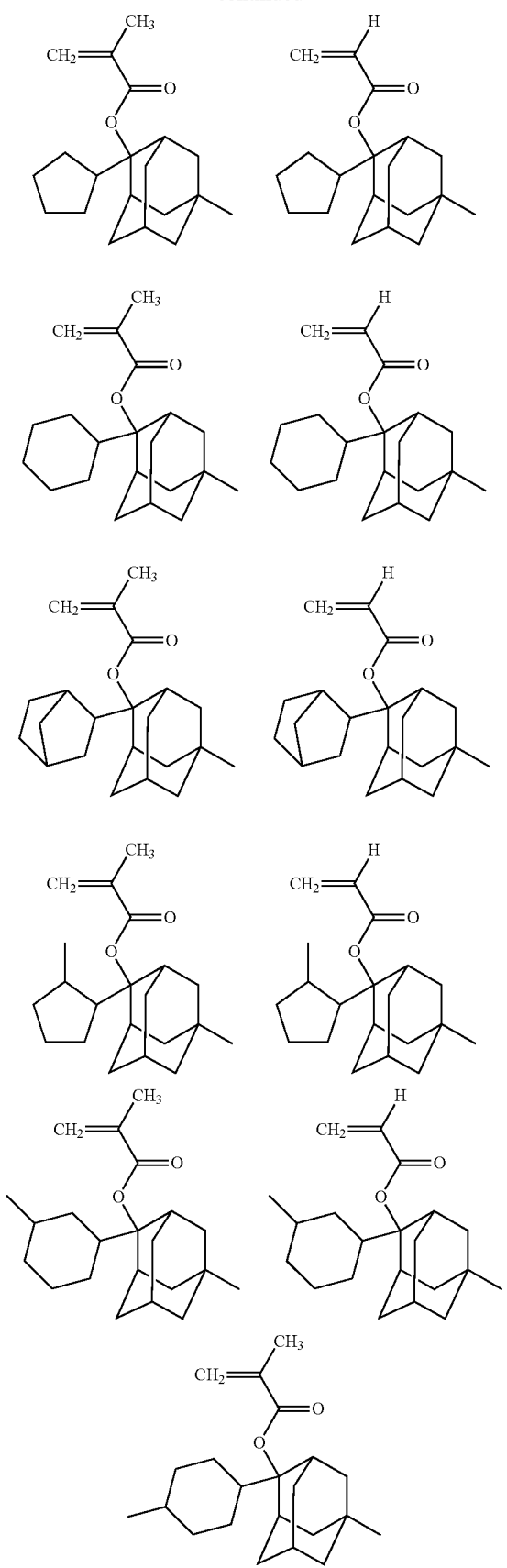
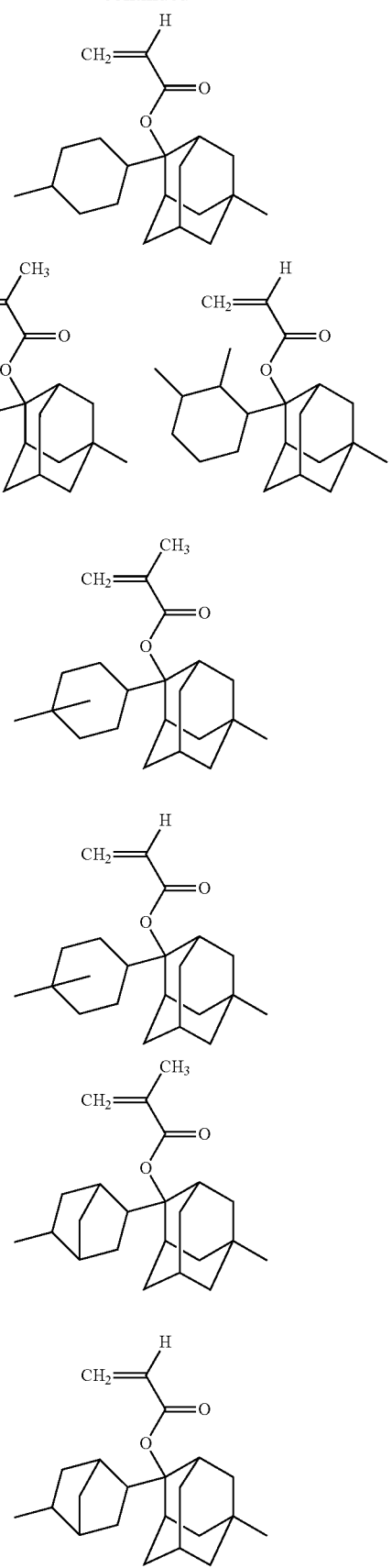

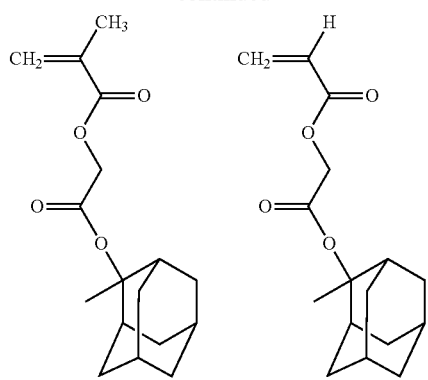
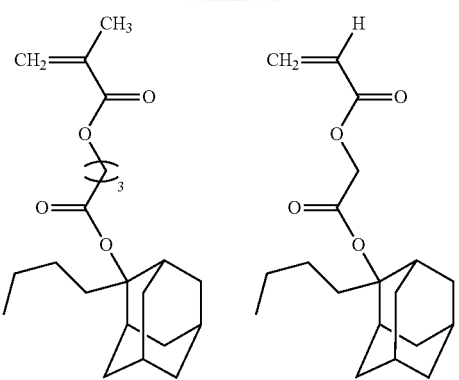
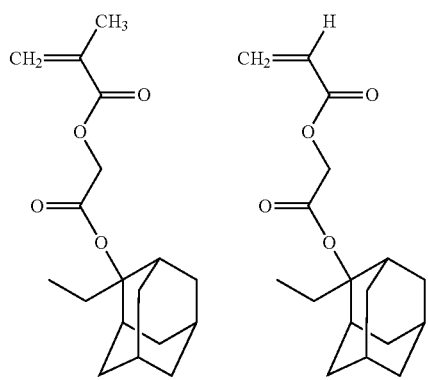
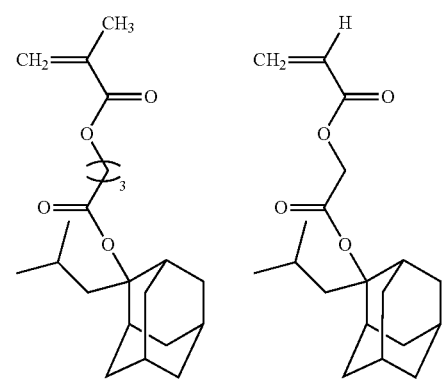
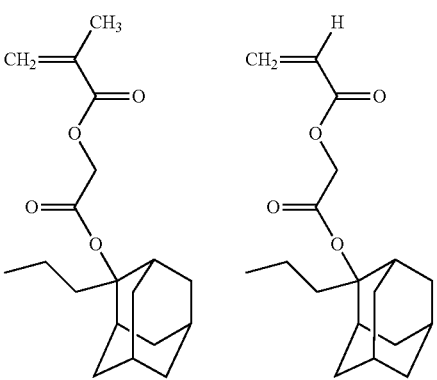
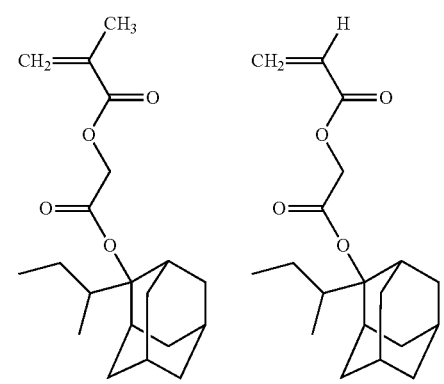
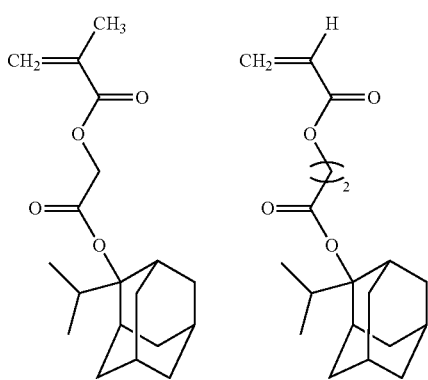
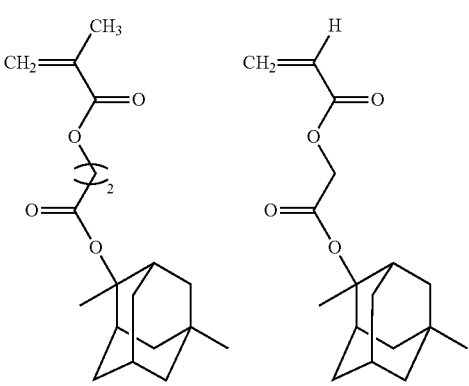

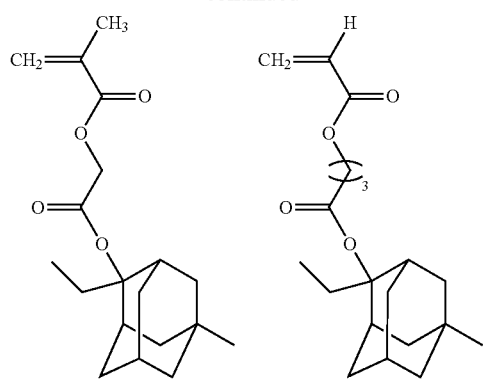
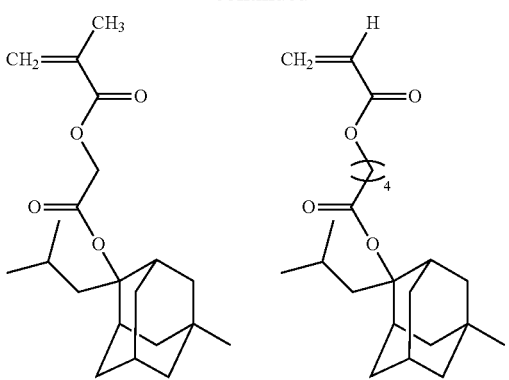
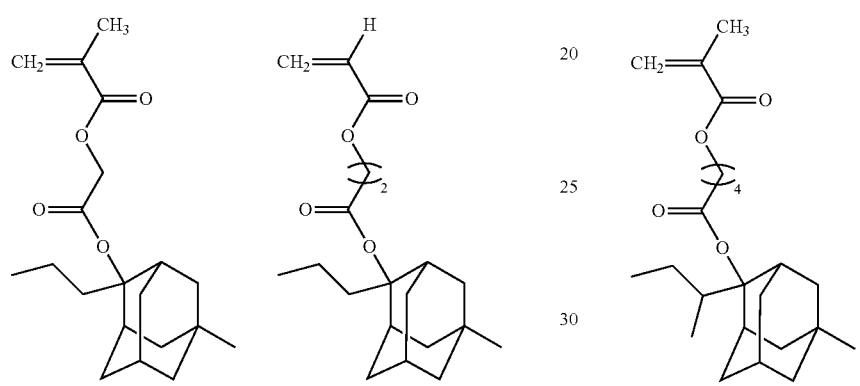
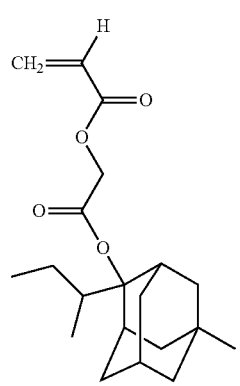
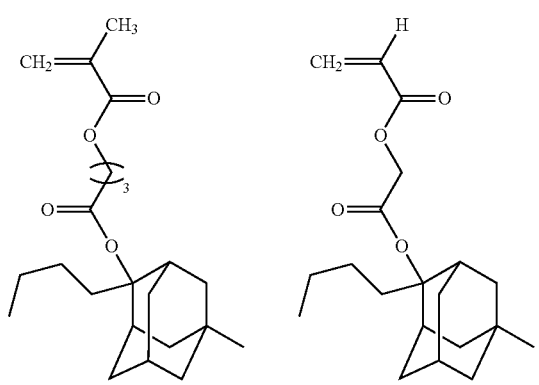
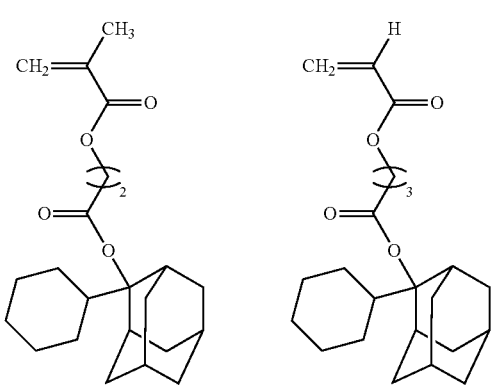

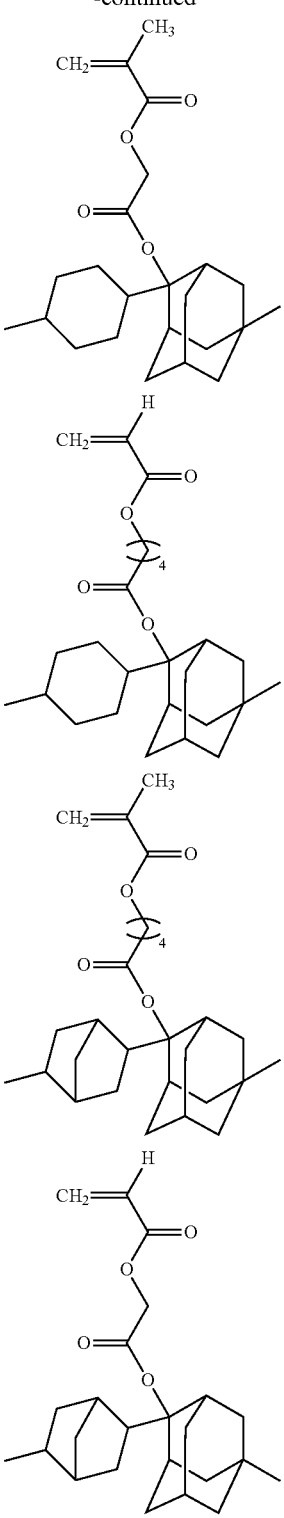

Among them, preferred are 2-methyl-2-adamantyl acrylate, 2-methyl-2-adamantyl methacrylate, 2-ethyl-2-adamantyl acrylate, 2-ethyl-2-adamantyl methacrylate, 2-isopropyl-2-adamantyl acrylate and 2-isopropyl-2-adamantyl methacrylate, and more preferred are 2-methyl-2-adamantyl methacrylate, 2-ethyl-2-adamantyl methacrylate, and 2-isopropyl-2-adamantyl methacrylate.

Examples of the monomer represented by the formula (a1-2) include the followings.

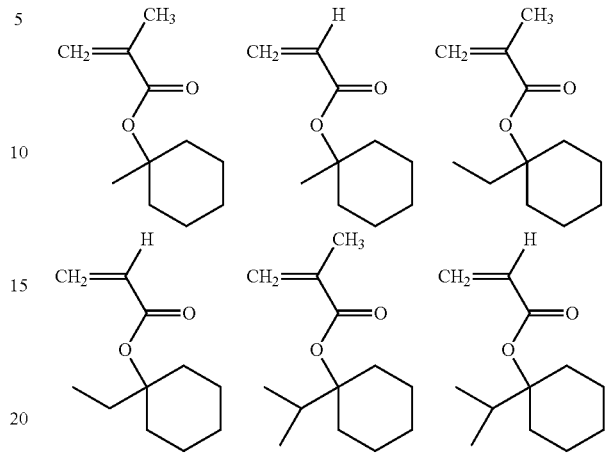

Among them, preferred are 1-ethyl-1-cyclohexyl acrylate and 1-ethyl-1-cyclohexyl methacrylate, and more preferred is 1-ethyl-1-cyclohexyl methacrylate.

Resin (I) preferably comprises a structural unit represented by the formula (II):

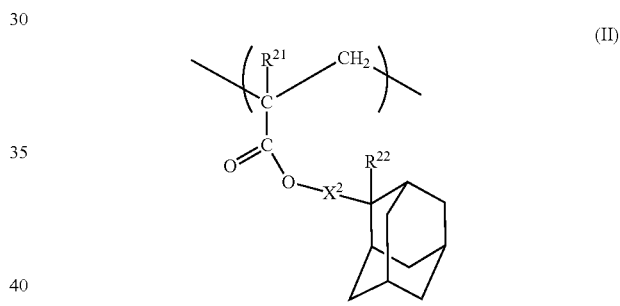

wherein $R^{21}$ represents a hydrogen atom or a methyl group, $R^{22}$ represents a C1-C6 hydrocarbon group, $X^2$ represents a single bond or *—$(CH_2)_k$—CO—O— in which * represents a binding position to —O—, and k represents an integer of 1 to 6.

The structural unit represented by the formula (II) is derived from a monomer represented by the following formula:

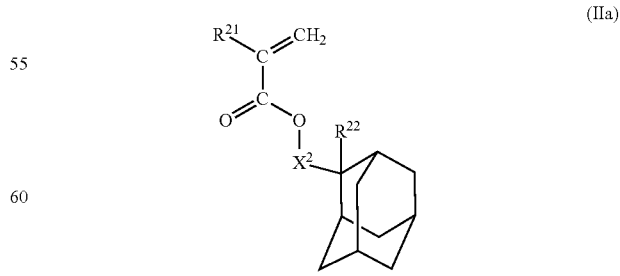

wherein $R^{21}$, $R^{22}$ and $X^2$ are the same as defined above.

Examples of the compound having an acid-labile group also include a monomer represented by the formula (a1-4):

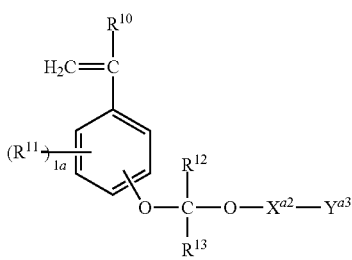

(a1-4)

wherein $R^{10}$ represents a hydrogen atom, a halogen atom, a C1-C6 alkyl group or a C1-C6 halogenated alkyl group, $R^{11}$ is independently in each occurrence a halogen atom, a hydroxyl group, a cyano group, a C1-C12 alkyl group, a C1-C12 hydroxy-containing alkyl group, a C1-C12 alkoxy group, a C6-C12 aryl group, a C7-C13 aralkyl group, a glycidyloxy group, a C2-C4 acyl group, a C2-C4 acyloxy group, an acryloyl group or a methacryloyl group, 1a represents an integer of 0 to 4, $R^{12}$ and $R^{13}$ independently represent a hydrogen atom or a C1-C12 hydrocarbon group, $X^{a2}$ represents a single bond or a C1-C17 divalent saturated hydrocarbon group in which one or more —$CH_2$— can be replaced by —O—, —CO—, —S—, —$SO_2$— or —N($R^c$)— wherein $R^c$ represents a hydrogen atom or a C1-C6 alkyl group, and $Y^{a3}$ represents a C1-C12 aliphatic hydrocarbon group, a C3-C18 saturated cyclic hydrocarbon group or a C6-C18 aromatic hydrocarbon group, and the C1-C12 aliphatic hydrocarbon group, the C2-C18 saturated cyclic hydrocarbon group and the C6-C18 aromatic hydrocarbon group can have one or more substituents.

Examples of the halogen atom include a fluorine atom.

Examples of the C1-C6 alkyl group include a methyl group, an ethyl group, a propyl group, an isopropyl group, a butyl group, an isobutyl group, a sec-butyl group, a tert-butyl group, a pentyl group and a hexyl group, and a C1-C4 alkyl group is preferable and a C1-C2 alkyl group is more preferable and a methyl group is especially preferable.

Examples of the C1-C6 halogenated alkyl group include a trifluoromethyl group, a pentafluoroethyl group, a heptafluoropropyl group, a heptafluoroisopropyl group, a nonafluorobutyl group, a nonafluoro-sec-butyl group, a nonafluoro-tert-butyl group, a perfluoropentyl group and a perfluorohexyl group.

Examples of the C1-C12 alkyl group include a methyl group, an ethyl group, a propyl group, an isopropyl group, a butyl group, an isobutyl group, a sec-butyl group, a tert-butyl group, a pentyl group, a hexyl group, an octyl group, a decyl group and a dodecyl group. Examples of the C1-C12 hydroxy-containing alkyl group include a hydroxymethyl group and a hydroxyethyl group. Examples of the C1-C12 alkoxy group include a methoxy group, an ethoxy group, a propoxy group, an isopropoxy group, a butoxy group, an isobutoxy group, a sec-butoxy group, a tert-butoxy group, a pentyloxy group, a hexyloxy group, an octyloxy group, a decyloxy group and a dodecyloxy group, and a C1-C4 alkoxy group is preferable and a C1-C2 alkoxy group is more preferable and a methoxy group is especially preferable. Examples of the C6-C12 aryl group include a phenyl group and a naphthyl group, and examples of the C7-C13 aralkyl group include a benzyl group, a phenylethyl group and a haphthylmethyl group.

Examples of the C2-C4 acyl group include an acetyl group, a propionyl group and a butyryl group, and examples of the C2-C4 acyloxy group include an acetyloxy group, a propionyloxy group and a butyryloxy group. Examples of the C1-C12 hydrocarbon group include a C1-C12 aliphatic hydrocarbon group such as a methyl group, an ethyl group, a propyl group, an isopropyl group, a butyl group, an isobutyl group, a sec-butyl group, a tert-butyl group, a pentyl group, a hexyl group, a heptyl group, an octyl group, a 2-ethylhexyl group, a nonyl group, a decyl group, an undecyl group and a dodecyl group, and a C3-C12 saturated cyclic hydrocarbon group such as a cyclohexyl group, an adamantyl group, a 2-alkyl-2-adamantyl group, a 1-(1-adamantyl)-1-alkyl group and an isobornyl group.

Examples of the C1-C17 divalent saturated hydrocarbon group include a C1-C17 alkanediyl group such as a methylene group, an ethylene group, a propane-1,3-diyl group, a butane-1,4-diyl group, a pentane-1,5-diyl group, a hexane-1,6-diyl group, a heptane-1,7-diyl group, an octane-1,8-diyl group, a nonane-1,9-diyl group, a decane-1,10-diyl group, a undecane-1,11-diyl group, a dodecane-1,12-diyl group, a tridecane-1,13-diyl group, a tetradecane-1,14-diyl group, a pentadecane-1,15-diyl group, a hexadecane-1,16-diyl group and a heptadecane-1,17-diyl group.

Examples of the C1-C12 aliphatic hydrocarbon group include a methyl group, an ethyl group, a propyl group, an isopropyl group, a butyl group, an isobutyl group, a sec-butyl group, a tert-butyl group, a pentyl group, a hexyl group, a heptyl group, an octyl group, a 2-ethylhexyl group, a nonyl group, a decyl group, an undecyl group and a dodecyl group. Examples of the C3-C18 saturated cyclic hydrocarbon group include a cyclopropyl group, a cyclobutyl group, a cyclopentyl group, a cyclohexyl group, a cycloheptyl group, a cyclooctyl group, a cyclononyl group, a cyclodecyl group, a norbornyl group, a 1-adamantyl group, a 2-adamantyl group, an isobornyl group and the following groups:

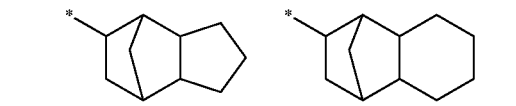

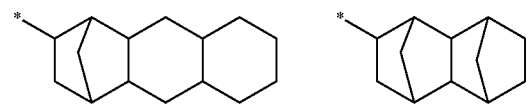

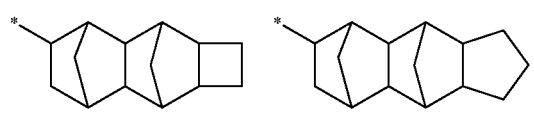

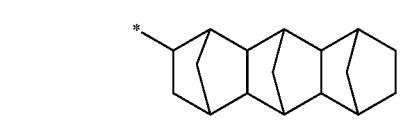

Examples of the C6-C18 aromatic hydrocarbon group include a phenyl group, a naphthyl group, an anthryl group, a p-methylphenyl group, a p-tert-butylphenyl group and a p-adamantylphenyl group.

Examples of the monomer represented by the formula (a1-4) include the followings.
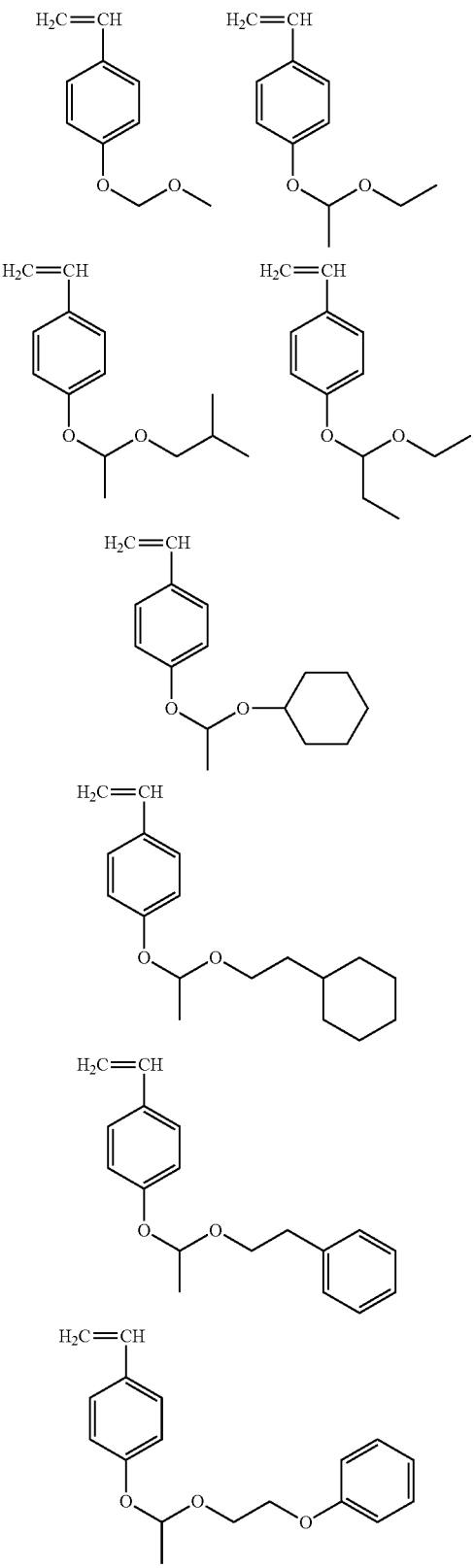
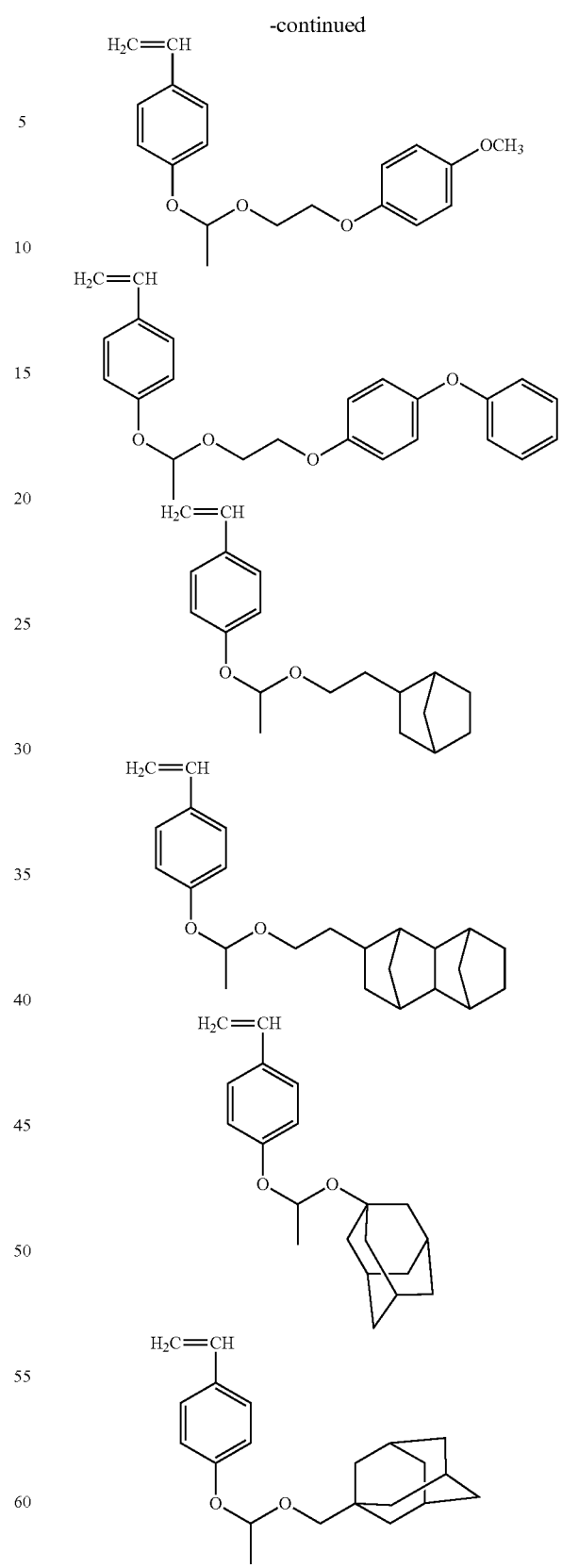
The content of the structural unit derived from a compound having an acid-labile group in Resin (I) is usually 5 to 90% by mole, preferably 10 to 85% by mole and more preferably 15 to 70% by mole based on 100% by mole of all the structural units of Resin (I). When Resin contains the structural unit represented by the formula (II), the content of the structural unit represented by the formula (II) is preferably 5 to 90% by mole and more preferably 10 to 60% by mole based on 100% by mole of all the structural units of Resin (I).

Resin (I) can have two or more kinds of structural units derived from each compound having an acid-labile group.

Resin (I) preferably contains the structural unit derived from the compound having an acid-labile group and a structural unit derived from the compound having no acid-labile group. The resin can have two or more kinds of structural units derived from each compound having no acid-labile group.

The compound having no acid-labile group preferably contains one or more hydroxyl groups or a lactone ring. When Resin (I) contains the structural unit derived from the compound having no acid-labile group and having one or more hydroxyl groups or a lactone ring, a photoresist composition having good resolution and adhesiveness of photoresist to a substrate tends to be obtained.

When the photoresist composition of the present invention is used for KrF excimer laser (wavelength: 248 nm) lithography, EUV lithography and EB lithography, Resin (I) preferably contains a structural unit represented by the formula (VI):

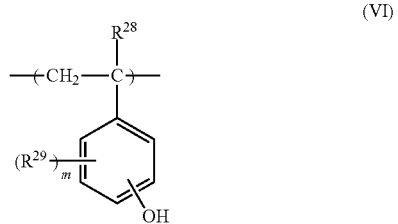

(VI)

wherein $R^{28}$ represents a hydrogen atom, a halogen atom, a C1-C6 alkyl group or a C1-C6 halogenated alkyl group, $R^{29}$ is independently in each occurrence a halogen atom, a hydroxyl group, a cyano group, a C1-C12 alkyl group, a C1-C12 hydroxy-containing alkyl group, a C1-C12 alkoxy group, a C6-C12 aryl group, a C7-C13 aralkyl group, a glycidyloxy group, a C2-C4 acyl group, a C2-C4 acyloxy group, an acryloyl group or a methacryloyl group, m represents an integer of 0 to 4.

When the photoresist composition of the present invention is used for ArF excimer laser (wavelength: 193 nm) lithography, Resin (I) preferably contains a structural unit represented by the formula (VII):

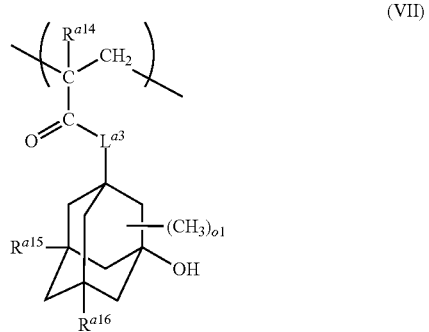

(VII)

wherein $R^{a14}$ represents a hydrogen atom or a methyl group, $R^{a15}$ and $R^{a16}$ independently represent a hydrogen atom, a methyl group or a hydroxyl group, $L^{a3}$ represents *—O— or *—O—$(CH_2)_y$—CO—O— in which * represents a binding position to —CO—, and y represents an integer of 1 to 6, and o1 represents an integer of 0 to 10.

The structural unit represented by the formula (VI) is derived from a monomer represented by the formula (a2-0):

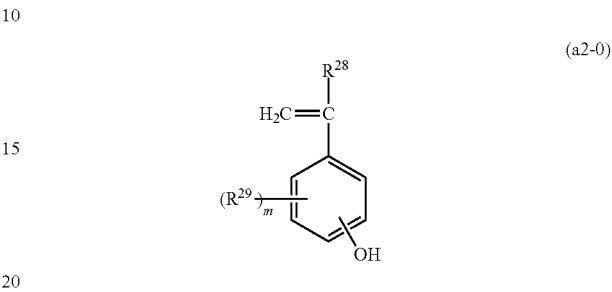

(a2-0)

wherein $R^{28}$, $R^{29}$ and m are the same as defined above.

The structural unit represented by the formula (VI) is derived from a monomer represented by the formula (a2-1):

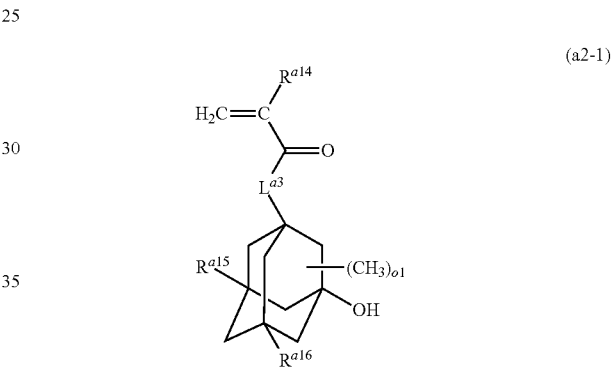

(a2-1)

wherein $R^{a14}$, $R^{a15}$, $R^{a16}$, $L^{a3}$ and o1 are the same as defined above.

In the formula (a2-0), examples of the halogen atom include a fluorine atom, examples of the C1-C6 alkyl group include a methyl group, an ethyl group, a propyl group, an isopropyl group, a butyl group, an isobutyl group, a sec-butyl group, a tert-butyl group, a pentyl group and a hexyl group, and a C1-C4 alkyl group is preferable and a C1-C2 alkyl group is more preferable and a methyl group is especially preferable. Examples of the C1-C6 halogenated alkyl group include a trifluoromethyl group, a pentafluoroethyl group, a heptafluoropropyl group, a heptafluoroisopropyl group, a nonafluorobutyl group, a nonafluoro-sec-butyl group, a nonafluoro-tert-butyl group, a perfluoropentyl group and a perfluorohexyl group. Examples of the C1-C6 alkoxy group include a methoxy group, an ethoxy group, a propoxy group, an isopropoxy group, a butoxy group, an isobutoxy group, a sec-butoxy group, a tert-butoxy group, a pentyloxy group and a hexyloxy group, and a C1-C4 alkoxy group is preferable and a C1-C2 alkoxy group is more preferable and a methoxy group is especially preferable. Examples of the C2-C4 acyl group include an acetyl group, a propionyl group and a butyryl group, and examples of the C2-C4 acyloxy group include an acetyloxy group, a propionyloxy group and a butyryloxy group. In the formula (a2-0), ma is preferably 0, 1 or 2, and is more preferably 0 or 1, and especially preferably 0.

Resin (I) containing the structural unit derived from the monomer represented by the formula (a2-0) can be produced, for example, by polymerizing a monomer obtained by protecting a hydroxyl group of the monomer represented by the formula (a2-0) with an acetyl group with other monomers followed by conducting deacetylation of the obtained polymer with a base.

Examples of the monomer represented by the formula (a2-0) include the followings.

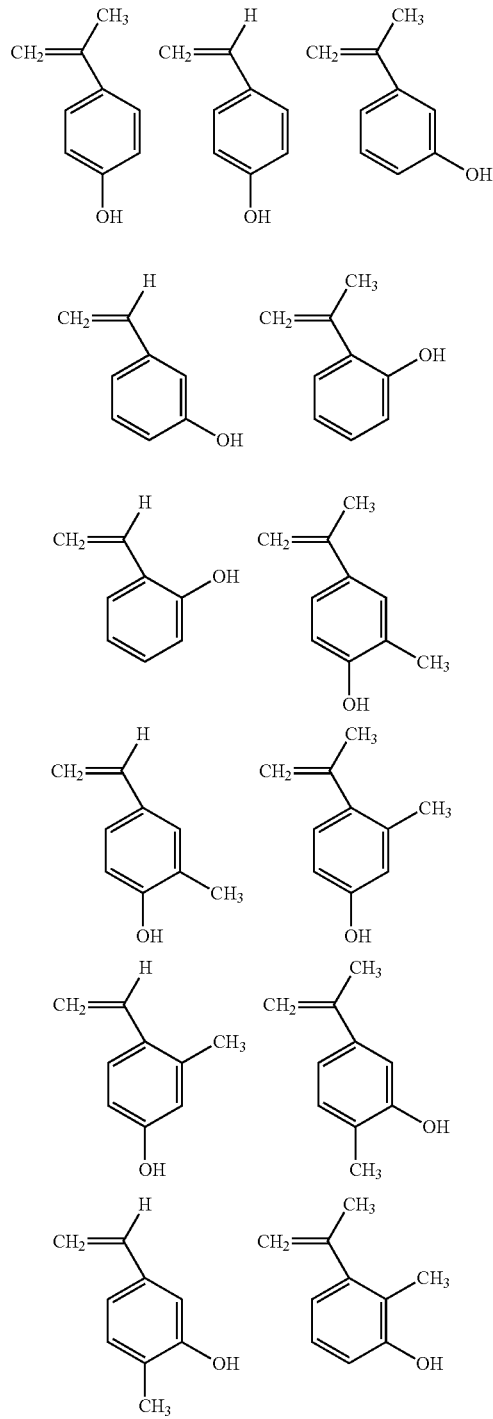

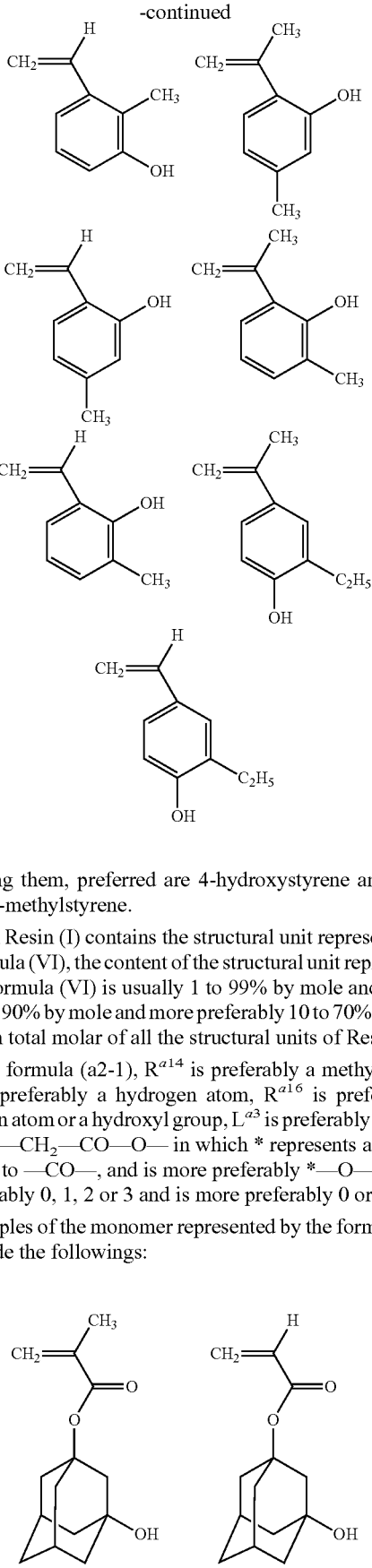

Among them, preferred are 4-hydroxystyrene and 4-hydroxy-α-methylstyrene.

When Resin (I) contains the structural unit represented by the formula (VI), the content of the structural unit represented by the formula (VI) is usually 1 to 99% by mole and preferably 5 to 90% by mole and more preferably 10 to 70% by mole based on total molar of all the structural units of Resin (I).

In the formula (a2-1), $R^{a14}$ is preferably a methyl group, $R^{a15}$ is preferably a hydrogen atom, $R^{a16}$ is preferably a hydrogen atom or a hydroxyl group, $L^{a3}$ is preferably *—O— or *—O—CH$_2$—CO—O— in which * represents a binding position to —CO—, and is more preferably *—O—, and o1 is preferably 0, 1, 2 or 3 and is more preferably 0 or 1.

Examples of the monomer represented by the formula (a2-1) include the followings:

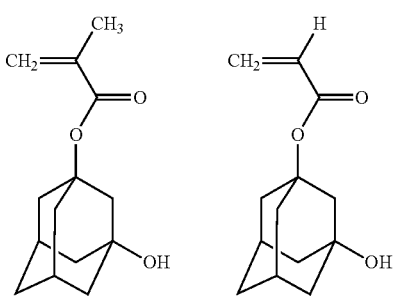

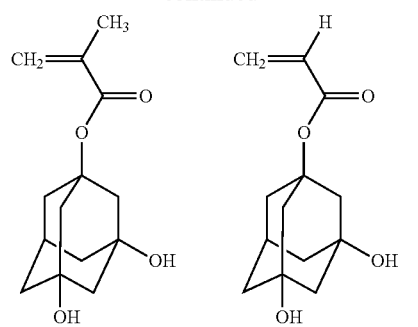
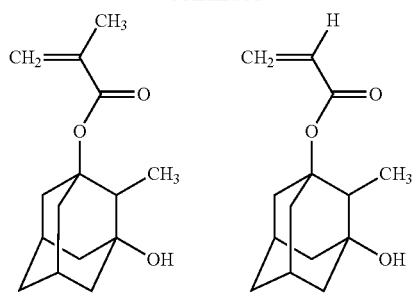
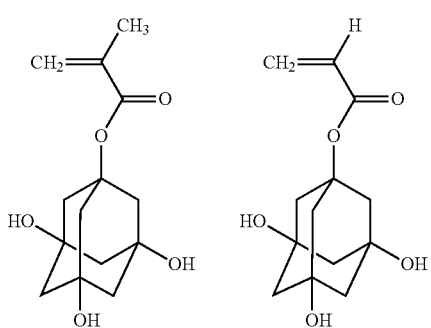
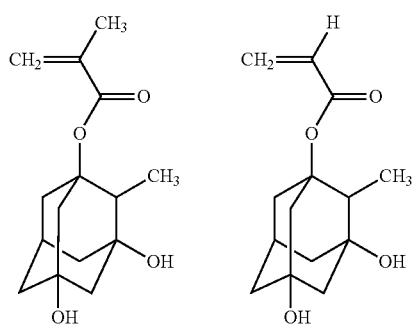
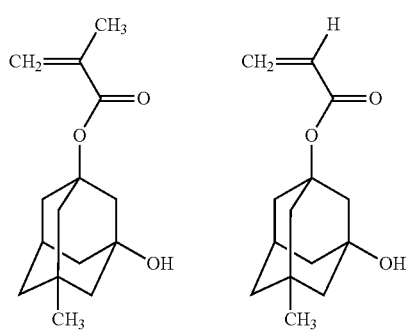
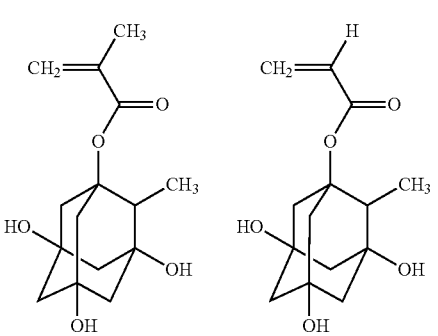
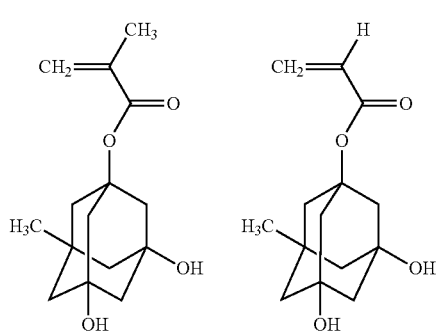
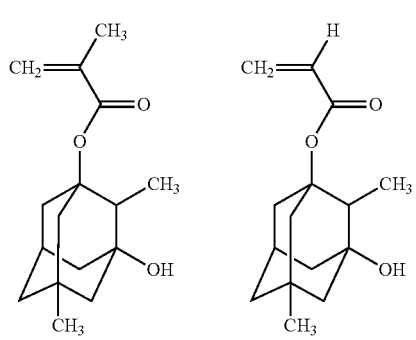
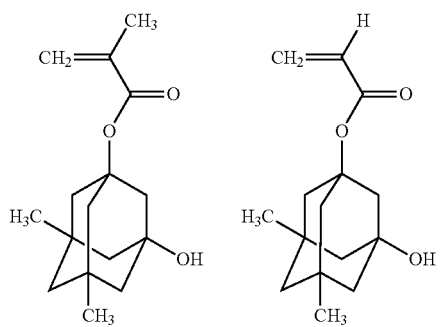
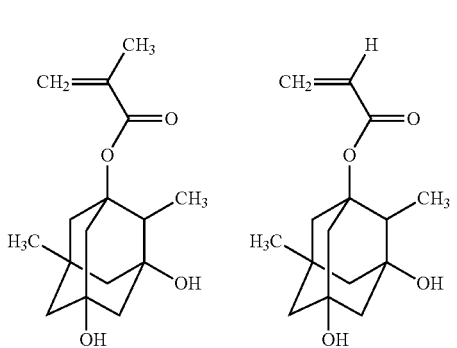

51
-continued
52
-continued
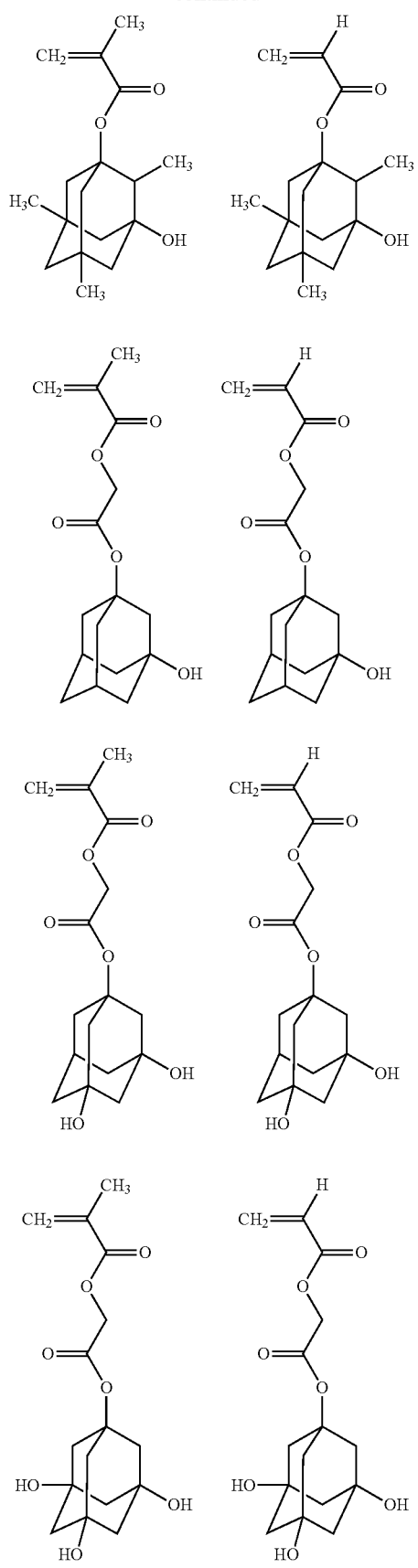
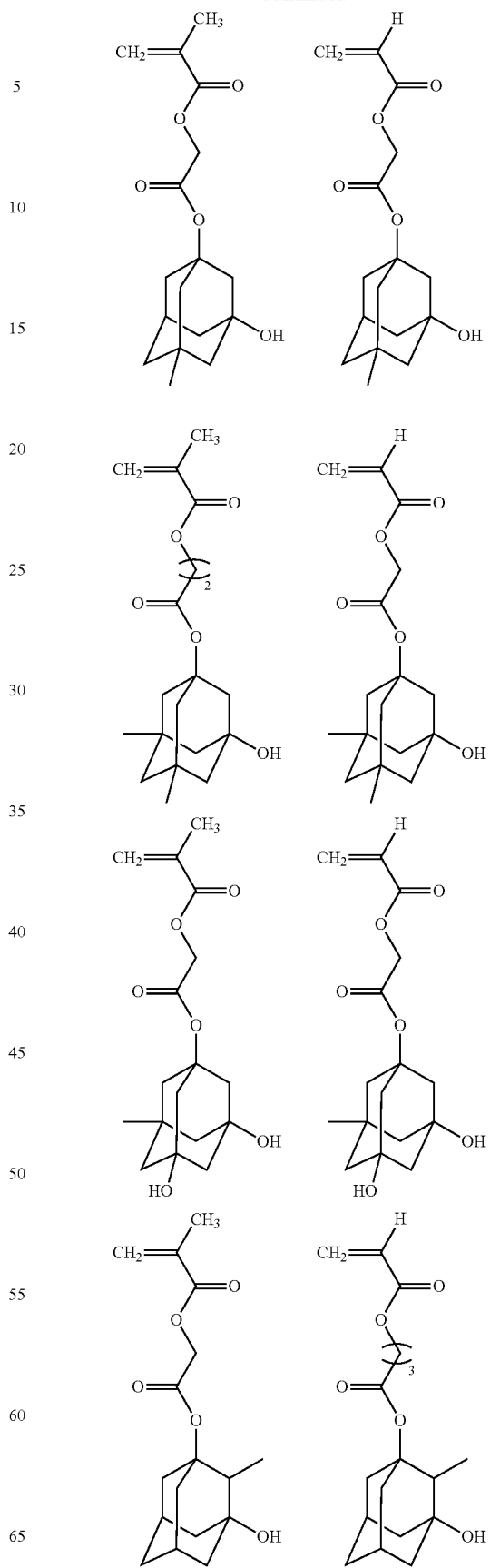

-continued

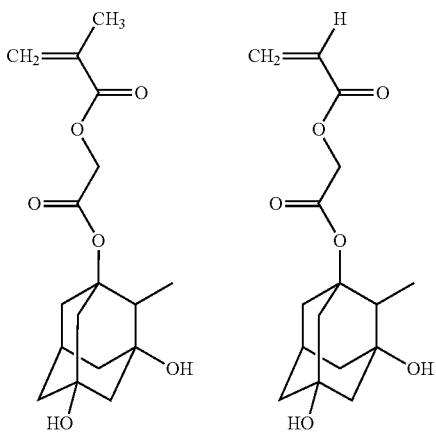

Among them, preferred are 3-hydroxy-1-adamantyl acrylate, 3-hydroxy-1-adamantyl methacrylate, 3,5-dihydroxy-1-adamantyl acrylate, 3,5-dihydroxy-1-adamantyl methacrylate, 1-(3,5-dihydroxy-1-adamantyloxycarbonyl)methyl acrylate and 1-(3,5-dihydroxy-1-adamantyloxycarbonyl)methyl methacrylate, and more preferred are 3-hydroxy-1-adamantyl methacrylate and 3,5-dihydroxy-1-adamantyl methacrylate.

When Resin (I) contains the structural unit represented by the formula (VII), the content of the structural unit represented by the formula (VII) is usually 1 to 50% by mole and preferably 1 to 30% by mole and more preferably 1 to 20% by mole based on total molar of all the structural units of Resin (I).

Examples of the lactone ring of the compound having a lactone ring and no acid-labile group include a monocyclic lactone ring such as β-propiolactone ring, γ-butyrolactone ring and γ-valerolactone ring, and a condensed ring formed from a monocyclic lactone ring and the other ring. Among them, preferred are γ-butyrolactone ring and a condensed lactone ring formed from γ-butyrolactone ring and the other ring.

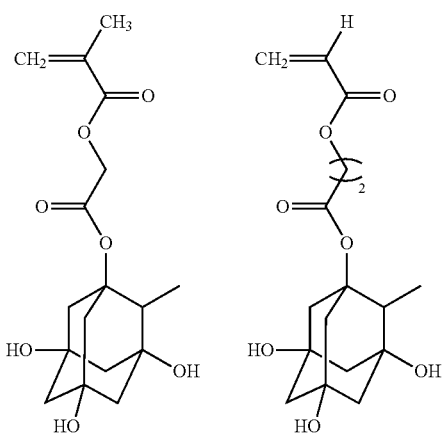

Preferable examples of the monomer having a lactone ring and no acid-labile group include the monomers represented by the formulae (a3-1), (a3-2) and (a3-3):

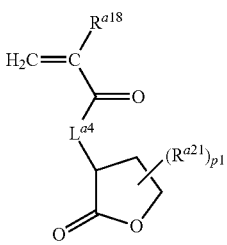
(a3-1)

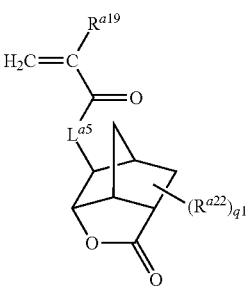
(a3-2)

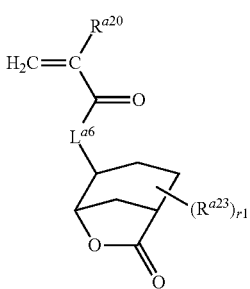
(a3-3)

wherein $L^{a4}$, $L^{a5}$ and $L^{a6}$ independently represent *—O— or *—O—$(CH_2)_z$—CO—O— in which * represents a binding position to —CO— and z represents an integer of 1 to 6, $R^{a18}$, $R^{a19}$ and $R^{a20}$ independently represent a hydrogen atom or a methyl group, $R^{a21}$ represents a C1-C4 aliphatic hydrocarbon group, $R^{a22}$ and $R^{a23}$ are independently in each occurrence a carboxyl group, a cyano group or a C1-C4 aliphatic hydrocarbon group, and p1 represents an integer of 0 to 5, q1 and r1 independently represent an integer of 0 to 3.

Examples of $L^{a4}$, $L^{a5}$ and $L^{a6}$ include the same as described in $L^{a3}$. It is preferred that $L^{a4}$, $L^{a5}$ and $L^{a6}$ each independently represent *—O— or *—O—$CH_2$—CO—O— in which * represents a binding position to —CO—, and it is more preferred that $L^{a4}$, $L^{a5}$ and $L^{a6}$ are *—O—. $R^{a18}$, $R^{a19}$ and $R^{a20}$ are preferably methyl groups. $R^{a21}$ is preferably a methyl group. It is preferred that $R^{a22}$ and $R^{a23}$ are independently in each occurrence a carboxyl group, a cyano group or a methyl group. It is preferred that p1 is an integer of 0 to 2, and it is more preferred that p1 is 0 or 1. It is preferred that q1 and r1 independently each represent an integer of 0 to 2, and it is more preferred that q1 and r1 independently represent 0 or 1.

Examples of the monomer represented by the formula (a3-1) include the followings.
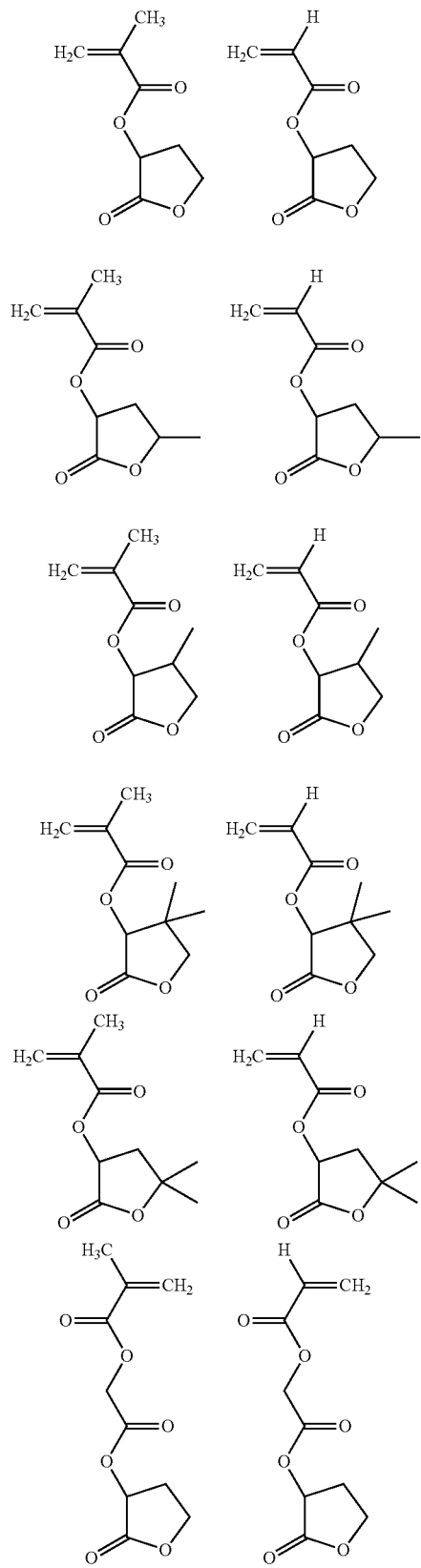
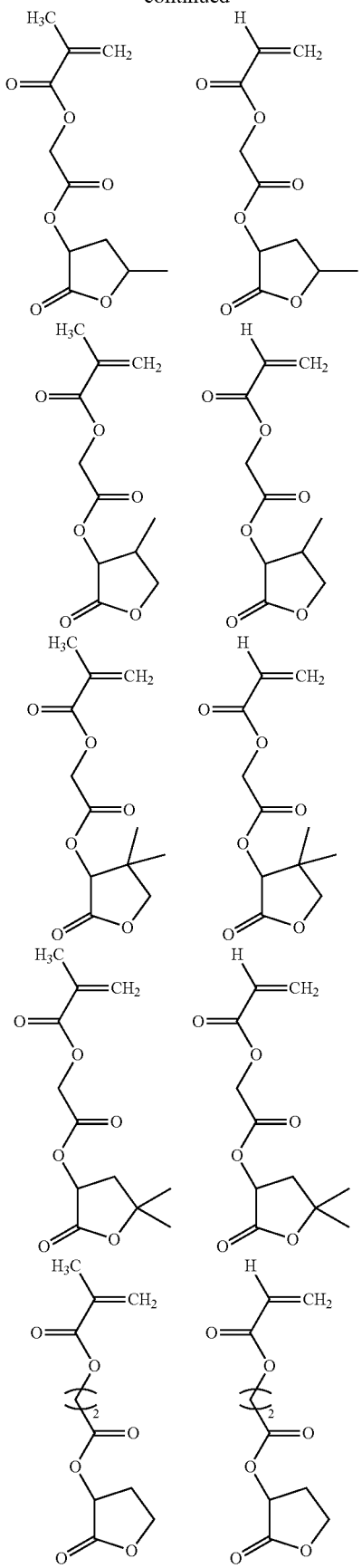

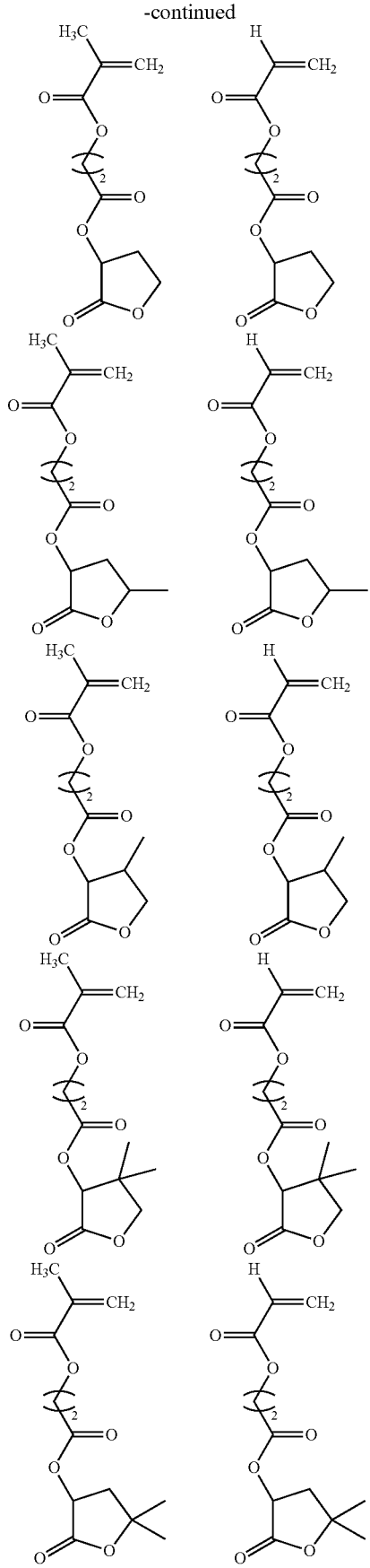
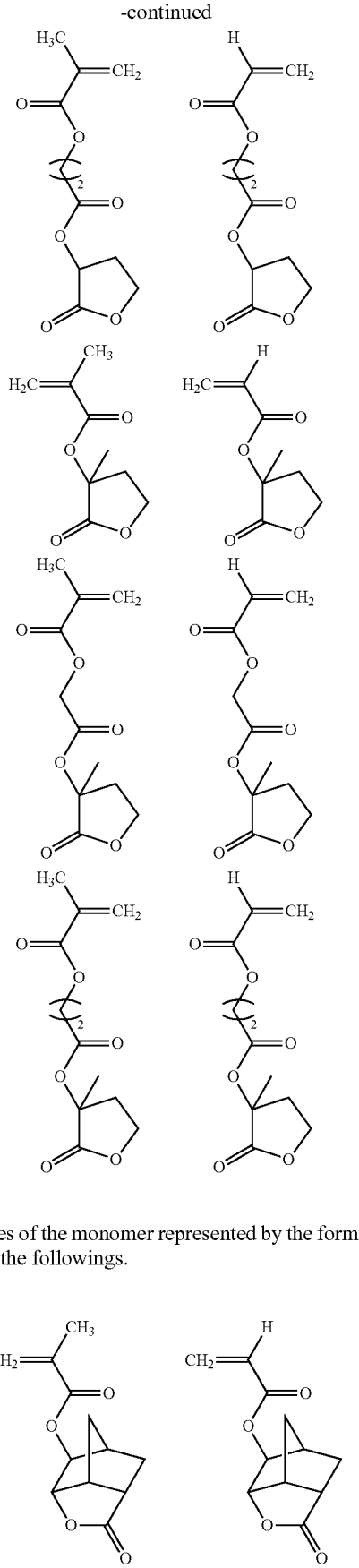
Examples of the monomer represented by the formula (a3-2) include the followings.
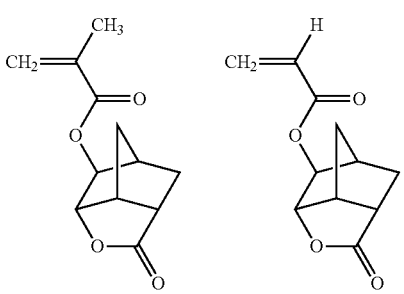

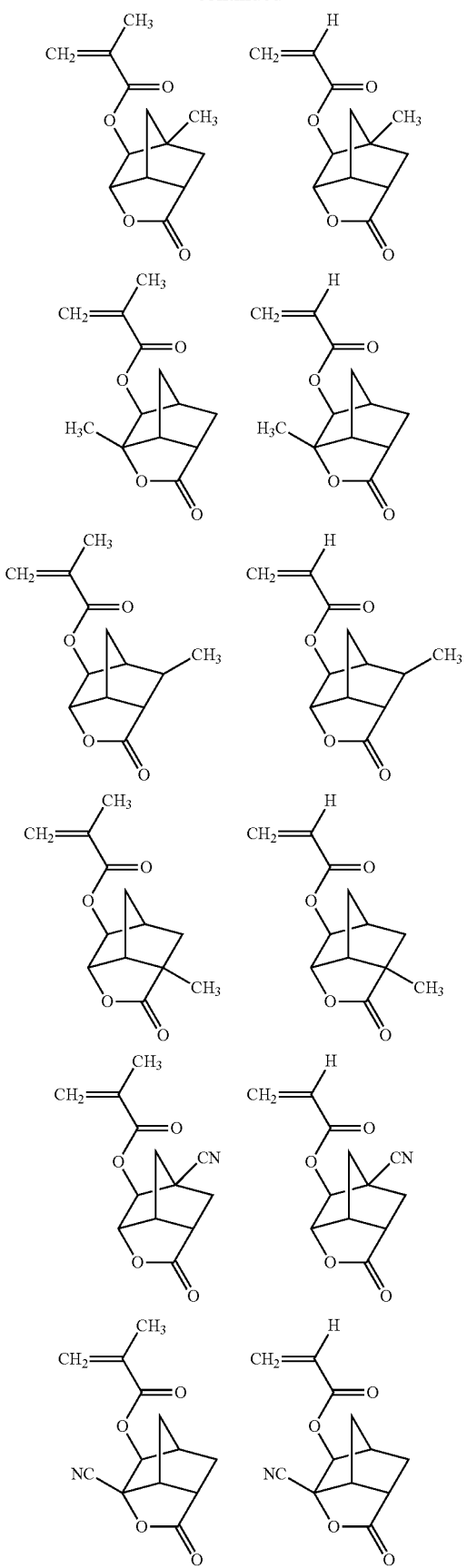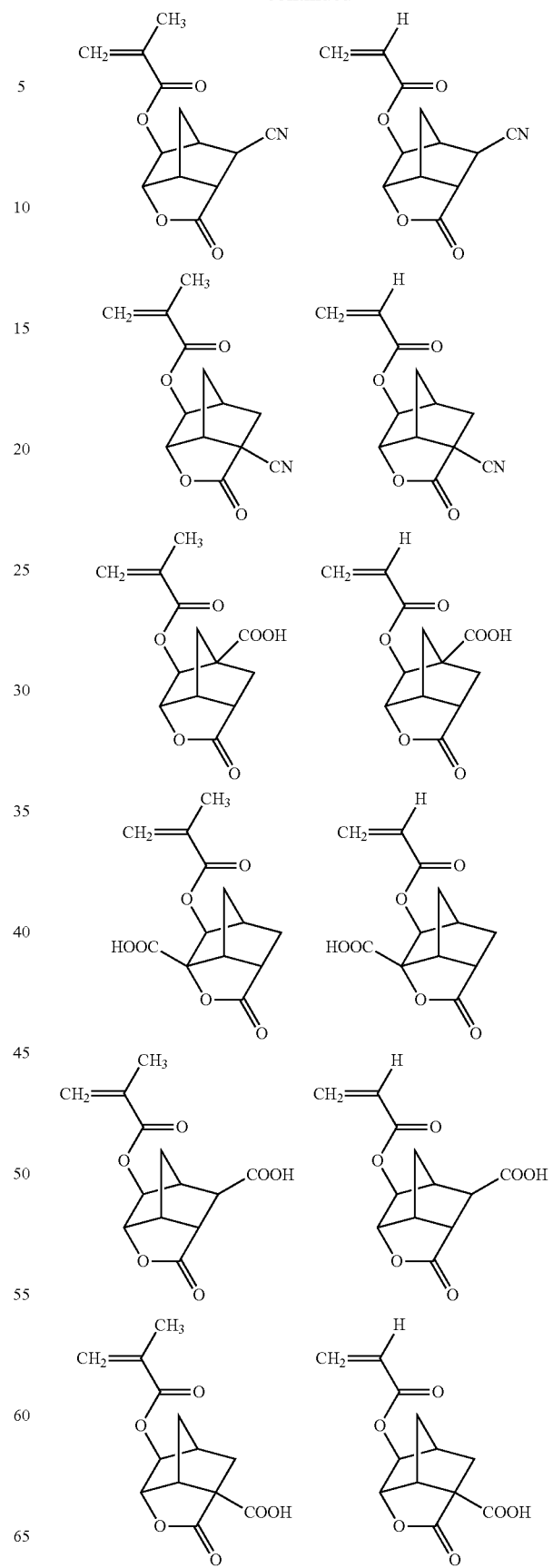

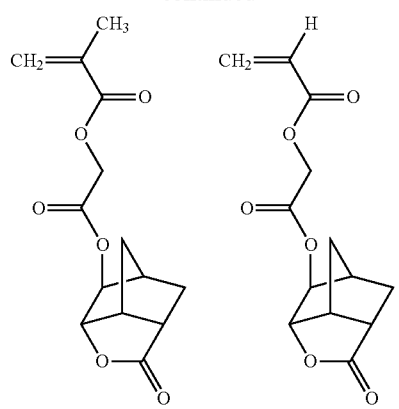
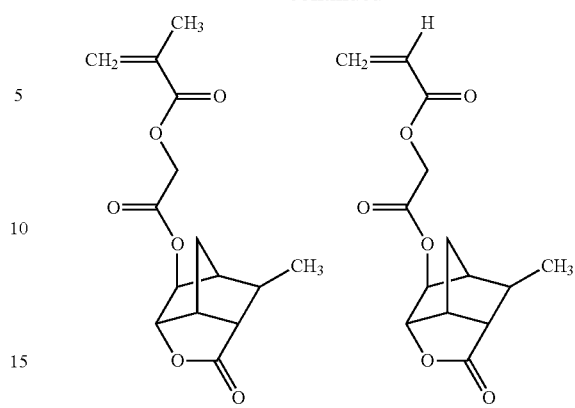
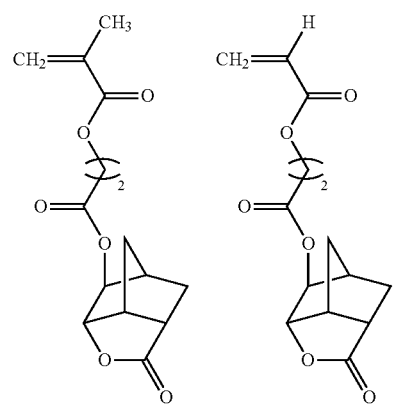
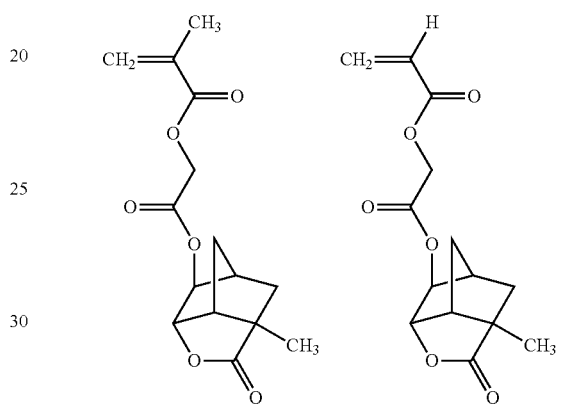
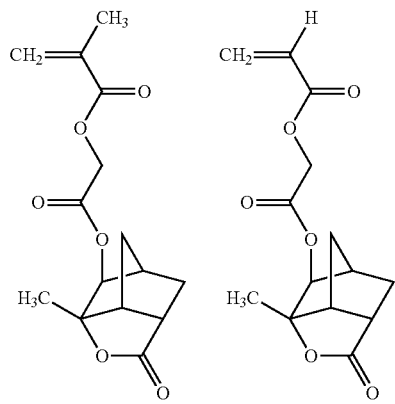
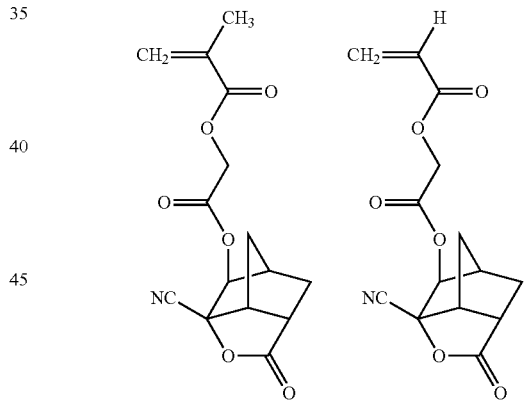
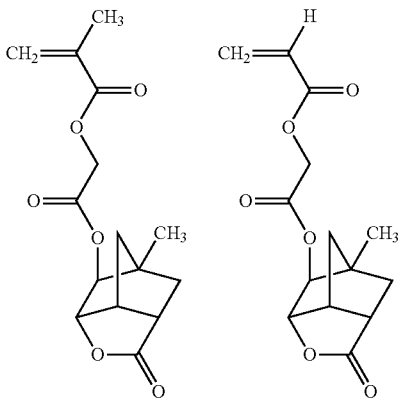
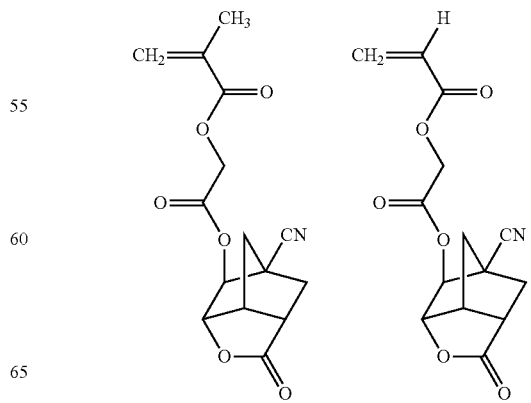

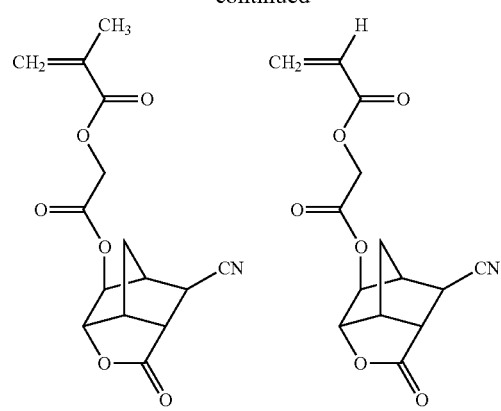
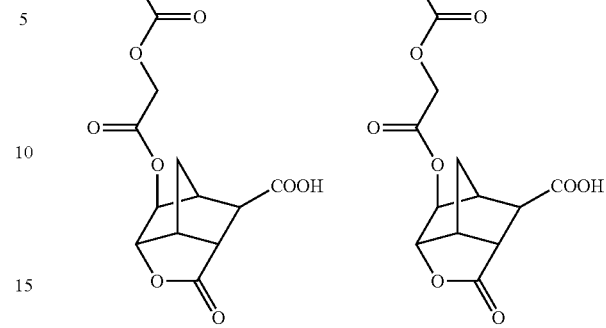
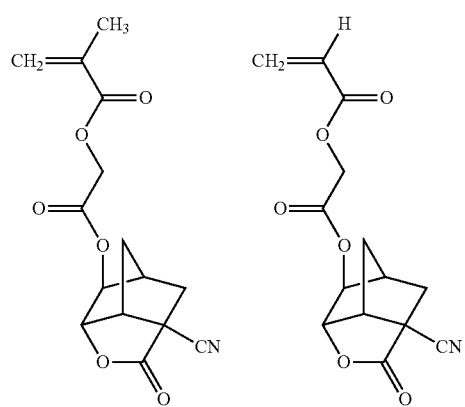
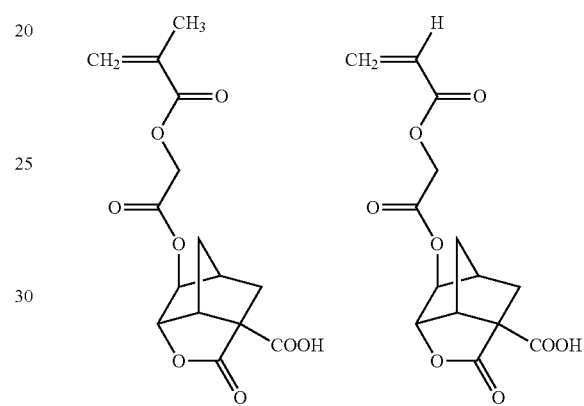
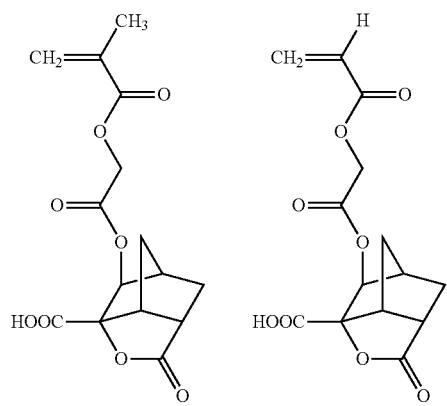
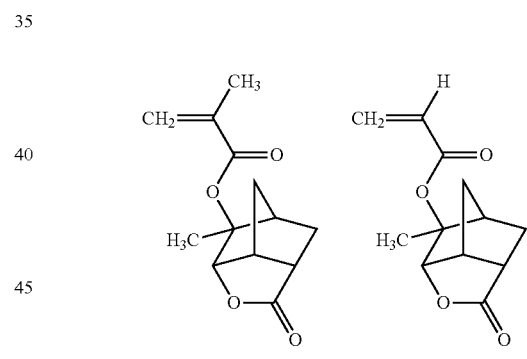
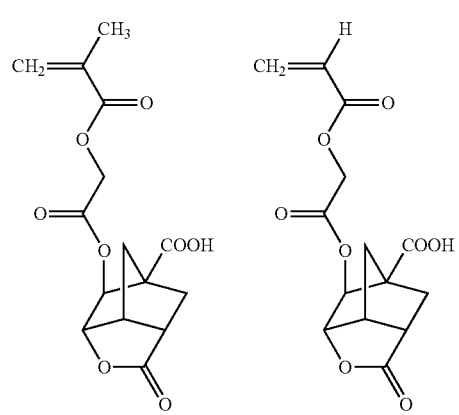
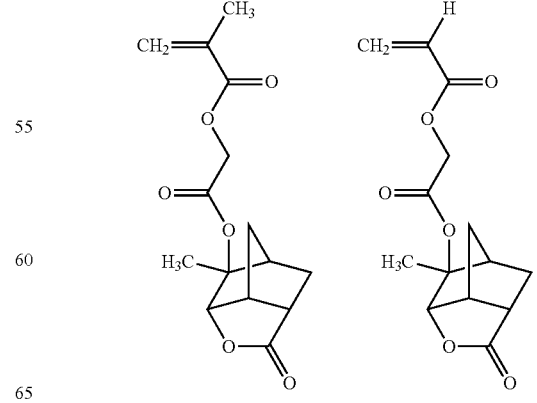

Examples of the monomer represented by the formula (a3-3) include the followings.
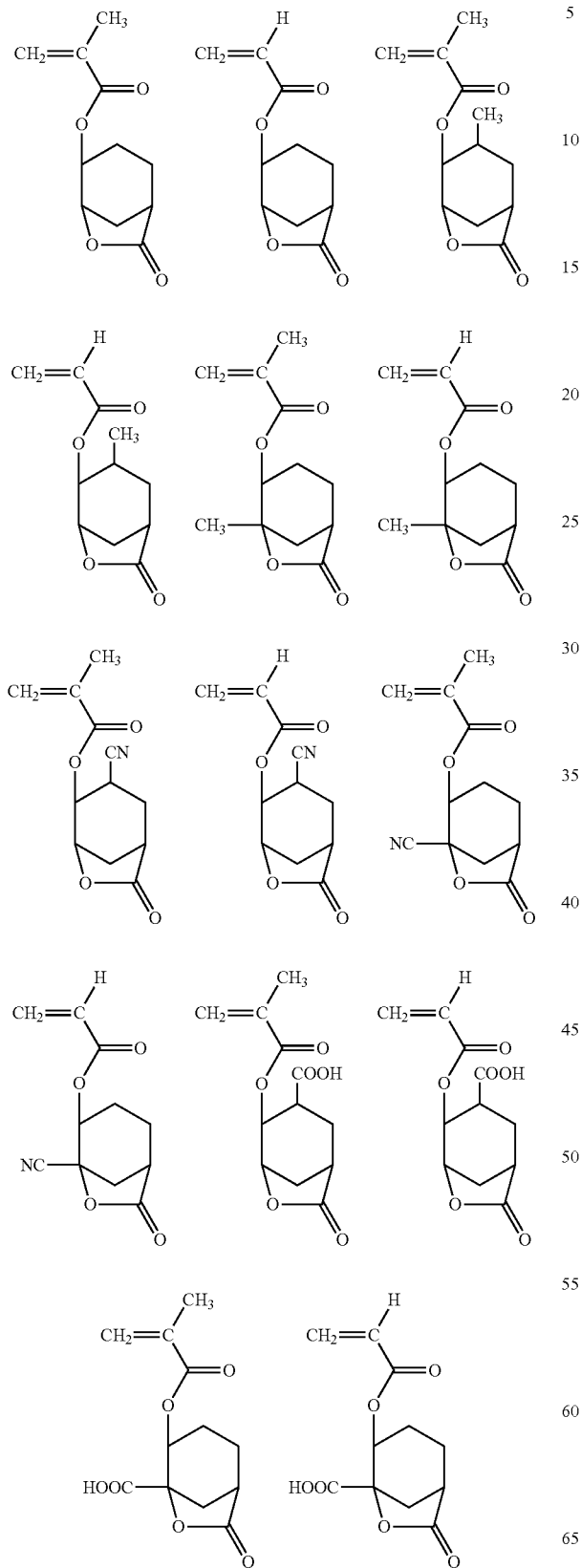
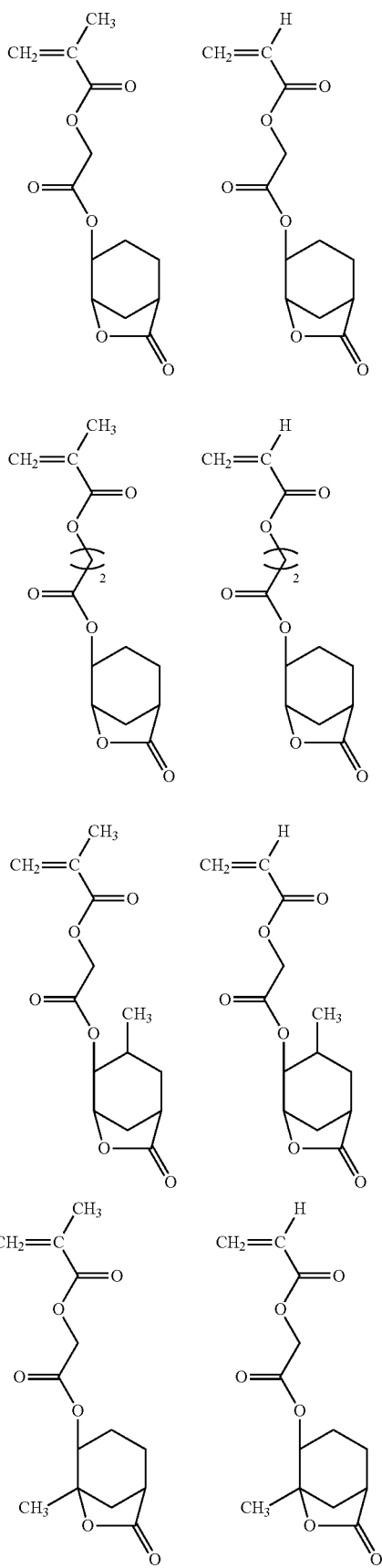

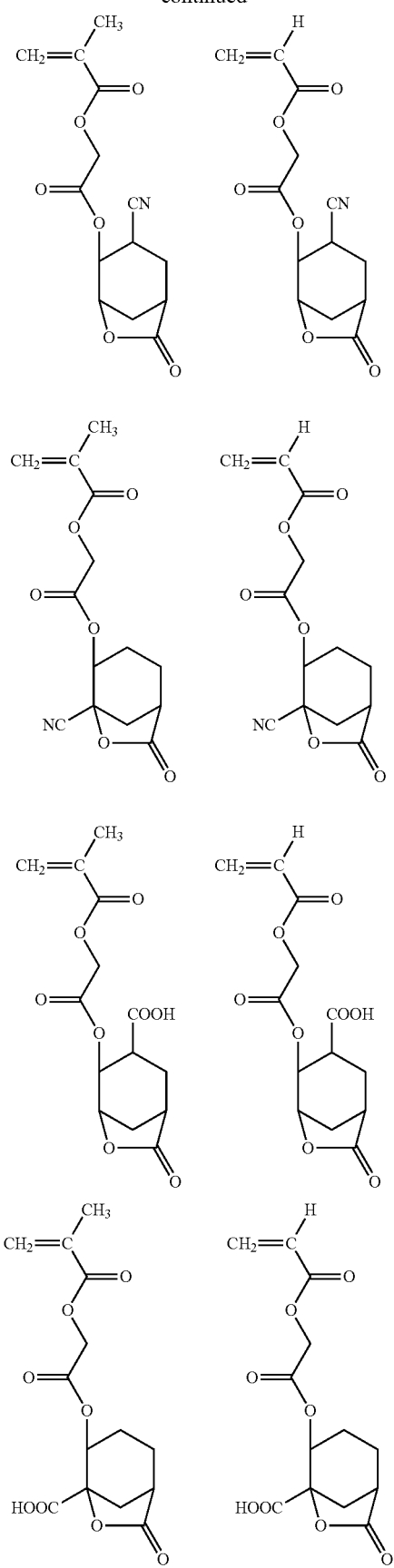
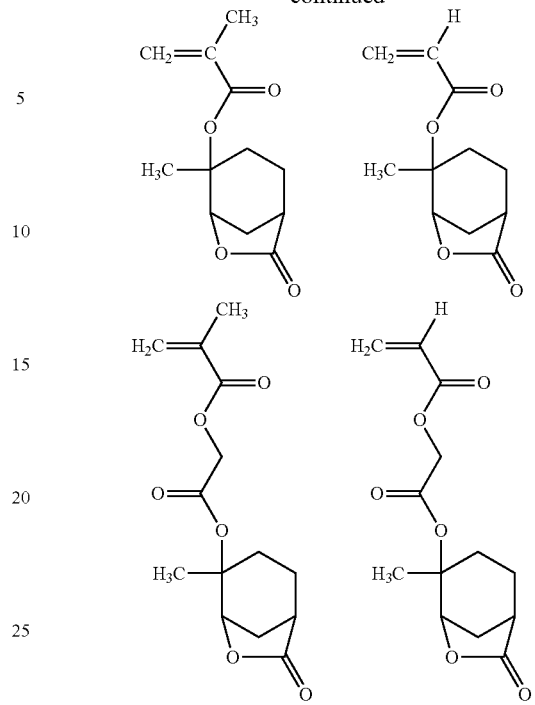

Among them, preferred are 5-oxo-4-oxatricyclo[4.2.1.0$^{3,7}$]nonan-2-yl acrylate, 5-oxo-4-oxatricyclo[4.2.1.0$^{3,7}$]nonan-2-yl methacrylate, tetrahydro-2-oxo-3-furyl acrylate, tetrahydro-2-oxo-3-furyl methacrylate, 2-(5-oxo-4-oxatricyclo[4.2.1.0$^{3,7}$]nonan-2-yloxy)-2-oxoethyl acrylate and 2-(5-oxo-4-oxatricyclo[4.2.1.0$^{3,7}$]nonan-2-yloxy)-2-oxoethyl methacrylate, and more preferred are 5-oxo-4-oxatricyclo[4.2.1.0$^{3,7}$]nonan-2-yl methacrylate, tetrahydro-2-oxo-3-furyl methacrylate and 2-(5-oxo-4-oxatricyclo[4.2.1.0$^{3,7}$]nonan-2-yloxy)-2-oxoethyl methacrylate.

Resin (I) preferably comprises the structural unit represented by the formula (VIII):

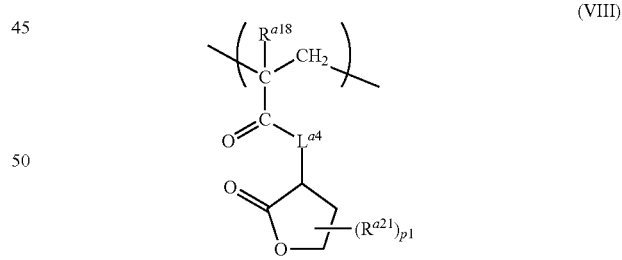

(VIII)

wherein $R^{a18}$, $R^{a21}$, $L^{a4}$ and p1 are the same as defined above, which is derived from the monomer represented by the formulae (a3-1).

When Resin (I) contains the structural unit derived from the monomer having a lactone ring and no acid-labile group, the content thereof is usually 1 to 50% by mole and preferably 1 to 30% by mole and more preferably 1 to 20% by mole based on total molar of all the structural units of the resin.

Resin (I) can contain a structural unit derived from a monomer having an acid labile group containing a lactone ring. Examples of the monomer having an acid labile group containing a lactone ring include the followings.

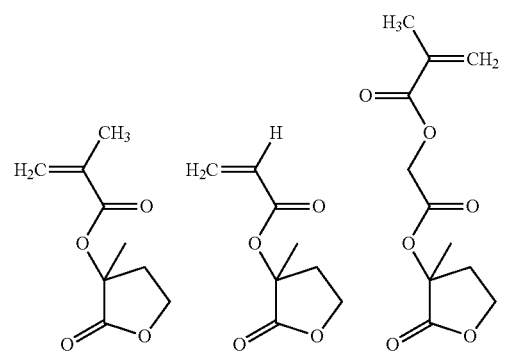
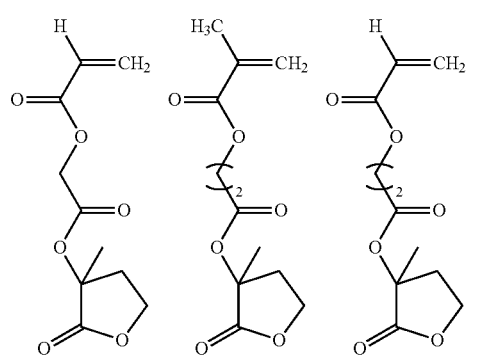
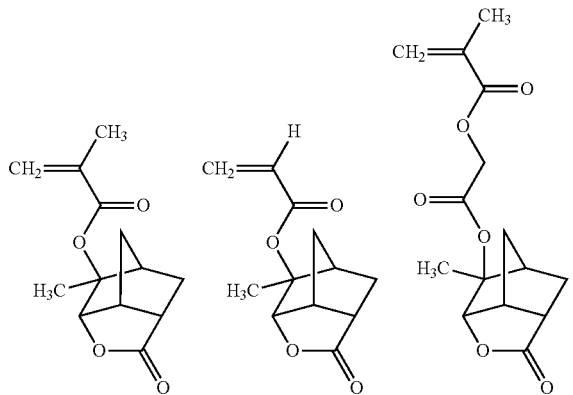
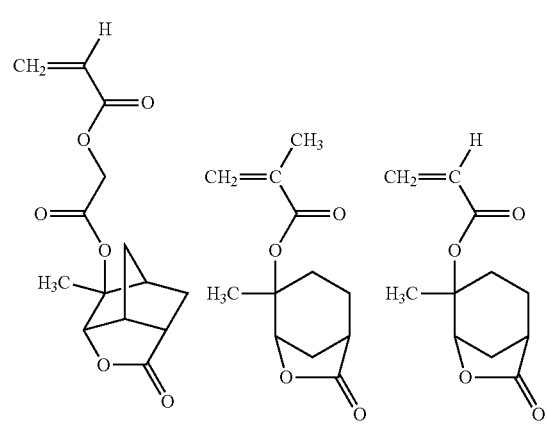
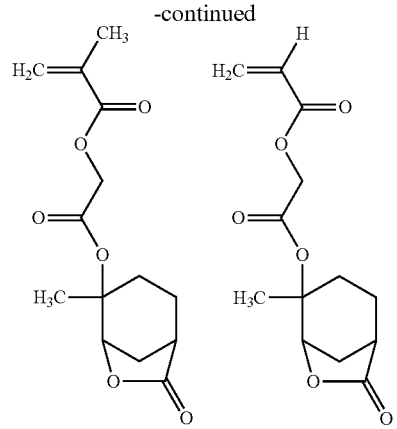

Resin (I) can be produced according to known polymerization methods such as radical polymerization.

Resin (I) preferably has 500 to 100,000 of the weight-average molecular weight, and preferably 1,000 to 30,000 of the weight-average molecular weigh. The weight-average molecular weight can be measured with gel permeation chromatography.

The photoresist composition of the present invention can contain one or more resins other than Resin (I), and examples of the resin other than Resin (I) include a resin comprising one or more structural units described above and no structural unit represented by the formula (I). The resin other than Resin (I) preferably becomes soluble in an alkali aqueous solution by the action of an acid. The resin other than Resin (I) preferably comprises the structural unit represented by the formula (II) or (VI), and more preferably comprises the structural units represented by the formulae (II) and (VI). When the photoresist composition of the present invention contains one or more resins other than Resin (I), the ratio of the resin other than Resin (I) to Resin (I) (resin other than Resin (I)/Resin (I)) is usually 10/1 to 1/10 and preferably 3/1 to 1/3.

The photoresist composition of the present invention usually includes 80% by weight or more of Resin (I) based on sum of solid component. In this specification, "solid component" means components other than solvent in the photoresist composition.

When the photoresist composition of the present invention contains a solvent, the ratio of Resin (I) to the solvent (Resin (I)/solvent) is usually 1/1 to 1/1,000 and preferably 1/50 to 1/500.

Next, Compound (D') will be illustrated.
Compound (D') is represented by the formula (D'):

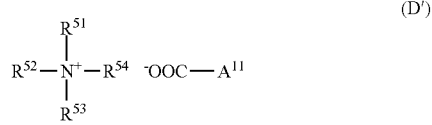

(D')

wherein $R^{51}$, $R^{52}$, $R^{53}$ and $R^{54}$ independently represent a C1-C20 alkyl group which may have one or more substituents, a C3-C30 saturated cyclic hydrocarbon group which may have one or more substituents or a C2-C20 alkenyl group which may have one or more substituents and $A^{11}$ represents a C1-C36 saturated cyclic hydrocarbon group which may have one or more substituents and which may contain one or more heteroatoms.

Examples of the C1-C20 alkyl group include a linear chain alkyl group and a branched chain alkyl group, and specific examples thereof include a methyl group, an ethyl group, a propyl group, an isopropyl group, a butyl group, an isobutyl group, a sec-butyl group, a tert-butyl group, a pentyl group, an isopentyl group, a tert-pentyl group, a neopentyl group, a 1,2-dimethylpropyl group, a 1-ethylpropyl group, a hexyl group, a heptyl group, an octyl group, a nonyl group, a decyl group, an undecyl group, a dodecyl group, a tridecyl group, a tetradecyl group, a pentadecyl group, a hexadecyl group, a heptadecyl group, an octadecyl group, a nonadecyl group, an isocyl group, a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group and a 4-methylpentyl group, and a C1-C15 linear chain alkyl group and a C3-C15 branched chain alkyl group are preferable, and a C1-C10 linear chain alkyl group and a C3-C10 branched chain alkyl group are more preferable.

Examples of the C3-C30 saturated cyclic hydrocarbon group include an adamantyl group, a norbornyl group, an isobornyl group, a tricyclodecyl group and a tetracyclodecyl group. The saturated cyclic hydrocarbon group preferably has 5 to 30 carbon atoms, more preferably 5 to 20 carbon atoms, much more preferably 6 to 15 carbon atoms and especially preferably 6 to 12 carbon atoms.

The alkenyl group preferably has 2 to 5 carbon atoms, and alkenyl group formed by combining the above-mentioned alkyl group with a vinyl group (—CH=CH$_2$) is more preferable.

The C1-C20 alkyl group, the C3-C30 saturated cyclic hydrocarbon group and the C2-C20 alkenyl group may have one or more substituents. Examples of the substituents include a halogen atom, a halogenated alkyl group such as a C1-C20 halogenated alkyl group, an alkyl group such as a C1-C20 alkyl group, an alkoxy group, a hydroxyalkoxy group, an alkoxyalkoxy group, an alkoxycarbonyloxy group, an alkoxycarbonylalkoxy group, an alkoxycarbonyl group, an aryl group, a heteroaryl group and an aralkyl group. Examples of the halogen atom include a fluorine atom, a chlorine atom, a bromine atom and an iodine atom, and a fluorine atom is preferable. As the halogenated alkyl group, a fluorinated alkyl group is preferable. Examples of the alkyl group include the same as described above. Examples of aryl group include a phenyl group, a biphenyl group, a fluorenyl group, a naphthyl group, an anthryl group and a phenanthryl group. Examples of the heteroaryl group include the above-mentioned aryl groups in which one or more carbon atoms composed of the aromatic ring are replaced by a heteroatom such as an oxygen atom, a sulfur atom and a nitrogen atom. Examples of the aralkyl group include a benzyl group, a phenethyl group, a 1-naphthylmethyl group, a 2-naphthylmethyl group, a 1-naphthylethyl group and a 2-naphthylethyl group. As the aralkyl group, an aryl-substituted C1-C4 alkyl group is preferable, and an aryl-substituted C1-C2 alkyl group is more preferable, and an aryl-substituted methyl group is especially preferable. The aryl group, the heteroaryl group and the aralkyl group can have one or more substituents such as a C1-C10 alkyl group, a halogenated alkyl group (e.g. a C1-C8 halogenated alkyl group, preferably a C1-C4 halogenated alkyl group), an alkoxy group, a hydroxyl group and a halogen atom.

It is preferred that $R^{51}$, $R^{52}$, $R^{53}$ and $R^{54}$ independently represent a linear chain alkyl group, a linear chain alkenyl group or a saturated cyclic hydrocarbon group, and it is more preferred that $R^{51}$, $R^{52}$, $R^{53}$ and $R^{54}$ independently represent a linear chain alkyl group. It is preferred that one of $R^{51}$, $R^{52}$, $R^{53}$ and $R^{54}$ represents an alkyl group having 4 or more carbon atoms, and it is more preferred that one of $R^{51}$, $R^{52}$, $R^{53}$ and $R^{54}$ represents a C5-C10 alkyl group, and it is especially preferred that one of $R^{51}$, $R^{52}$, $R^{53}$ and $R^{54}$ represents an alkyl group having 1 to 3 carbon atoms, preferably 1 or 2 carbon atoms, and three of $R^{51}$, $R^{52}$, $R^{53}$ and $R^{54}$ represents an alkyl group having 4 or more carbon atoms.

Examples of the C1-C36 hydrocarbon group represented by $A^{11}$ include a saturated hydrocarbon group, an unsaturated hydrocarbon group, an aromatic hydrocarbon group and an aralkyl group. Examples of the saturated hydrocarbon group include a C1-C20 alkyl group and a C3-C20 saturated cyclic hydrocarbon group which are described in $R^{51}$, $R^{52}$, $R^{53}$ and $R^{54}$. The unsaturated hydrocarbon group preferably has 2 to 5 carbon atoms, more preferably 2 to 4 carbon atoms, and especially has 3 carbon atoms. Examples of the unsaturated hydrocarbon group include a vinyl group, a propenyl group, a butynyl group, a 1-methylpropyl group, and a 2-methylpropenyl group, and a propenyl group is preferable. The aromatic hydrocarbon group preferably has 6 to 36 carbon atoms, more preferably 6 to 30 carbon atoms, much more preferably 6 to 20 carbon atoms, and especially preferably 6 to 15 carbon atoms. Examples of the aromatic hydrocarbon group include an aryl group such as a phenyl group, a biphenyl group, a fluorenyl group, a naphthyl group, an anthryl group and a phenanthryl group. Examples of the aralkyl group include a benzyl group, a phenethyl group, a 1-naphthylmethyl group, a 2-naphthylmethyl group, a 1-naphthylethyl group and a 2-naphthylethyl group. As the aralkyl group, an aryl-substituted C1-C4 alkyl group is preferable, and an aryl-substituted C1-C2 alkyl group is more preferable, and an aryl-substituted methyl group is especially preferable.

The C1-C36 hydrocarbon group can have one or more substituents, and examples of the substituents include an alkyl group, an aryl group, an alkoxy group, a halogen atom, a halogenated alkyl group, a hydroxyl group and an oxo group (=O), and a halogen atom and a hydroxyl group are preferable. The C1-C36 hydrocarbon group can contain one or more heteroatoms such as an oxygen atom, a sulfur atom and a nitrogen atom. Examples of the alkyl group include a C1-C5 alkyl group such as a methyl group, an ethyl group, a propyl group, a butyl group and a tert-butyl group, and examples of the aryl group include the same as described above. Examples of the alkoxy group include a C1-C5 alkoxy group such as a methoxy group, an ethoxy group, a propoxy group, a butoxy group and a tert-butoxy group, and methoxy and ethoxy groups are preferable. Examples of the halogen atom include a fluorine atom, a chlorine atom, a bromine atom and an iodine atom, and a fluorine atom is preferable.

As Compound (D'), a compound represented by the formula (D):

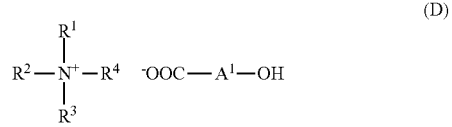

wherein $R^1$, $R^2$, $R^3$ and $R^4$ independently represent a C1-C8 alkyl group, and $A^1$ represents a C3-C36 divalent saturated cyclic hydrocarbon group which can contain one or more heteroatoms and which have one or more substituents or a C6-C20 divalent aromatic hydrocarbon group which can contain one or more heteroatoms and which have one or more substituents, is preferable.

Examples of the C1-C8 alkyl group include a methyl group, an ethyl group, a propyl group, an isopropyl group, a butyl group, an isobutyl group, a sec-butyl group, a tert-butyl group, a pentyl group, an isopentyl group, a tert-pentyl group, a neopentyl group, a 1,2-dimethylpropyl group, a 1-ethylpropyl group, a hexyl group, a heptyl group, an octyl group, a 1-methylbutyl group, a 2-methylbutyl group and a 1-methylpentyl group.

Examples of the C3-C36 divalent saturated cyclic hydrocarbon group include a C3-C8 cycloalkyl group such as a cyclopropyl group, a cyclobutyl group, a cyclopentyl group, a cyclohexyl group, a 2-methylcyclohexyl group, a 3-methylcyclohexyl group, a 4-methylcyclohexyl group, a cycloheptyl group and a cyclooctyl group; a C5-C12 cycloalkylmethyl group such as a cyclobutylmethyl group, a cyclopentylmethyl group, a cyclohexylmethyl group, a cycloheptylmethyl group and a cyclooctylmethyl group; a 1-adamantyl group; and a 2-adamantyl group.

Examples of the C6-C20 divalent aromatic hydrocarbon group include a phenyl group; an alkyl-substituted phenyl group having 7 to 12 carbon atoms such as a 2-methylphenyl group, a 3-methylphenyl group, a 4-methylphenyl group, a 2-ethylphenyl group, a 3-ethylphenyl group, a 4-ethylphenyl group, a 4-tert-butylphenyl group, a 2,3-dimethylphenyl group, a 2,4-dimethylphenyl group, a 2,5-dimethylphenyl group, a 2,6-dimethylphenyl group, a 3,4-dimethylphenyl group and a 3,5-dimethylphenyl group; a 1-naphthyl group; a 2-naphthyl group; an alkyl-substituted naphthyl group having 10 to 12 carbon atoms such as a 2-methyl-1-naphthyl group, 3-methyl-1-naphthyl group, a 4-methyl-1-naphthyl group, a 5-methyl-1-naphthyl group, a 6-methyl-1-naphthyl group, a 7-methyl-1-naphthyl group, a 8-methyl-1-naphthyl group, a 1-methyl-2-naphthyl group, 3-methyl-2-naphthyl group, a 4-methyl-2-naphthyl group, a 5-methyl-2-naphthyl group, a 6-methyl-2-naphthyl group, a 7-methyl-2-naphthyl group and a 8-methyl-2-naphthyl group.

Examples of the C3-C36 divalent saturated cyclic hydrocarbon group containing one or more heteroatoms include a pyrrolidinediyl group, a pyrazolinediyl group, an imidazolidinediyl group, an isooxazolidinediyl group, an isothiazolinediyl group, a piperidinediyl group, a piperazinediyl group, a morpholinediyl group, a thiomorpholinediyl group, a diazolediyl group, a triazolediyl group and a tetrazolediyl group. Examples of the C6-C20 divalent aromatic hydrocarbon group containing one or more heteroatoms include a pyridinediyl group and a dipyridinediyl group.

Examples of the substituent include the above-mentioned halogen atom, a hydroxyl group, an amino group, a mercapto group (—SH), an oxo group (=O), a optionally substituted hydrocarbon group of which total carbon number is 30 or less and a heterocyclic group having one or more heteroatoms such as S, O, N.

Examples of the cation part of Compound (D') include the cations represented by the formulae (IA-1) to (IA-8):

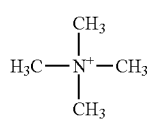
(IA-1)

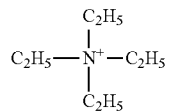
(IA-2)

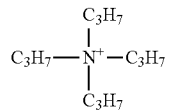
(IA-3)

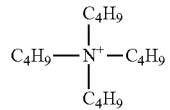
(IA-4)

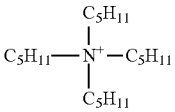
(IA-5)

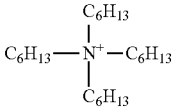
(IA-6)

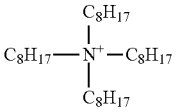
(IA-7)

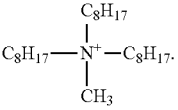
(IA-8)

Examples of the anion part of Compound (D') include the anions represented by the formulae (IB-1) to (IB-11):

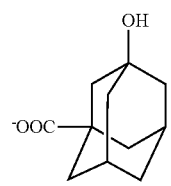
(IB-1)

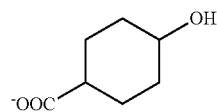
(IB-2)

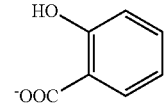
(IB-3)

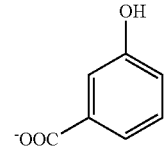
(IB-4)

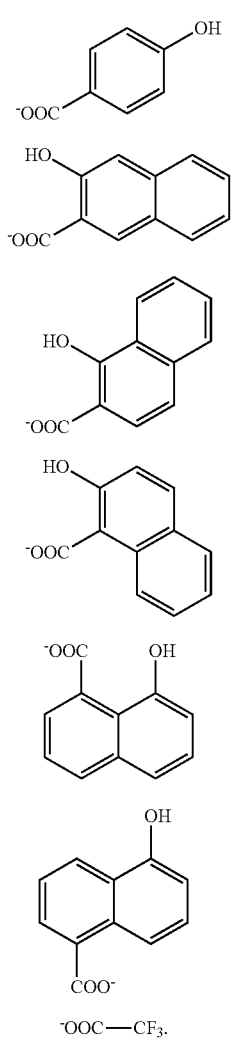

Examples of the compound represented by the formula (D') include compounds Nos. (D-1) to (D-31) as shown in Table 1, and compounds Nos. (D-1) to (D-5) and (D-12) to (D-31) are preferable, and compound Nos. (D-12) to (D-21) are more preferable.

TABLE 1

| Compound No. | Cation | Anion |
| --- | --- | --- |
| (D-1) | (IA-1) | (IB-1) |
| (D-2) | (IA-1) | (IB-2) |
| (D-3) | (IA-1) | (IB-3) |
| (D-4) | (IA-1) | (IB-4) |
| (D-5) | (IA-1) | (IB-5) |
| (D-6) | (IA-2) | (IB-1) |
| (D-7) | (IA-2) | (IB-2) |
| (D-8) | (IA-2) | (IB-3) |
| (D-9) | (IA-3) | (IB-1) |
| (D-10) | (IA-3) | (IB-3) |
| (D-11) | (IA-3) | (IB-5) |
| (D-12) | (IA-4) | (IB-1) |
| (D-13) | (IA-4) | (IB-2) |
| (D-14) | (IA-4) | (IB-3) |
| (D-15) | (IA-4) | (IB-4) |
| (D-16) | (IA-4) | (IB-5) |
| (D-17) | (IA-4) | (IB-6) |
| (D-18) | (IA-4) | (IB-7) |

TABLE 1-continued

| Compound No. | Cation | Anion |
| --- | --- | --- |
| (D-19) | (IA-4) | (IB-8) |
| (D-20) | (IA-4) | (IB-9) |
| (D-21) | (IA-4) | (IB-10) |
| (D-22) | (IA-5) | (IB-1) |
| (D-23) | (IA-5) | (IB-3) |
| (D-24) | (IA-5) | (IB-8) |
| (D-25) | (IA-6) | (IB-1) |
| (D-26) | (IA-6) | (IB-3) |
| (D-27) | (IA-6) | (IB-8) |
| (D-28) | (IA-7) | (IB-1) |
| (D-29) | (IA-7) | (IB-3) |
| (D-30) | (IA-7) | (IB-8) |
| (D-31) | (IA-8) | (IB-11) |

The content of Compound (D') is usually 0.01 to 10% by weight, preferably 0.05 to 8% by weight and more preferably 0.01 to 5% by weight based on solid component.

Compound (D') can be produced, for example, by reacting tetraalkylammonium hydroxide such as tetramethylammonium hydroxide with hydroxyalkanecarboxylic acid such as hydroxyadamantanecarboxylic acid.

Two or more kinds of Compound (D') can be used in combination.

Resin (I) is decomposed to generate an acid by applying a radiation such as a light, an electron beam or the like on Resin (I) itself or on the photoresist composition of the present invention. Resin (I) acts not only as a resin component but also as an acid generator in the present photoresist composition.

While Resin (I) acts as an acid generator in the present photoresist composition as described above, the photoresist composition of the present invention may contain the other acid generator. The acid generator can be selected from various compounds generating an acid by irradiation with radiation to the acid generator itself or a photoresist composition containing the acid generator. Examples of the acid generator include an onium salt, a halogenated alkyltriazine compound, a disulfone compound, a diazomethane compound having a sulfonyl group, a sulfonate compound and an imide compound having a sulfonyloxy group.

Examples of the onium salt include an onium salt in which one or more nitro groups are contained in an anion, an onium salt in which one or more ester groups are contained in an anion. Examples of the onium salt include diphenyliodonium trifluoromethanesulfonate, (4-methoxyphenyl)phenyliodonium hexafluoroantimonate, (4-methoxyphenyl)phenyliodonium trifluoromethanesulfonate, bis(4-tert-butylphenyl)iodonium tetrafluoroborate, bis(4-tert-butylphenyl)iodonium hexafluorophosphate, bis(4-tert-butylphenyl)iodonium hexafluoroantimonate, bis(4-tert-butylphenyl)iodonium trifluoromethanesulfonate, triphenylsulfonium hexafluorophosphate, triphenylsulfonium hexafluoroantimonate, triphenylsulfonium (1-adamantylmethoxy)carbonyldifluoromethanesulfonate, triphenylsulfonium (3-hydroxymethyl-1-adamantyl)methoxycarbonyldifluoromethanesulfonate, triphenylsulfonium 1-(hexahydro-2-oxo-3,5-methano-2H-cyclopenta[b]furan-6-yloxycarbonyl) difluoromethanesulfonate, triphenylsulfonium (4-oxo-1-adamantyloxy)carbonyldifluoromethanesulfonate, triphenylsulfonium (3-hydroxy-1-adamantyl)methoxycarbonyldifluoromethanesulfonate, (4-methylphenyl)diphenylsulfonium nonafluorobutanesulfonate, (4-methoxyphenyl)diphenylsulfonium hexafluoroantimonate, (4-methoxyphenyl)diphenylsulfonium trifluoromethanesulfonate, (4-methylphenyl)diphenylsulfonium trifluoromethanesulfonate, (4-methylphenyl)diphenylsulfonium heptadecafluorooctanesulfonate, (2,4,6-trimethylphenyl)diphenylsulfonium trifluoromethanesulfonate, (4-tert-butylphenyl)diphenylsulfonium trifluoromethanesulfonate, (4-phenylthiophenyl)diphenylsulfonium hexafluorophosphate, (4-phenylthiophenyl)diphenylsulfonium hexafluoroantimonate, 1-(2-naphthoylmethyl)thiolanium hexafluoroantimonate, 1-(2-naphthoylmethyl)thiolanium trifluoromethanesulfonate, (4-hydroxy-1-naphthyl)dimethylsulfonium hexafluoroantimonate and (4-hydroxy-1-naphthyl)dimethylsulfonium trifluoromethanesulfonate.

Examples of the halogenated alkyltriazine compound include 2-methyl-4,6-bis(trichloromethyl)-1,3,5-triazine, 2,4,6-tris(trichloromethyl)-1,3,5-triazine, 2-phenyl-4,6-bis(trichloromethyl)-1,3,5-triazine, 2-(4-chlorophenyl)-4,6-bis(trichloromethyl)-1,3,5-triazine, 2-(4-methoxyphenyl)-4,6-bis(trichloromethyl)-1,3,5-triazine, 2-(4-methoxy-1-naphthyl)-4,6-bis(trichloromethyl)-1,3,5-triazine, 2-(benzo[d][1,3]dioxoran-5-yl)-4,6-bis(trichloromethyl)-1,3,5-triazine, 2-(4-methoxystyryl)-4,6-bis(trichloromethyl)-1,3,5-triazine, 2-(3,4,5-trimethoxystyryl)-4,6-bis(trichloromethyl)-1,3,5-triazine, 2-(3,4-dimethoxystyryl)-4,6-bis(trichloromethyl)-1,3,5-triazine, 2-(2,4-methoxystyryl)-4,6-bis(trichloromethyl)-1,3,5-triazine, 2-(2-methoxystyryl)-4,6-bis(trichloromethyl)-1,3,5-triazine, 2-(4-butoxystyryl)-4,6-bis(trichloromethyl)-1,3,5-triazine and 2-(4-pentyloxystyryl)-4,6-bis(trichloromethyl)-1,3,5-triazine.

Examples of the sulfonate compound include 1-benzoyl-1-phenylmethyl p-toluenesulfonate (generally called "benzoin tosylate"), 2-benzoyl-2-hydroxy-2-phenylethyl p-toluenesulfonate (generally called "α-methylolbenzoin tosylate"), 1,2,3-benzene-tri-yl tris(methanesulfonate), 2,6-dinitrobenzyl p-toluenesulfonate, 2-nitrobenzyl p-toluenesulfonate and 4-nitrobenzyl p-toluenesulfonate.

Examples of the disulfone compound include diphenyl disulfone and di(p-tolyl)disulfone.

Examples of the diazomethane compound having a sulfonyl group include bis(phenylsulfonyl)diazomethane, bis(4-chlorophenylsulfonyl)diazomethane, bis(p-tolylsulfonyl)diazomethane, bis(4-tert-butylphenylsulfonyl)diazomethane, bis(2,4-xylylsulfonyl)diazomethane, bis(cyclohexylsulfonyl)diazomethane and (benzoyl)(phenylsulfonyl)diazomethane.

Examples of the imide compound having a sulfonyloxy group include N-(phenylsulfonyloxy)succinimide, N-(trifluoromethylsulfonyloxy)succinimide, N-(trifluoromethylsulfonyloxy)phthalimide, N-(trifluoromethylsulfonyloxy)-5-norbornene-2,3-dicarboxylmide, N-(trifluoromethylsulfonyloxy)naphthalimide and N-(10-camphorsulfonyloxy)naphthalimide.

Two or more acid generators may be used in combination.

When the acid generator is contained in the photoresist composition of the present invention in addition to Resin (I), the amount of the acid generator is usually 1 to 100% by weight, preferably 5 to 90% by weight and more preferably 3 to 75% by weight relative to the amount of Resin (I).

The photoresist composition of the present invention can contain one or more basic compounds other than Compound (D'), and the content of the basic compound is usually 0.01 to 1% by weight based on solid component.

The basic compound is preferably a basic nitrogen-containing organic compound, and examples thereof include an amine compound such as an aliphatic amine and an aromatic amine and an ammonium salt. Examples of the aliphatic amine include a primary amine, a secondary amine and a tertiary amine. Examples of the aromatic amine include an aromatic amine in which aromatic ring has one or more amino groups such as aniline and a heteroaromatic amine such as pyridine. Preferable examples thereof include an aromatic amine represented by the formula (C2):

(C2)

wherein $Ar^{c1}$ represents an aromatic hydrocarbon group, and $R^{c5}$ and $R^{c6}$ independently represent a hydrogen atom, an aliphatic hydrocarbon group, a saturated cyclic hydrocarbon group or an aromatic hydrocarbon group, and the aliphatic hydrocarbon group, the saturated cyclic hydrocarbon group and the aromatic hydrocarbon group can have one or more substituents selected from the group consisting of a hydroxyl group, an amino group, an amino group having one or two C1-C4 alkyl groups and a C1-C6 alkoxy group.

The aliphatic hydrocarbon group is preferably an alkyl group and the saturated cyclic hydrocarbon group is preferably a cycloalkyl group. The aliphatic hydrocarbon group preferably has 1 to 6 carbon atoms. The saturated cyclic hydrocarbon group preferably has 5 to 10 carbon atoms. The aromatic hydrocarbon group preferably has 6 to 10 carbon atoms.

As the aromatic amine represented by the formula (C2), an amine represented by the formula (C2-1):

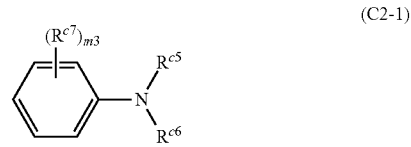

(C2-1)

wherein $R^{c5}$ and $R^{c6}$ are the same as defined above, and $R^{c7}$ is independently in each occurrence an aliphatic hydrocarbon group, an alkoxy group, a saturated cyclic hydrocarbon group or an aromatic hydrocarbon group, and the aliphatic hydrocarbon group, the alkoxy group, the saturated cyclic hydrocarbon group and the aromatic hydrocarbon group can have one or more substituents selected from the group consisting of a hydroxyl group, an amino group, an amino group having one or two C1-C4 alkyl groups and a C1-C6 alkoxy group, and m3 represents an integer of 0 to 3, is preferable. The aliphatic hydrocarbon group is preferably an alkyl group and the saturated cyclic hydrocarbon group is preferably a cycloalkyl group. The aliphatic hydrocarbon group preferably has 1 to 6 carbon atoms. The saturated cyclic hydrocarbon group preferably has 5 to 10 carbon atoms. The aromatic hydrocarbon group preferably has 6 to 10 carbon atoms. The alkoxy group preferably has 1 to 6 carbon atoms.

Examples of the aromatic amine represented by the formula (C2) include 1-naphthylamine, 2-naphthylamine, aniline, diisopropylaniline, 2-methylaniline, 3-methylaniline, 4-methylaniline, 4-nitroaniline, N-methylaniline, N,N-dimethylaniline, and diphenylamine, and among them, preferred is diisopropylaniline and more preferred is 2,6-diisopropylaniline.

Examples of the basic compound also include amines represented by the formulae (C3) to (C11):

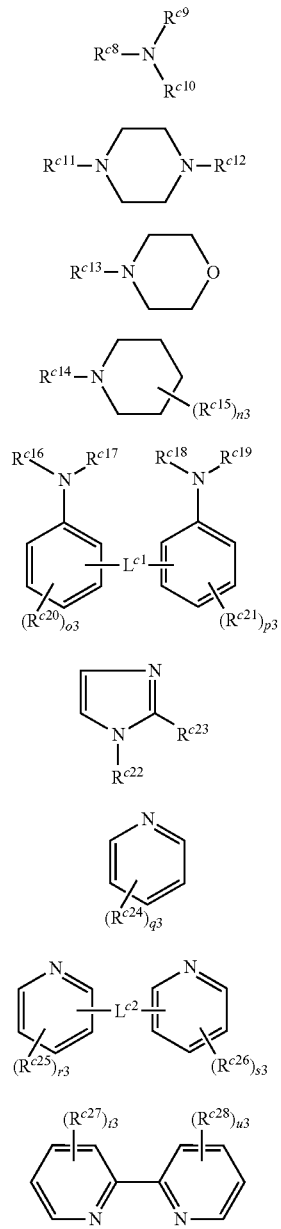

wherein $R^{c8}$, $R^{c20}$, $R^{c21}$, and $R^{c23}$ to $R^{c28}$ independently represent an aliphatic hydrocarbon group, an alkoxy group, a saturated cyclic hydrocarbon group or an aromatic hydrocarbon group, and the aliphatic hydrocarbon group, the alkoxy group, the saturated cyclic hydrocarbon group and the aromatic hydrocarbon group can have one or more substituents selected from the group consisting of a hydroxyl group, an amino group, an amino group having one or two C1-C4 alkyl groups and a C1-C6 alkoxy group,
$R^{c9}$, $R^{c10}$, $R^{a11}$ to $R^{c14}$, $R^{c16}$ to $R^{c19}$, and $R^{c22}$ independently represents a hydrogen atom, an aliphatic hydrocarbon group, a saturated cyclic hydrocarbon group or an aromatic hydrocarbon group, and the aliphatic hydrocarbon group, the saturated cyclic hydrocarbon group and the aromatic hydrocarbon group can have one or more substituents selected from the group consisting of a hydroxyl group, an amino group, an amino group having one or two C1-C4 alkyl groups and a C1-C6 alkoxy group,
$R^{c15}$ is independently in each occurrence an aliphatic hydrocarbon group, a saturated cyclic hydrocarbon group or an alkanoyl group,
$L^{c1}$ and $L^{c2}$ independently represents a divalent aliphatic hydrocarbon group, —CO—, —C(=NH)—, —C(=NR$^{c3}$)—, —S—, —S—S— or a combination thereof and $R^3$ represents a C1-C4 alkyl group,
O3 to u3 independently represents an integer of 0 to 3 and n3 represents an integer of 0 to 8.

The aliphatic hydrocarbon group has preferably 1 to 6 carbon atoms, and the saturated cyclic hydrocarbon group has preferably 3 to 6 carbon atoms, and the alkanoyl group has preferably 2 to 6 carbon atoms, and the divalent aliphatic hydrocarbon group has preferably 1 to 6 carbon atoms. The divalent aliphatic hydrocarbon group is preferably an alkylene group.

Examples of the amine represented by the formula (C3) include hexylamine, heptylamine, octylamine, nonylamine, decylamine, dibutylamine, dipentylamine, dihexylamine, diheptylamine, dioctylamine, dinonylamine, didecylamine, triethylamine, trimethylamine, tripropylamine, tributylamine, tripentylamine, trihexylamine, triheptylamine, trioctylamine, trinonylamine, tridecylamine, methyldibutylamine, methyldipentylamine, methyldihexylamine, methyldicyclohexylamine, methyldiheptylamine, methyldioctylamine, methyldinonylamine, methyldidecylamine, ethyldibutylamine, ethyldipentylamine, ethyldihexylamine, ethydiheptylamine, ethyldioctylamine, ethyldinonylamine, ethyldidecylamine, dicyclohexylmethylamine, tris[2-(2-methoxyethoxy)ethyl]amine, triisopropanolamine, ethylenediamine, tetramethylenediamine, hexamethylenediamine, 4,4'-diamino-1,2-diphenylethane, 4,4'-diamino-3,3'-dimethyldiphenylmethane and 4,4'-diamino-3,3'-diethyldiphenylmethane.

Examples of the amine represented by the formula (C4) include piperazine. Examples of the amine represented by the formula (C5) include morpholine. Examples of the amine represented by the formula (C6) include piperidine and hindered amine compounds having a piperidine skeleton as disclosed in JP 11-52575 A. Examples of the amine represented by the formula (C7) include 2,2'-methylenebisaniline. Examples of the amine represented by the formula (C8) include imidazole and 4-methylimidazole. Examples of the amine represented by the formula (C9) include pyridine and 4-methylpyridine. Examples of the amine represented by the formula (C10) include di-2-pyridyl ketone, 1,2-di(2-pyridyl)ethane, 1,2-di(4-pyridyl)ethane, 1,3-di(4-pyridyl)propane, 1,2-bis(2-pyridyl)ethene, 1,2-bis(4-pyridyl)ethene, 1,2-di(4-pyridyloxy)ethane, 4,4'-dipyridyl sulfide, 4,4'-dipyridyl disulfide, 2,2'-dipyridylamine and 2,2'-dipicolylamine. Examples of the amine represented by the formula (C11) include bipyridine.

The photoresist composition of the present invention usually contains one or more solvents. Examples of the solvent include a glycol ether ester such as ethyl cellosolve acetate, methyl cellosolve acetate and propylene glycol monomethyl ether acetate; a glycol ether such as propylene glycol monomethyl ether; an acyclic ester such as ethyl lactate, butyl acetate, amyl acetate and ethyl pyruvate; a ketone such as acetone, methyl isobutyl ketone, 2-heptanone and cyclohexanone; and a cyclic ester such as γ-butyrolactone.

The amount of the solvent is usually 90% by weight or more, preferably 92% by weight or more preferably 94% by weight or more based on total amount of the photoresist composition of the present invention. The amount of the solvent is usually 99.9% by weight or less based on total amount of the photoresist composition of the present invention. The photoresist composition containing a solvent can be preferably used for producing a thin layer photoresist pattern.

The photoresist composition of the present invention can contain, if necessary, a small amount of various additives such as a sensitizer, a dissolution inhibitor, other polymers, a surfactant, a stabilizer and a dye as long as the effect of the present invention is not prevented.

The photoresist compositions of the present invention are useful for a chemically amplified photoresist composition.

A photoresist pattern can be produced by the following steps (1) to (5):

(1) a step of applying the photoresist composition of the present invention on a substrate, (2) a step of forming a photoresist film by conducting drying, (3) a step of exposing the photoresist film to radiation, (4) a step of baking the exposed photoresist film, and (5) a step of developing the baked photoresist film with an alkaline developer, thereby forming a photoresist pattern.

The applying of the photoresist composition on a substrate is usually conducted using a conventional apparatus such as spin coater. The photoresist composition is preferably filtrated with filter having 0.2 μm of a pore size before applying. Examples of the substrate include a silicon wafer or a quartz wafer on which a sensor, a circuit, a transistor or the like is formed.

The formation of the photoresist film is usually conducted using a heating apparatus such as hot plate or a decompressor, and the heating temperature is usually 50 to 200° C., and the operation pressure is usually 1 to $1.0*10^5$ Pa.

The photoresist film obtained is exposed to radiation using an exposure system. The exposure is usually conducted through a mask having a pattern corresponding to the desired photoresist pattern. Examples of the exposure source include a light source radiating laser light in a UV-region such as a KrF excimer laser (wavelength: 248 nm), an ArF excimer laser (wavelength: 193 nm) and a $F_2$ laser (wavelength: 157 nm), and a light source radiating harmonic laser light in a far UV region or a vacuum UV region by wavelength conversion of laser light from a solid laser light source (such as YAG or semiconductor laser).

The temperature of baking of the exposed photoresist film is usually 50 to 200° C., and preferably 70 to 150° C.

The development of the baked photoresist film is usually carried out using a development apparatus. The alkaline developer used may be any one of various alkaline aqueous solution used in the art. Generally, an aqueous solution of tetramethylammonium hydroxide or (2-hydroxyethyl)trimethylammonium hydroxide (commonly known as "choline") is often used. After development, the photoresist pattern formed is preferably washed with ultrapure water, and the remained water on the photoresist pattern and the substrate is preferably removed.

The photoresist composition of the present invention provides a photoresist pattern in a good resolution, and therefore, the photoresist composition of the present invention is suitable for ArF excimer laser lithography, KrF excimer laser lithography, EUV (extreme ultraviolet) lithography, EUV immersion lithography and EB (electron beam) lithography, and the photoresist composition of the present invention is especially suitable for EUV (extreme ultraviolet) lithography and EB (electron beam) lithography.

EXAMPLES

The present invention will be described more specifically by Examples, which are not construed to limit the scope of the present invention.

The "%" and "part(s)" used to represent the content of any component and the amount of any material used in the following examples and comparative examples are on a weight basis unless otherwise specifically noted. The weight-average molecular weight of any material used in the following examples is a value found by gel permeation chromatography using standard polystyrene as a standard reference material. Structures of compounds were determined by NMR and mass spectrometry.

Synthesis Example 1

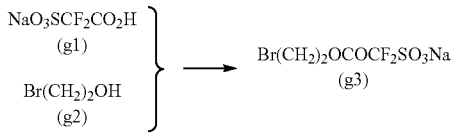

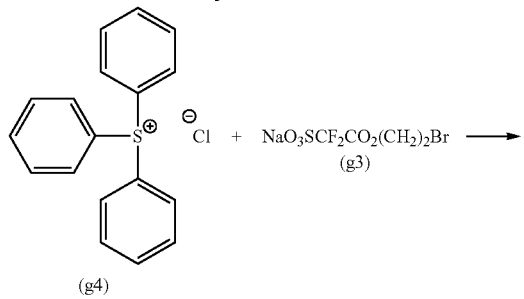

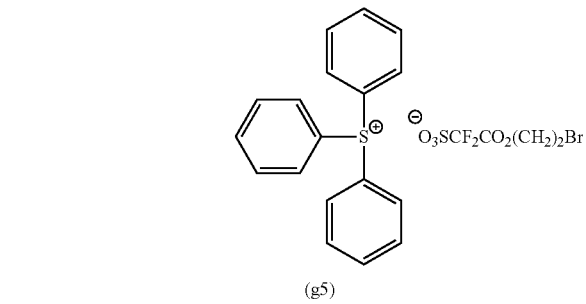

To 206 mL of toluene, added were 27.1 parts of the compound represented by the formula (g1) and 36.8 parts of the compound represented by the formula (g2), and then, 5.24 parts of p-toluenesulfonic acid was added to the resultant mixture. The obtained mixture was heated under reflux for 16 hours. The reaction mixture was cooled. The precipitated solids were collected by filtration. The solids were washed with a little amount of toluene and dried to obtain 31.5 parts of the compound represented by the formula (g3). Yield: 73.8%.

$^1$H-NMR (CDCl$_3$; tetramethylsilane as internal standard): δ (ppm) 4.558 (t, 2H, J=6.1 Hz), 3.69 (t, 2H, J=6.1 Hz)

$^{13}$C-NMR (CDCl$_3$; CDCl$_3$ as internal standard): δ (ppm) 161.957 (t, J=30.3 Hz), 113.186 (t, J=285.5 Hz), 66.171, 29.752

$^{19}$F-NMR (dimethylsulfoxide-d$_6$; fluorobenzene as internal standard): δ (ppm) −105.23

MS (ESI(−) Spectrum): M$^-$=280.9, 282.9 (C$_4$H$_4$BrF$_2$O$_5$S$^-$= 280.894)

To 300 parts of chloroform, added was 31.5 parts of the compound represented by the formula (g3). To the obtained mixture, 258 parts of 12.0% aqueous solution of the salt represented by the formula (g4) was added and then, the resultant mixture was stirred at 25 to 26° C. for 8 hours. The reaction mixture was separated to an organic layer and an aqueous layer. The organic layer was washed with ion-exchanged water and concentrated. The solids were collected by filtration and washed with a little amount of a mixed solvent of hexane and ethyl acetate (hexane/ethyl acetate=4/1) to obtain 41.0 parts of the compound represented by the formula (g5). Yield: 72.8%.

$^1$H-NMR (CDCl$_3$; tetramethylsilane as internal standard): δ (ppm) 7.78-7.69 (15H), 4.51 (t, 2H, J=6.1 Hz), 3.51 (t, 2H, J=6.1 Hz)

$^{13}$C-NMR (CDCl$_3$; CDCl$_3$ as internal standard): δ (ppm) 161.961 (t, J=30.3 Hz), 134.348, 131.325, 130.803, 123.983, 113.116 (t, J=286.8 Hz), 65.181, 27.026

$^{19}$F-NMR (dimethylsulfoxide-d$_6$; fluorobenzene as internal standard): δ (ppm) −106.06

MS (ESI(−) Spectrum): M$^-$=280.9, 282.9 (C$_4$H$_4$BrF$_2$O$_5$S$^-$= 280.894)

MS (ESI(+) Spectrum): M$^+$=263.0 (C$_{18}$H$_{15}$S$^+$=263.09)

Synthesis Example 2 resultant mixture. The obtained mixture was heated under reflux for 13 hours. The reaction mixture was cooled. The precipitated solids were collected by filtration. The solids were washed with a little amount of toluene and dried to obtain 34.1 parts of the compound represented by the formula (g8). Yield: 81.2%.

$^1$H-NMR (CDCl$_3$; tetramethylsilane as internal standard): δ (ppm) 4.33 (t, 2H, J=6.9 Hz), 3.40 (t, 2H, J=6.9 Hz), 1.85 (m, 2H), 1.78-1.10 (m, 18H)

MS (ESI(−) Spectrum): M$^-$=421 (C$_{14}$H$_{24}$BrF$_2$O$_5$S$^-$= 421.05)

To 200 parts of chloroform, added was 34.1 parts of the compound represented by the formula (g8). To the obtained mixture, 192 parts of 13.1% aqueous solution of the salt represented by the formula (g9) was added and then, the resultant mixture was stirred at room temperature through the night. The reaction mixture was separated to an organic layer and an aqueous layer. The organic layer was washed with ion-exchanged water and concentrated to obtain 48.7 parts of the compound represented by the formula (g10). Yield: 92.7%.

$^1$H-NMR (dimethylsulfoxide-d$_6$; tetramethylsilane as internal standard): δ (ppm) 7.87-7.76 (m, 15H), 4.17 (t, 2H, J=6.9 Hz), 3.50 (t, 2H, J=6.9 Hz), 1.75 (m, 2H), 1.57 (m, 2H), 1.37-1.23 (m, 16H)

$^{19}$F-NMR (dimethylsulfoxide-d$_6$; fluorobenzene as internal standard): δ (ppm) −105.19

MS (ESI(−) Spectrum): M$^-$=421 (C$_{14}$H$_{24}$BrF$_2$O$_5$S$^-$= 421.05)

MS (ESI(+) Spectrum): M$^+$=263 (C$_{18}$H$_{15}$S$^+$=263.09)

Synthesis Example 3

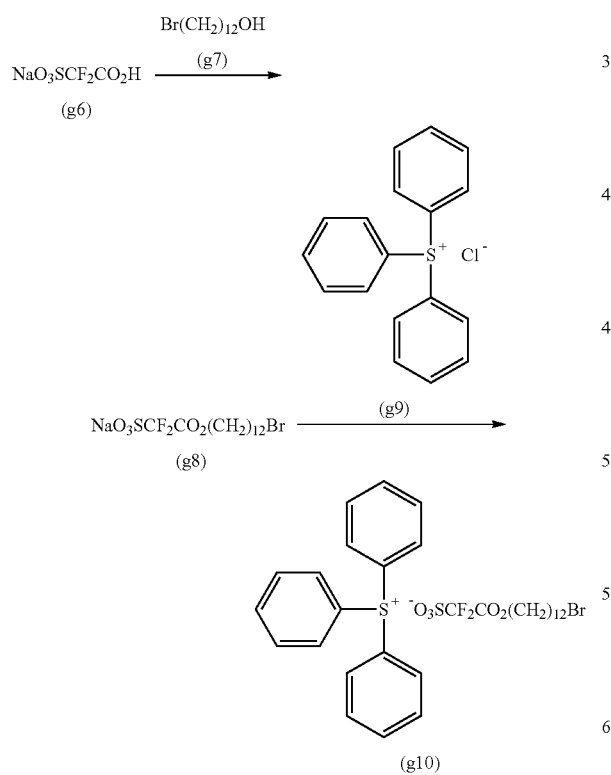

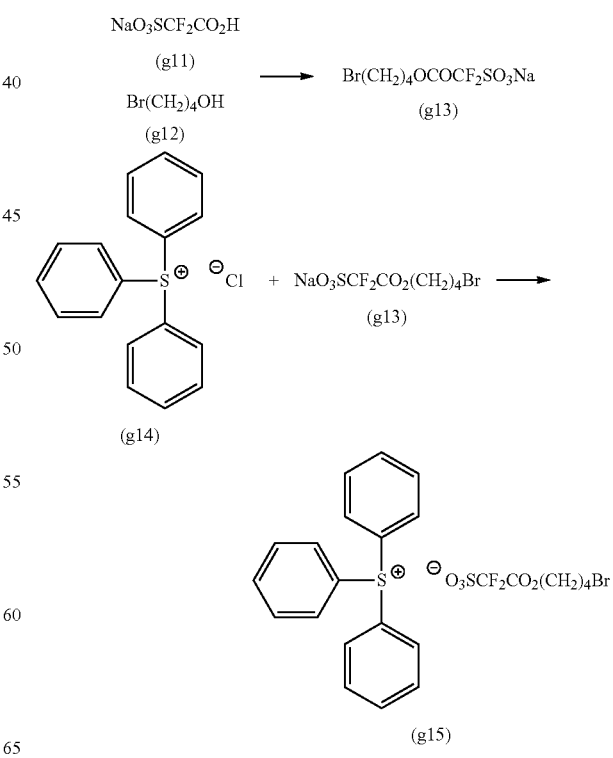

To 300 parts of toluene, added were 21 parts of the compound represented by the formula (g6) and 25 parts of the compound represented by the formula (g7), and then, a catalytic amount of p-toluenesulfonic acid was added to the To 190 mL of toluene, added were 26.0 parts of the compound represented by the formula (g11) and 50.0 parts of the compound represented by the formula (g12), and then, 4.55 parts of p-toluenesulfonic acid was added to the resultant mixture. The obtained mixture was heated under reflux for 16 hours. The reaction mixture was cooled. The precipitated solids were collected by filtration. The solids were washed with a little amount of toluene and dried to obtain 32.6 parts of the compound represented by the formula (g13). Yield: 74.8%.

$^1$H-NMR (CDCl$_3$; tetramethylsilane as internal standard): δ (ppm) 4.26 (t, 2H, J=6.1 Hz), 3.56 (t, 2H, J=6.1 Hz), 1.91 (m, 2H), 1.75 (m, 2H)

$^{13}$C-NMR (CDCl$_3$; CDCl$_3$ as internal standard): δ (ppm) 162.145 (t, J=30.3 Hz), 113.165 (t, J=272.9 Hz), 66.8051, 34.689, 28.685, 26.719

$^{19}$F-NMR (dimethylsulfoxide-d$_6$; fluorobenzene as internal standard): δ (ppm) −105.42

MS (ESI(−) Spectrum): M$^-$=308.9, 310.9 (C$_6$H$_8$BrF$_2$O$_5$S$^-$= 308.925)

To 300 parts of chloroform, added was 32.6 parts of the compound represented by the formula (g13). To the obtained mixture, 244 parts of 12.0% aqueous solution of the salt represented by the formula (g14) was added and then, the resultant mixture was stirred at 25-26° C. for 8 hours. The reaction mixture was separated to an organic layer and an aqueous layer. The organic layer was washed with ion-exchanged water and concentrated. The solids were collected by filtration and washed with a little amount of a mixed solvent of hexane and ethyl acetate (hexane/ethyl acetate=4/1) to obtain 52.0 parts of the compound represented by the formula (g15). Yield: 92.6%.

$^1$H-NMR (CDCl$_3$; tetramethylsilane as internal standard): δ (ppm) 7.79-7.70 (15H), 4.29 (t, 2H, J=6.2 Hz), 3.40 (t, 2H, J=6.2 Hz), 1.98 (m, 2H), 1.85 (m, 2H)

$^{13}$C-NMR (CDCl$_3$; CDCl$_3$ as internal standard): δ (ppm) 162.306 (t, J=28.9 Hz), 134.303, 131.284, 130.813, 124.004, 113.116 (t, J=286.8 Hz), 65.307, 33.238, 28.333, 26.482

$^{19}$F-NMR (dimethylsulfoxide-d$_6$; fluorobenzene as internal standard): δ (ppm) −106.11

MS (ESI(−) Spectrum): M$^-$=308.9, 310.9 (C$_6$H$_8$BrF$_2$O$_5$S$^-$= 308.925)

MS (ESI(+) Spectrum): M$^+$=263 (C$_{18}$H$_{15}$S$^+$=263.09)

Resin Synthesis Example 1

According to the method described in JP 2003-107708 A, a resin having the structural units represented by the formulae (b1), (b2), (b3) and (b4) was produced. This resin is called as resin B1. The weight-average molecular weight (Mw) of resin B1 was 9,576 (equivalent to polystyrene), and Mw/Mn was 1.807, in which Mn was the number-average molecular weight of resin B1.

(B1)

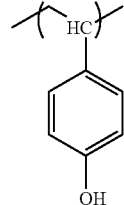

The ratio of the structural units represented by the formulae (b1), (b2), (b3) and (b4) ((b1)/(b2)/(b3)/(b4)) was 40/30/10/20.

Resin Synthesis Example 2

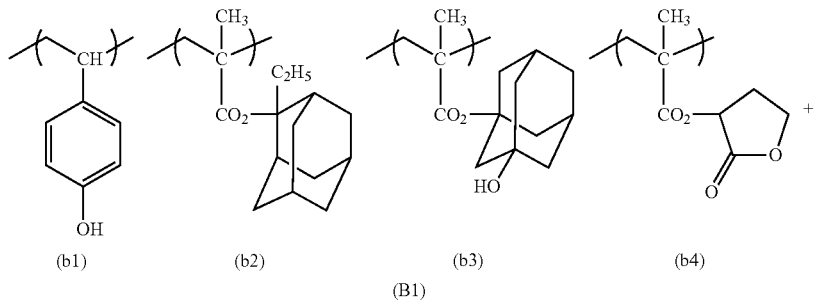

(b1)  (b2)  (b3)  (b4)

(B1)

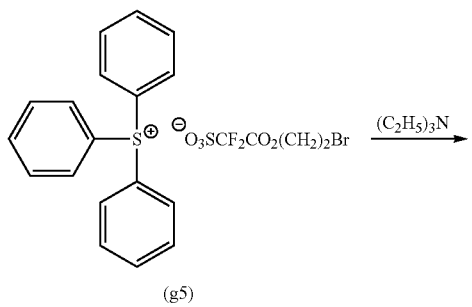

(g5)

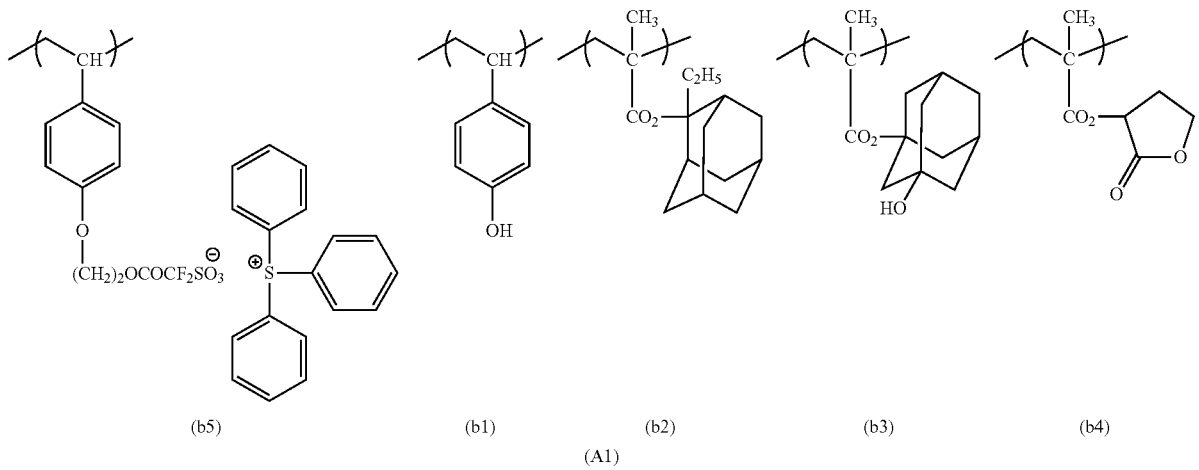

(b5)  (b1)  (b2)  (b3)  (b4)

(A1)

Twenty (20) parts of anhydrous tetrahydrofuran, 3.0 parts of resin B1, 0.8 part of the compound represented by the formula (g5) and 0.3 part of triethylamine were mixed and the resultant mixture was heated for 3 hours under reflux. The reaction mixture was cooled and neutralized with 1% aqueous oxalic acid solution followed by extracting with chloroform. The obtained organic layer was washed with ion-exchanged water and then concentrated. The obtained oily matters were diluted with 100 parts of hexane and the precipitates were collected by filtration. The precipitates were washed with hexane and dried to obtain 3.0 parts of a resin. This resin had the above-mentioned structural units represented by the formulae (b5), (b1), (b2), (b3) and (b4). This is called as resin A1.

Molar ratio of the structural units in resin A1 was measured with NMR and the result thereof was as followed: Structural unit represented by the formula (b5): Structural unit represented by the formula (b1): Structural unit represented by the formula (b2): Structural unit represented by the formula (b3): Structural unit represented by the formula (b4)=8:32:30:10:20.

Resin Synthesis Example 3

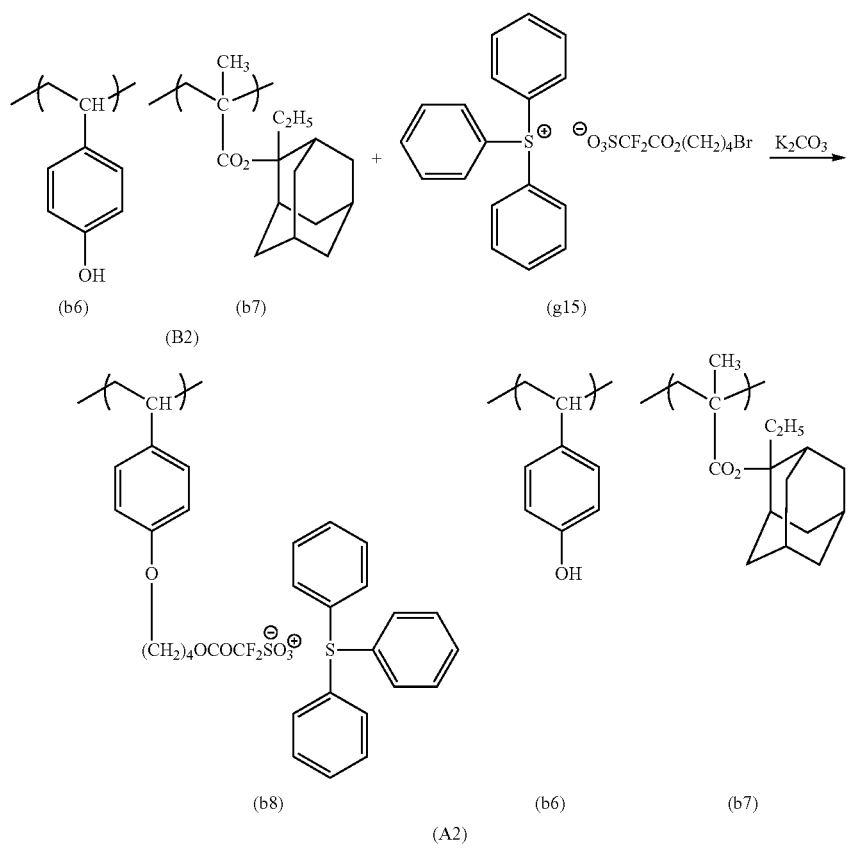

Ten (10) parts of anhydrous N,N-dimethylformamide, 23.2 parts of a solution prepared by mixing resin B2, which was a copolymer of p-hydroxystyrene and 2-ethyl-2-adamantyl methacrylate and in which molar ratio of the structural units represented by the formulae (b6) and (b7) ((b6)/(b7)) was 50/50, and of which Mw was 8,837 and Mw/Mn was 1.49, with 2-methoxy-1-methylethyl acetate (content of resin B2: 31.28%), 2.4 parts of the compound represented by the formula (g15), 0.9 part of potassium carbonate and 0.01 part of triethylamine were mixed. The resultant mixture was stirred at 24 to 25° C. for 7.5 hours. The reaction mixture was neutralized with 1% aqueous oxalic acid solution followed by extracting with chloroform. The obtained organic layer was washed with ion-exchanged water and then concentrated. The obtained oily matters were diluted with 100 parts of hexane and the precipitates were collected by filtration. The precipitates were washed with a little amount of hexane and dried to obtain 9.3 parts of a resin. This resin had the above-mentioned structural units represented by the formulae (b8), (b6) and (b7). This is called as resin A2.

Molar ratio of the structural units in resin A2 was measured with NMR and the result thereof was as followed: Structural unit represented by the formula (b8): Structural unit represented by the formula (b6): Structural unit represented by the formula (b7)=5:45:50.

Resin Synthesis Example 4

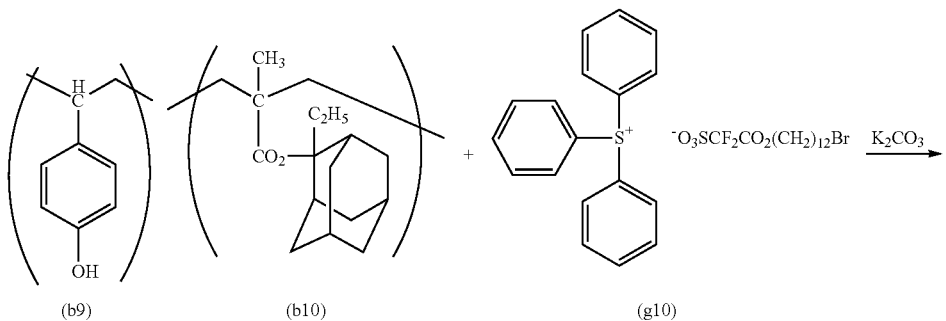

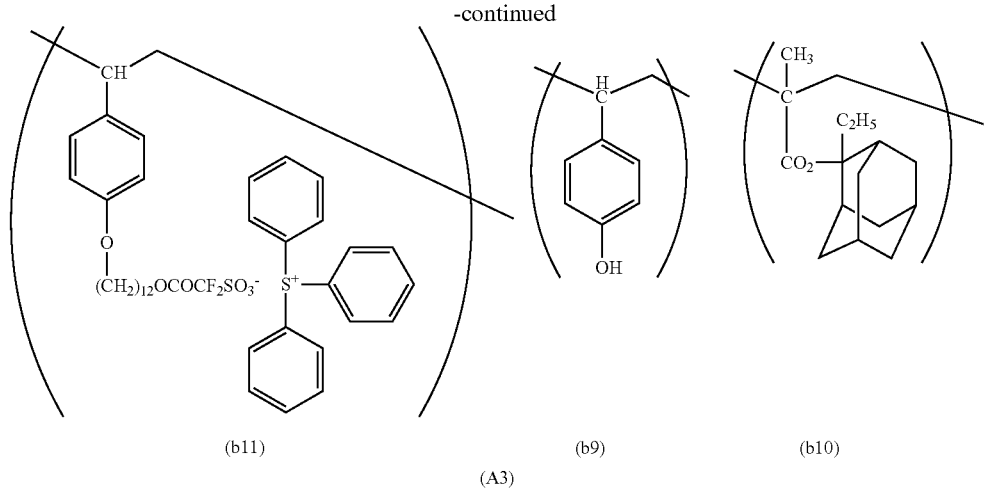

Fifty (50) parts of acetone, 9.0 parts of a resin B3, which was a copolymer of p-hydroxystyrene and 2-ethyl-2-adamantyl methacrylate and in which molar ratio of the structural units represented by the formulae (b9) and (b10) ((b9)/(b10)) was 50/50, and of which Mw was 8,837 and Mw/Mn was 1.49, 2.0 parts of the compound represented by the formula (g10), 0.7 part of potassium carbonate and 0.01 part of triethylamine were mixed. The resultant mixture was refluxed for 2 hours. The reaction mixture was cooled and then, was neutralized with 1% aqueous oxalic acid solution followed by extracting with chloroform. The obtained organic layer was washed with ion-exchanged water and then concentrated to obtain 7.5 parts of a resin. This resin had the above-mentioned structural units represented by the formulae (b11), (b9) and (b10). This is called as resin A3.

Molar ratio of the structural units in resin A3 was measured with NMR and the result thereof was as followed: Structural unit represented by the formula (b11): Structural unit represented by the formula (b9): Structural unit represented by the formula (b10)=5:45:50.

Resin Synthesis Example 5

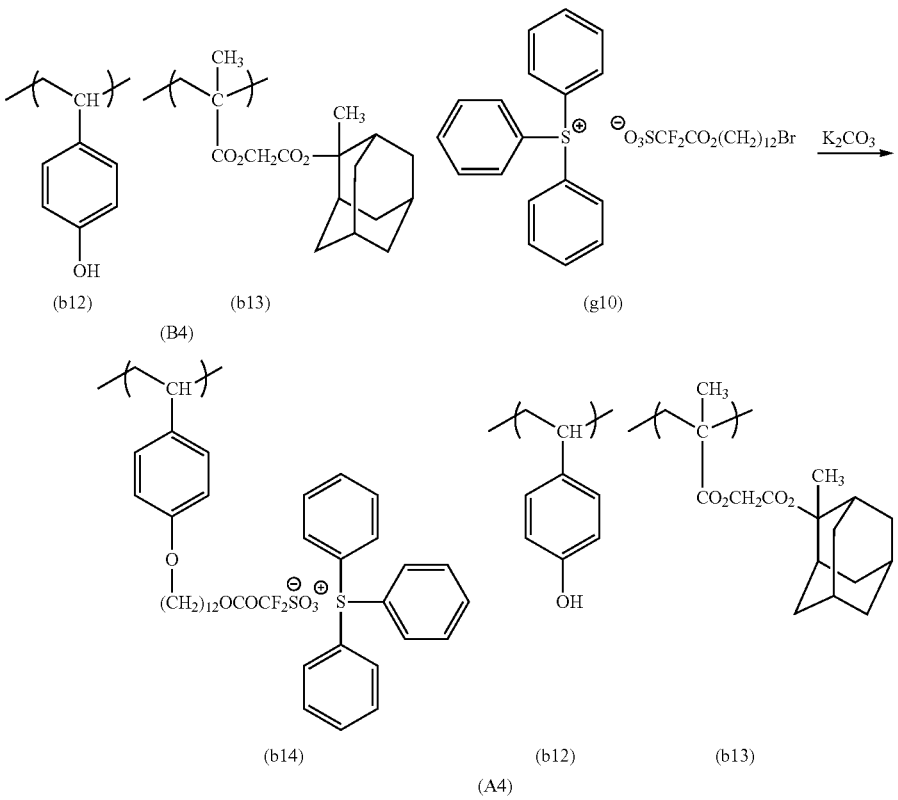

Hundred (100) parts of acetone, 14.8 parts of a resin B4, which was a copolymer of p-hydroxystyrene and [(2 methyladamantan-2-yl)oxy]-2-oxoethyl methacrylate, 3.0 parts of the compound represented by the formula (g10), 1.0 part of potassium carbonate and 0.01 part of triethylamine were mixed. The resultant mixture was refluxed for 2 hours. The reaction mixture was cooled and then, was neutralized with 1% aqueous oxalic acid solution followed by extracting with chloroform. The obtained organic layer was washed with ion-exchanged water and then concentrated to obtain 14.2 parts of a resin. This resin had the above-mentioned structural units represented by the formulae (b14), (b12) and (b13). This is called as resin A4.

Molar ratio of the structural units in resin A3 was measured with NMR and the result thereof was as followed: Structural unit represented by the formula (b14): Structural unit represented by the formula (b12): Structural unit represented by the formula (b13)=5:45:50.

Synthesis Example 1

A mixture of 7.56 parts of 3-hydroxyadamantanecarboxylic acid and 302.52 parts of ethyl acetate was mixed with 25.0 parts of 40% aqueous tetrabutylammonium hydroxide solution, and the resultant mixture was stirred for 1 hour at room temperature. To the obtained mixture, 50 parts of methanol was added, and the resultant mixture was stirred for 16 hours at room temperature. The obtained solution was concentrated to obtain 16.87 parts of a compound represented by the following formula in the form of oil. This is called as compound D2.

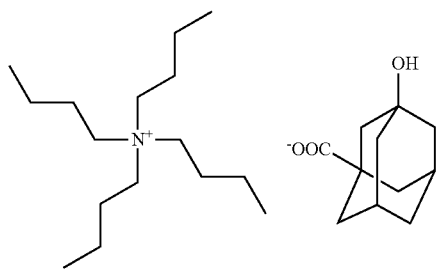

$^1$H-NMR (500.16 MHz, d$_6$-dimethylsulfoxide) δ ppm: 0.94 (t, J=7.65 Hz, 12H), 1.28-1.35 (m, 8H), 1.43 (br, 2H), 1.48 (br, 4H), 1.53-1.61 (m, 14H), 2.02 (br, 2H), 3.17-3.21 (m, 8H)
$^{13}$C-NMR (125.77 MHz, d$_6$-dimethylsulfoxide) δ ppm: 13.45, 19.18, 23.08, 30.46, 35.75, 39.20, 43.99, 45.00, 48.31, 57.52, 67.09, 178.82
MS (ESI(+) Spectrum): M$^+$ 195.1
MS (ESI(−) Spectrum): M$^-$ 242.3

Synthesis Example 2

A mixture of 5.85 parts of 2-hydroxynaphthoic acid and 233.99 parts of methanol was mixed with 21.80 parts of 37% tetrabutylammonium hydroxide methanol solution, and the resultant mixture was stirred for 16 hours at room temperature. The obtained mixture was concentrated and the obtained residue was mixed with 600 parts of ethyl acetate. The resultant solution was washed three times with 110 parts of ion-exchanged water. The obtained solution was concentrated to obtain 12.36 parts of a compound represented by the following formula. This is called as compound D3.

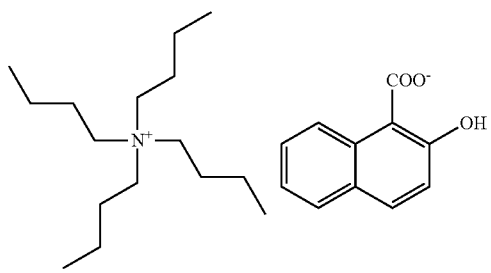

$^1$H-NMR (500.16 MHz, d$_6$-dimethylsulfoxide) δ ppm: 0.90 (t, J=7.95 Hz, 12H), 1.24-1.32 (m, 8H), 1.50-1.56 (m, 8H), 3.11-3.15 (m, 8H), 6.89 (d, J=8.95 Hz, 1H), 7.07-7.10 (m, 1H), 7.29-7.32 (m, 1H), 7.59-7.63 (m, 2H), 9.62 (d, J=8.95 Hz, 1H)
$^{13}$C-NMR (125.77 MHz, d$_6$-dimethylsulfoxide) δ ppm: 13.46, 19.17, 23.02, 57.49, 108.72, 120.39, 121.31, 125.52, 125.91, 126.56, 127.74, 131.86, 134.66, 166.71, 172.45
MS (ESI(+) Spectrum): M$^+$ 242.3
MS (ESI(−) Spectrum): M$^-$ 187.0

Synthesis Example 3

A mixture of 20.00 parts of tetraoctylammonium bromide and 275.32 parts of methanol was mixed with 6.88 parts of 2-hydroxynaphthoic acid, and the resultant mixture was stirred for 16 hours at room temperature. The obtained mixture was concentrated and the obtained residue was mixed with 300 parts of ethyl acetate. The resultant solution was washed with 100 parts of 5% aqueous sodium hydrogen carbonate solution and then washed twice with 100 parts of ion-exchanged water. The obtained solution was concentrated to obtain 23.62 parts of a compound represented by the following formula. This is called as compound D4.

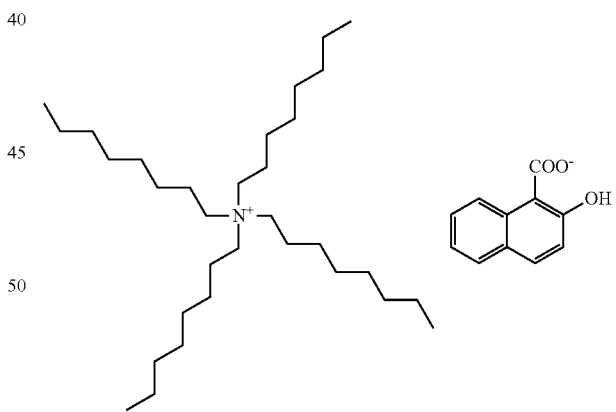

$^1$H-NMR (500.16 MHz, d$_6$-dimethylsulfoxide) δ ppm: 1.10 (t, J=6.95 Hz, 12H), 1.24-1.28 (m, 40H), 1.52 (br, 8H), 3.12 (br, 8H), 6.89 (d, J=8.95 Hz, 1H), 7.06-7.09 (m, 1H), 7.27-7.30 (m, 1H), 7.57-7.62 (m, 2H), 9.64 (d, J=8.90 Hz, 1H)
$^{13}$C-NMR (125.77 MHz, d$_6$-dimethylsulfoxide) δ ppm: 13.83, 20.90, 22.01, 25.64, 28.27, 28.37, 31.11, 57.55, 108.75, 120.24, 121.24, 125.54, 125.73, 126.54, 127.61, 131.70, 134.69, 166.66, 172.46
MS (ESI(+) Spectrum): M$^+$ 466.5
MS (ESI(−) Spectrum): M$^-$ 187.0

Examples 1 to 8

Resin

Resin A1, A2, A3, A4
<Compound (D')>
Compound D1:

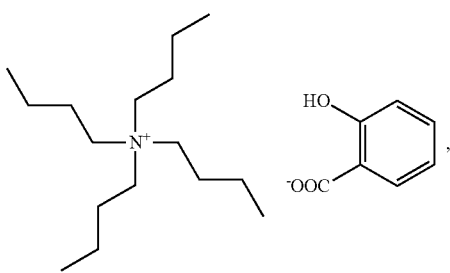

which was available from Tokyo Chemical Industry Co., Ltd.
Compound D2, D3, D4
Compound D5:

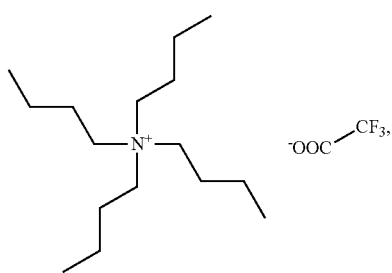

which was available from Merck.
<Solvent>

| E1: | propylene glycol monomethyl ether | 150 parts |
| --- | --- | --- |
|  | propylene glycol monomethyl ether acetate | 400 parts |
|  | γ-butyrolactone | 5 parts |

The following components were mixed and dissolved, further, filtrated through a fluorine resin filter having pore diameter of 0.2 μm, to prepare photoresist compositions.
Resin (kind and amount are described in Table 2)
Compound (D') (kind and amount are described in Table 2)
Solvent (kind and amount are described in Table 2)

TABLE 2

| Ex. No. | Resin (kind/amount (part)) | Compound (D') (kind/amount (part)) | Solvent (kind) | PB (° C.) | PEB (° C.) |
| --- | --- | --- | --- | --- | --- |
| Ex. 1 | A1/10 | D1/0.15 | E1 | 110 | 110 |
| Ex. 2 | A2/10 | D1/0.12 | E1 | 110 | 100 |
| Ex. 3 | A3/10 | D1/0.12 | E1 | 110 | 100 |
| Ex. 4 | A4/10 | D1/0.12 | E1 | 110 | 100 |
| Ex. 5 | A1/10 | D2/0.17 | E1 | 110 | 110 |
| Ex. 6 | A1/10 | D3/0.17 | E1 | 110 | 110 |
| Ex. 7 | A1/10 | D4/0.26 | E1 | 110 | 110 |
| Ex. 8 | A1/10 | D5/0.19 | E1 | 110 | 110 |

Silicon wafers were each contacted with hexamethyldisilazane at 110° C. for 60 seconds on a direct hot plate and each of the photoresist compositions prepared as above was spin-coated over the silicon wafer to give a film thickness after drying of 0.04 μm. After application of each of the photoresist compositions, the silicon wafers thus coated with the respective photoresist compositions were each prebaked on a direct hotplate at a temperature shown in column "PB" in Table 2 for 60 seconds. Using a writing electron beam lithography system ("HL-800D" manufactured by Hitachi, Ltd., 50 KeV), each wafer on which the respective resist film had been thus formed was exposed to a line and space pattern, while changing stepwise the exposure quantity.

After the exposure, each wafer was subjected to post-exposure baking on a hotplate at a temperature shown in column "PEB" in Table 2 for 60 seconds and then to paddle development with an aqueous solution of 2.38% by weight tetramethylammonium hydroxide for 60 seconds.

Each of photoresist patterns developed on the silicon substrate after the development was observed with a scanning electron microscope, and the results of which are shown in Table 3.

Resolution: The amount of exposure that each photoresist pattern became 1:1 line and space pattern was set as effective sensitivity. The minimum line width of the line and space patterns exposed at effective sensitivity and developed was measured.

TABLE 3

| Ex. No. | Resolution |
| --- | --- |
| Ex. 1 | 50 nm |
| Ex. 2 | 80 nm |
| Ex. 3 | 50 nm |
| Ex. 4 | 50 nm |
| Ex. 5 | 50 nm |
| Ex. 6 | 50 nm |
| Ex. 7 | 50 nm |
| Ex. 8 | 50 nm |

The following components were mixed and dissolved, further, filtrated through a fluorine resin filter having pore diameter of 0.2 μm, to prepare a photoresist composition.
Resin: A1 10 parts
Compound (D'): D1 0.15 part
Solvent: E1

Silicon wafers were each contacted with hexamethyldisilazane at 90° C. for 60 seconds on a direct hot plate and the photoresist compositions prepared as above was spin-coated over the silicon wafer to give a film thickness after drying of 0.04 μm. After application of the photoresist composition, the silicon wafers thus coated with the photoresist composition was prebaked on a direct hotplate at 110° C. for 60 seconds. Using an EUV (extreme ultraviolet) exposure system, each wafer on which the respective resist film had been thus formed was exposed to a line and space pattern, while changing stepwise the exposure quantity.

After the exposure, each wafer was subjected to post-exposure baking on a hotplate at 110° C. for 60 seconds and then to paddle development with an aqueous solution of 2.38% by weight tetramethylammonium hydroxide for 60 seconds.

The amount of exposure that the photoresist pattern became 1:1 line and space pattern was set as effective sensitivity. The minimum line width of the line and space patterns exposed at effective sensitivity and developed was measured to find out that it was 26 nm.

The photoresist composition of the present invention provides a good resist pattern having good resolution, and is especially suitable for KrF excimer laser lithography, EUV lithography and EB lithography.

What is claimed is:

1. A photoresist composition comprising a resin which comprises a structural unit represented by the formula (I):

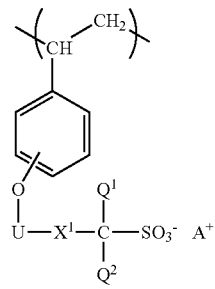

wherein $Q^1$ and $Q^2$ independently represent a fluorine atom or a C1-C6 perfluoroalkyl group, U represents a C1-C20 divalent hydrocarbon group in which one or more —$CH_2$— may be replaced by —O—, —NH—, —S—, —$NR^c$—, —CO— or —CO—O—, $R^c$ represents a C1-C6 alkyl group, $X^1$ represents —O—CO—, —CO—O—, —CO—O—$CH_2$—, —$CH_2$—O—CO—, —O—$CH_2$—, —$CH_2$—O—, —$NR^d$—CO— or —CO—$NR^d$—, $R^d$ represents a hydrogen atom or a C1-C6 alkyl group, and $A^+$ represents an organic counter ion, and a compound represented by the formula (D):

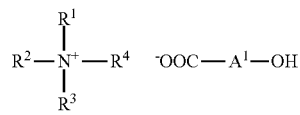

wherein $R^1$, $R^2$, $R^3$ and $R^4$ independently represent a C1-C8 alkyl group, and $A^1$ represents a C3-C36 divalent saturated cyclic hydrocarbon group which can contain one or more heteroatoms and which have one or more substituents or a C6-C20 divalent aromatic hydrocarbon group which can contain one or more heteroatoms and which have one or more substituents.

2. The photoresist composition according to claim 1, wherein $R^1$, $R^2$, $R^3$ and $R^4$ independently represent a C1-C6 alkyl group.

3. The photoresist composition according to claim 1, wherein $Q^1$ and $Q^2$ are fluorine atoms.

4. The photoresist composition according to claim 1, wherein $A^+$ is a cation represented by the formula (IIIa):

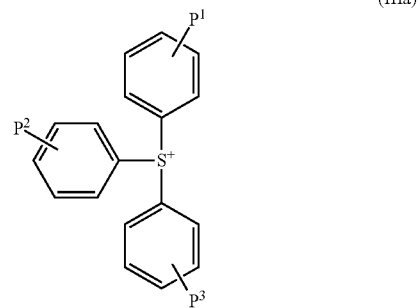

wherein $P^1$, $P^2$ and $P^3$ independently represent a hydrogen atom, a halogen atom, a hydroxyl group, a cyano group a C1-C12 hydrocarbon group or a C1-C12 alkoxy group.

5. The photoresist composition according to claim 1, wherein the resin further comprises a structural unit represented by the formula (II):

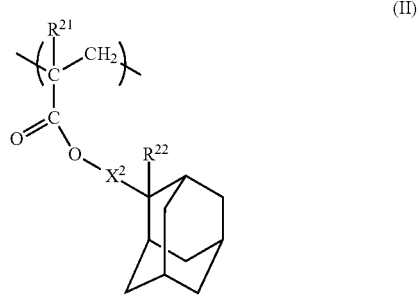

wherein $R^{21}$ represents a hydrogen atom or a methyl group, $R^{22}$ represents a C1-C6 hydrocarbon group, $X^2$ represents a single bond or *—$(CH_2)_k$—CO—O— in which * represents a binding position to —O—, and k represents an integer of 1 to 6.

6. The photoresist composition according to claim 1, wherein the resin further comprises a structural unit represented by the formula (VI):

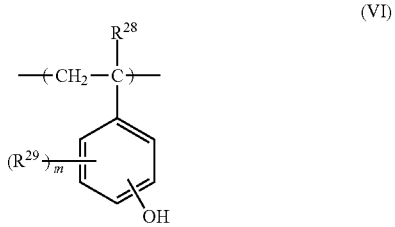

wherein $R^{28}$ represents a hydrogen atom, a halogen atom, a C1-C6 alkyl group or a C1-C6 halogenated alkyl group, $R^{29}$ is independently in each occurrence a halogen atom, a hydroxyl group, a cyano group, a C1-C12 alkyl group, a C1-C12 hydroxy-containing alkyl group, a C1-C12 alkoxy group, a C6-C12 aryl group, a C7-C13 aralkyl group, a glycidyloxy group, a C2-C4 acyl group, a C2-C4 acyloxy group, an acryloyl group or a methacryloyl group, m represents an integer of 0 to 4.

7. The photoresist composition according to claim 1, wherein the resin further comprises a structural unit represented by the formula (VII):

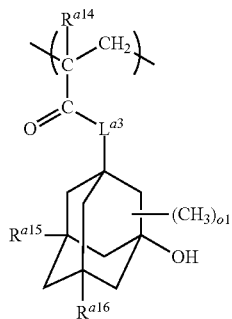

(VII)

wherein $R^{a14}$ represents a hydrogen atom or a methyl group, $R^{a15}$ and $R^{a16}$ independently represent a hydrogen atom, a methyl group or a hydroxyl group, $L^{a3}$ represents *—O— or *—O—$(CH_2)_y$—CO—O— in which * represents a binding position to —CO—, and y represents an integer of 1 to 6, and o1 represents an integer of 0 to 10.

8. The photoresist composition according to claim 1, wherein the resin further comprises a structural unit represented by the formula (VIII):

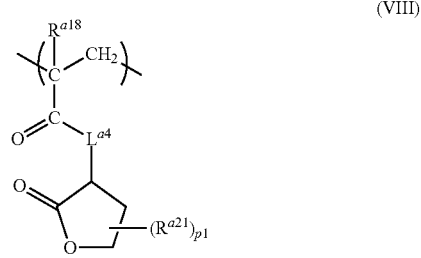

(VIII)

wherein $R^{a18}$ represents a hydrogen atom or a methyl group, $R^{a21}$ is independently in each occurrence a C1-C4 aliphatic hydrocarbon group, $L^{a4}$ represents *—O— or *—O—$(CH_2)_z$—CO—O— in which * represents a binding position to —CO—, and z represents an integer of 1 to 6, and p1 represents an integer of 0 to 5.

9. The photoresist composition according to claim 1, which further comprises a solvent.

10. A process for producing a photoresist pattern comprising the following steps (1) to (5):
   (1) a step of applying the photoresist composition according to claim 1 on a substrate,
   (2) a step of forming a photoresist film by conducting drying,
   (3) a step of exposing the photoresist film to radiation,
   (4) a step of baking the exposed photoresist film, and
   (5) a step of developing the baked photoresist film with an alkaline developer, thereby forming a photoresist pattern.

* * * * *